US006952123B2

(12) United States Patent
Kizer et al.

(10) Patent No.: US 6,952,123 B2
(45) Date of Patent: *Oct. 4, 2005

(54) SYSTEM WITH DUAL RAIL REGULATED LOCKED LOOP

(75) Inventors: Jade M. Kizer, Mountain View, CA (US); Benedict C. Lau, San Jose, CA (US); Craig E. Hampel, San Jose, CA (US)

(73) Assignee: Rambus Inc., Los Altos, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/374,252

(22) Filed: Feb. 25, 2003

(65) Prior Publication Data

US 2003/0179028 A1 Sep. 25, 2003

Related U.S. Application Data

(63) Continuation-in-part of application No. 10/104,230, filed on Mar. 22, 2002.
(60) Provisional application No. 60/408,063, filed on Sep. 3, 2002, provisional application No. 60/408,108, filed on Sep. 3, 2002, and provisional application No. 60/436,756, filed on Dec. 27, 2002.

(51) Int. Cl.[7] ............................................. H03L 7/06
(52) U.S. Cl. ........................................ 327/147; 327/158
(58) Field of Search .................................. 327/149, 147, 327/158, 156, 161, 162, 141, 152, 155, 202, 291, 292, 293, 294; 331/17, 25; 373/373, 375, 376; 375/374, 375, 376

(56) References Cited

U.S. PATENT DOCUMENTS

| | | | |
|---|---|---|---|
| 5,206,881 A | * 4/1993 | Messenger et al. | 375/145 |
| 5,554,945 A | 9/1996 | Lee et al. | 327/105 |
| 5,614,855 A | 3/1997 | Lee et al. | 327/158 |
| 5,635,995 A | * 6/1997 | Strolle et al. | 348/727 |
| 5,684,421 A | 11/1997 | Chapman et al. | 327/261 |
| 5,731,727 A | 3/1998 | Iwamoto et al. | 327/281 |
| 5,742,798 A | 4/1998 | Goldrian | |
| 5,852,378 A | 12/1998 | Keeth | 327/171 |
| 5,880,612 A | 3/1999 | Kim | 327/158 |
| 5,883,533 A | 3/1999 | Matsuda et al. | 327/156 |
| 5,889,423 A | 3/1999 | Trumpp | 327/298 |
| 5,892,981 A | 4/1999 | Wiggers | 395/878 |
| 5,920,518 A | 7/1999 | Harrison et al. | 365/233 |

(Continued)

FOREIGN PATENT DOCUMENTS

| | | |
|---|---|---|
| JP | 02000035831 A | 2/2000 |
| WO | WO 01/29680 A1 | 4/2001 |
| WO | WO 02/11355 A1 | 2/2002 |

OTHER PUBLICATIONS

John G. Maneatis, "Low–Jitter Process–Independent DLL and PLL Based on Self–Biased Techniques," IEEE Journal of Solid–State Circuits, vol. 31, No. 11, Nov. 1996, pp. 1723–1732.

(Continued)

Primary Examiner—Linh My Nguyen
(74) Attorney, Agent, or Firm—Vierra Magen Marcus Harmon & DeNiro LLP

(57) ABSTRACT

An integrated circuit device having a select circuit, a summing circuit and a phase mixer. The select circuit selects one of a plurality of offset values as a selected offset. The summing circuit sums the selected offset with a phase count value, the phase count value indicating a phase difference between a reference clock signal and one of a first plurality of clock signals. The phase mixer combines the first plurality of clock signals in accordance with the sum of the selected offset and the phase count value to generate an output clock signal.

64 Claims, 26 Drawing Sheets

U.S. PATENT DOCUMENTS

| | | | |
|---|---|---|---|
| 5,940,608 A | 8/1999 | Manning | 395/558 |
| 5,940,609 A | 8/1999 | Harrison | 395/558 |
| 5,945,862 A | 8/1999 | Donnelly et al. | 327/278 |
| 5,946,244 A | 8/1999 | Manning | 365/194 |
| 5,963,502 A | 10/1999 | Watanabe | 365/233 |
| 6,011,732 A | 1/2000 | Harrison et al. | 365/194 |
| 6,016,282 A | 1/2000 | Keeth | 365/233 |
| 6,026,050 A | 2/2000 | Baker et al. | 365/233 |
| 6,026,051 A | 2/2000 | Keeth et al. | 365/233 |
| 6,029,250 A | 2/2000 | Keeth | 713/450 |
| 6,029,252 A | 2/2000 | Manning | 713/556 |
| 6,031,788 A | 2/2000 | Bando et al. | 365/233 |
| 6,043,717 A * | 3/2000 | Kurd | 331/17 |
| 6,047,346 A | 4/2000 | Lau et al. | 710/126 |
| 6,085,284 A | 7/2000 | Farmwald et al. | 711/105 |
| 6,101,197 A | 8/2000 | Keeth et al. | 370/517 |
| 6,101,612 A | 8/2000 | Jeddeloh | 713/401 |
| 6,104,228 A | 8/2000 | Lakshmikumar | 327/407 |
| 6,108,795 A | 8/2000 | Jeddeloh | 713/401 |
| 6,125,157 A | 9/2000 | Donnelly et al. | 375/371 |
| 6,133,773 A | 10/2000 | Garlepp et al. | 327/247 |
| 6,198,356 B1 | 3/2001 | Visocchi et al. | 331/34 |
| 6,255,912 B1 * | 7/2001 | Laub et al. | 331/25 |
| 6,304,116 B1 | 10/2001 | Yoon et al. | 327/158 |
| 6,321,282 B1 | 11/2001 | Horowitz et al. | 710/104 |
| 6,373,308 B1 | 4/2002 | Nguyen | 327/161 |
| 6,437,619 B2 | 8/2002 | Okuda et al. | 327/158 |
| 6,469,555 B1 | 10/2002 | Lau et al. | 327/158 |
| 6,470,060 B1 | 10/2002 | Harrison | 375/374 |
| 6,483,360 B2 | 11/2002 | Nakamura | 327/158 |
| 6,504,438 B1 * | 1/2003 | Chang et al. | 331/17 |
| 6,580,305 B1 | 6/2003 | Liu et al. | 327/298 |
| 6,759,881 B2 | 7/2004 | Kizer et al. | 327/147 |
| 6,784,714 B2 | 8/2004 | Nakamura | 327/271 |
| 2001/0053187 A1 * | 12/2001 | Simon et al. | 375/257 |
| 2002/0084857 A1 | 7/2002 | Kim | 331/60 |
| 2002/0140472 A1 | 10/2002 | Sonobe | 327/158 |

OTHER PUBLICATIONS

Bang–Sup Song and David C. Soo, "NRZ Timing Recovery Technique for Band–Limited Channels," IEEE Journal of Solid–State Circuits, vol. 32, No. 4, Apr. 1997, pp. 514–520.

John Poulton, "Signaling in High–Performance Memory Systems," ISSCC, 1999, pp. 1–59.

Gu–Yeon Wei et al., "A Variable–Frequency Parallel I/O Interface with Adaptive Power Supply Regulation," IEEE Journal of Solid–State Circuits, vol. 35, No. 11, Nov. 2000, pp. 1600–1609.

Description "Stefanos Sidiropoulos et al., ""Circuit Design for a 2.2GB/s Memory Interface,""2001 IEEE International Solid–State Circuits Conference, Digest of Technical Papers, pp. 70–71."

* cited by examiner

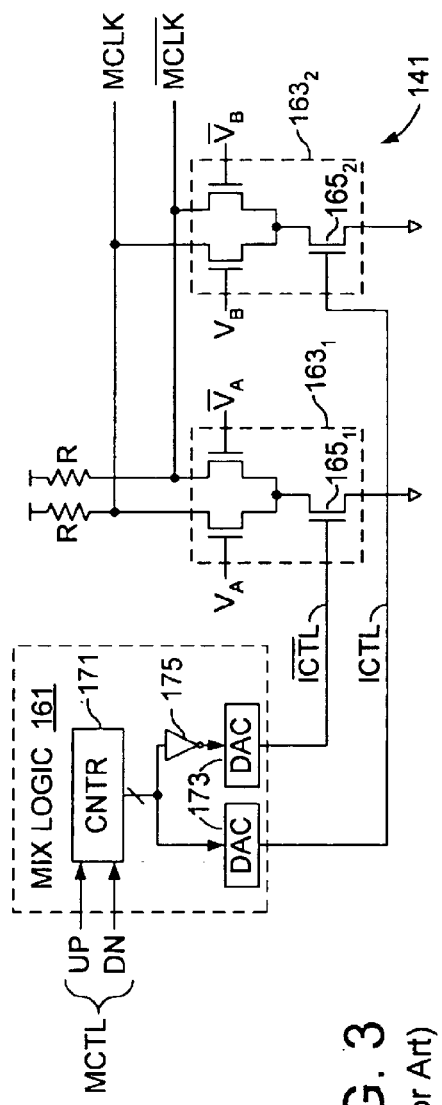
FIG. 3 (Prior Art)
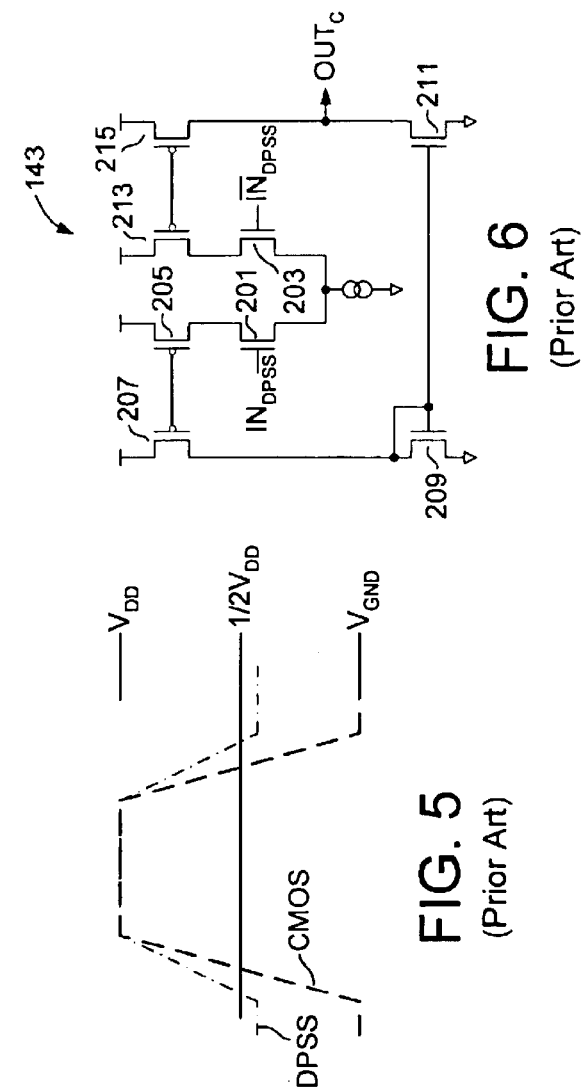
FIG. 5 (Prior Art)
FIG. 6 (Prior Art)
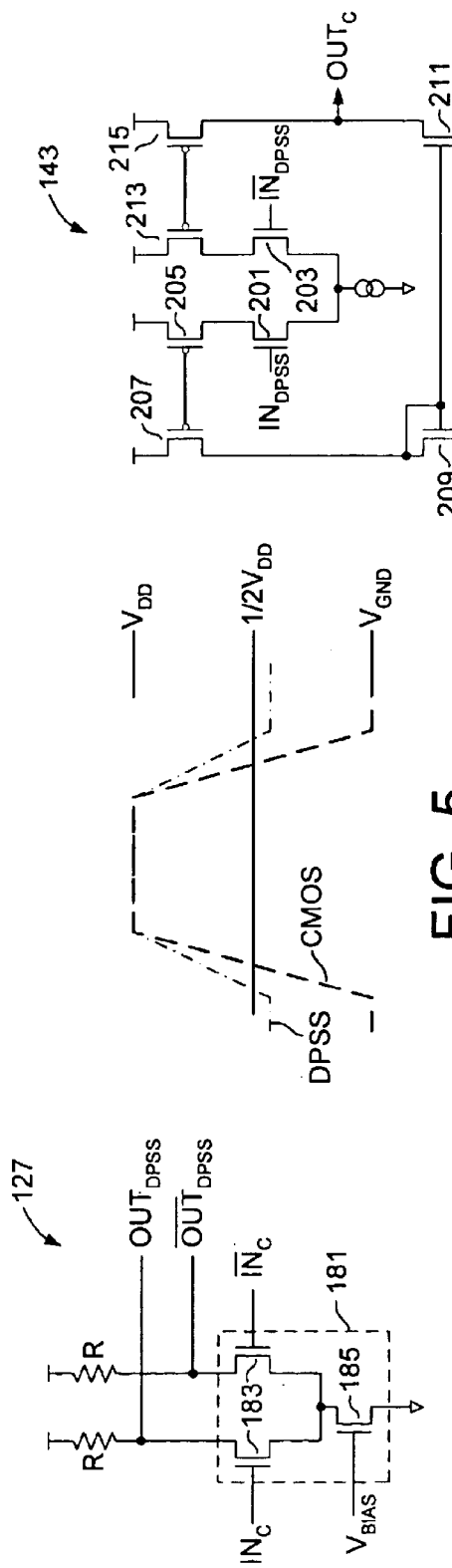
FIG. 4 (Prior Art)

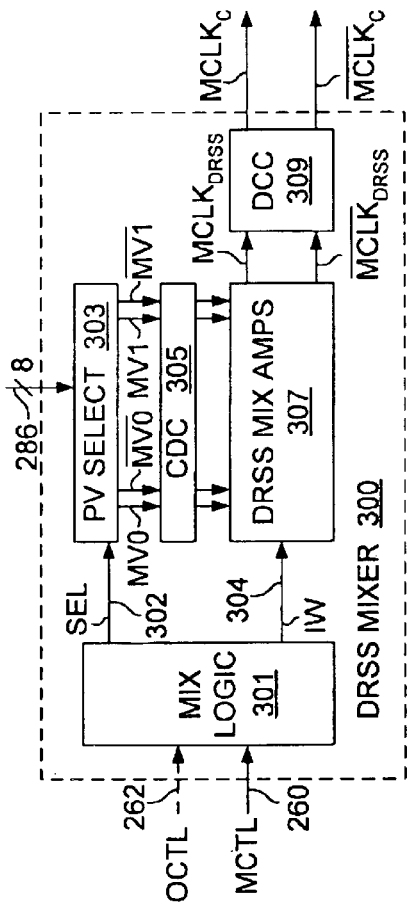
FIG. 8
FIG. 9
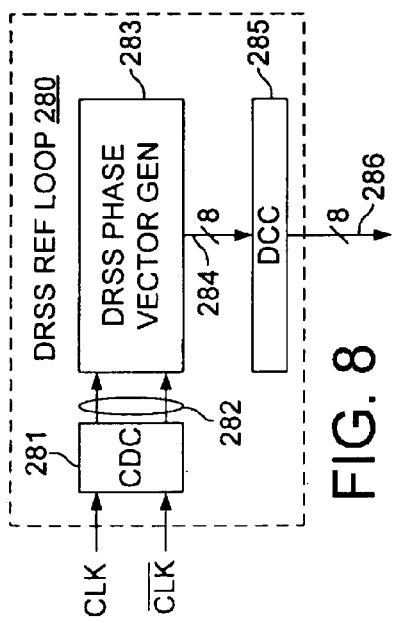
FIG. 10
FIG. 11
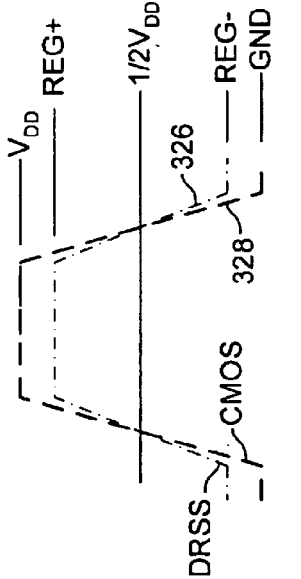
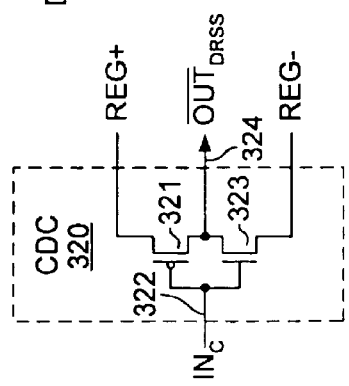
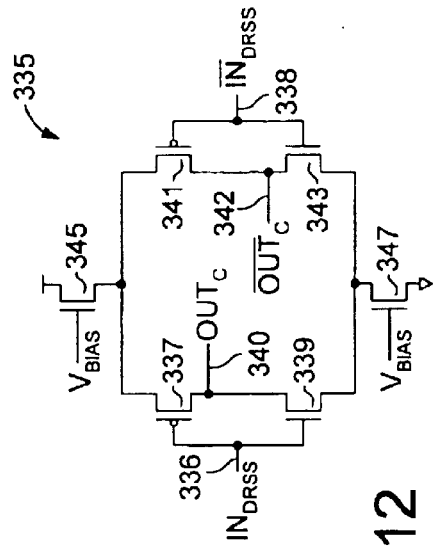
FIG. 12

| OSEL | S1 | S2 | S3 | S4 | MV0 | MV1 | $\overline{MV0}$ | $\overline{MV1}$ | IWINC |
|---|---|---|---|---|---|---|---|---|---|
| 000 | 0 | 0 | 0 | 0 | $V_0$ | $V_1$ | $\overline{V_0}$ | $\overline{V_1}$ | $0 \rightarrow 2^N-1$ |
| 001 | 1 | 0 | 0 | 0 | $V_2$ | $V_1$ | $\overline{V_2}$ | $\overline{V_1}$ | $2^N-1 \rightarrow 0$ |
| 010 | 1 | 1 | 0 | 0 | $\overline{V_0}$ | $V_3$ | $V_2$ | $\overline{V_3}$ | $0 \rightarrow 2^N-1$ |
| 011 | 0 | 0 | 1 | 0 | $\overline{V_0}$ | $V_3$ | $V_0$ | $\overline{V_3}$ | $2^N-1 \rightarrow 0$ |
| 100 | 0 | 1 | 1 | 1 | $\overline{V_0}$ | $\overline{V_1}$ | $V_2$ | $V_1$ | $0 \rightarrow 2^N-1$ |
| 101 | 1 | 0 | 1 | 1 | $V_2$ | $\overline{V_1}$ | $\overline{V_2}$ | $V_1$ | $2^N-1 \rightarrow 0$ |
| 110 | 0 | 0 | 0 | 0 | $V_0$ | $\overline{V_3}$ | $\overline{V_2}$ | $V_3$ | $0 \rightarrow 2^N-1$ |
| 111 | 0 | 1 | 0 | 1 | $V_0$ | $\overline{V_3}$ | $\overline{V_0}$ | $V_3$ | $2^N-1 \rightarrow 0$ |

FIG. 17

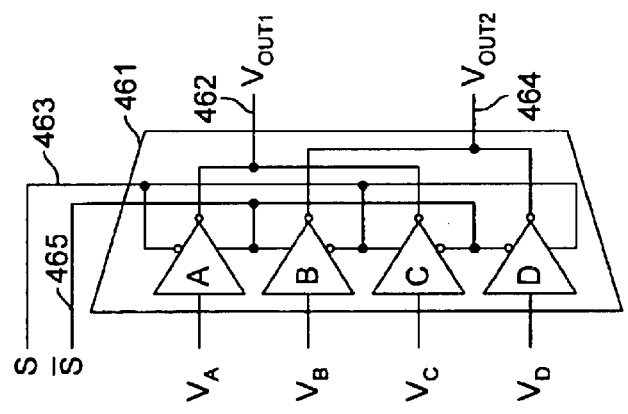

FIG. 18

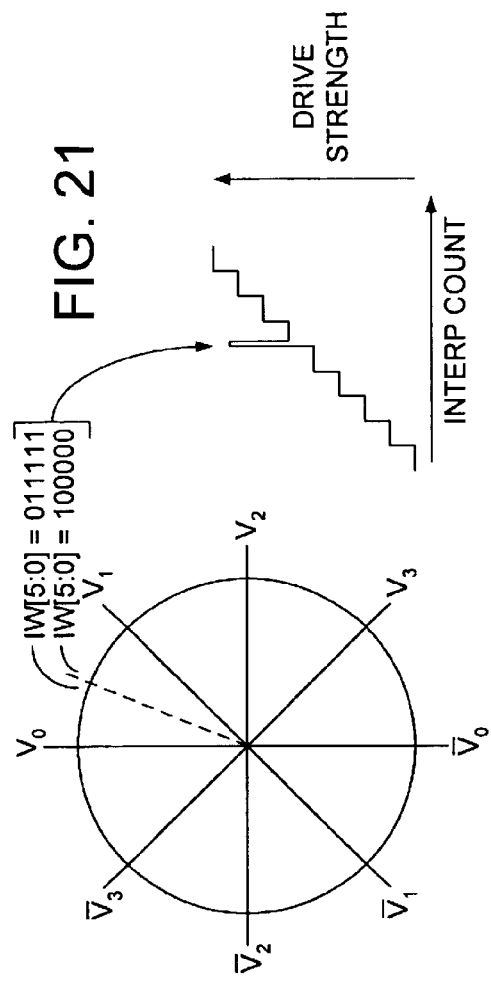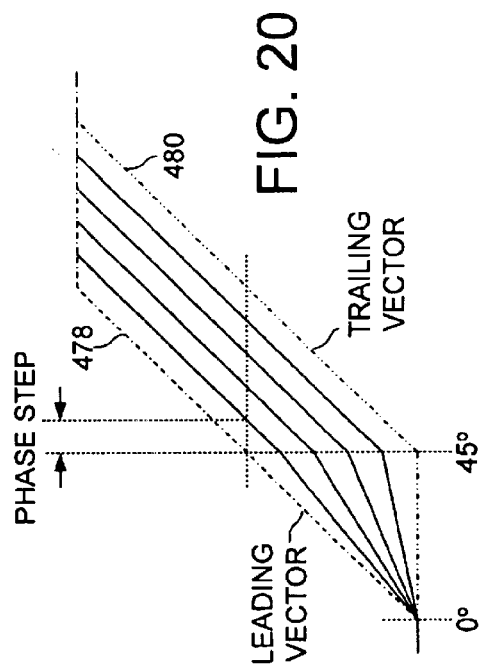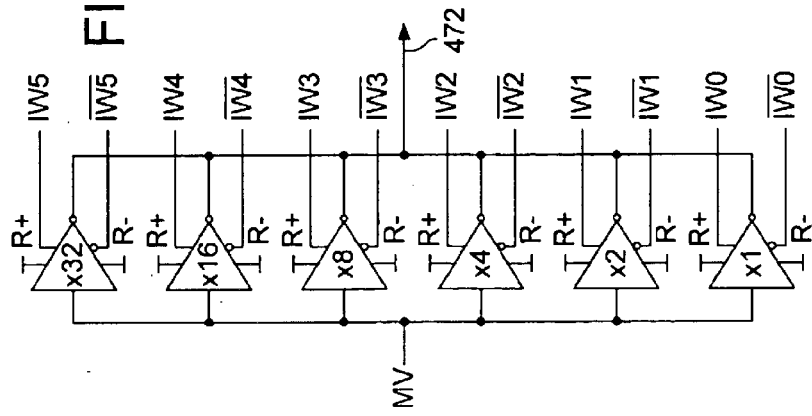

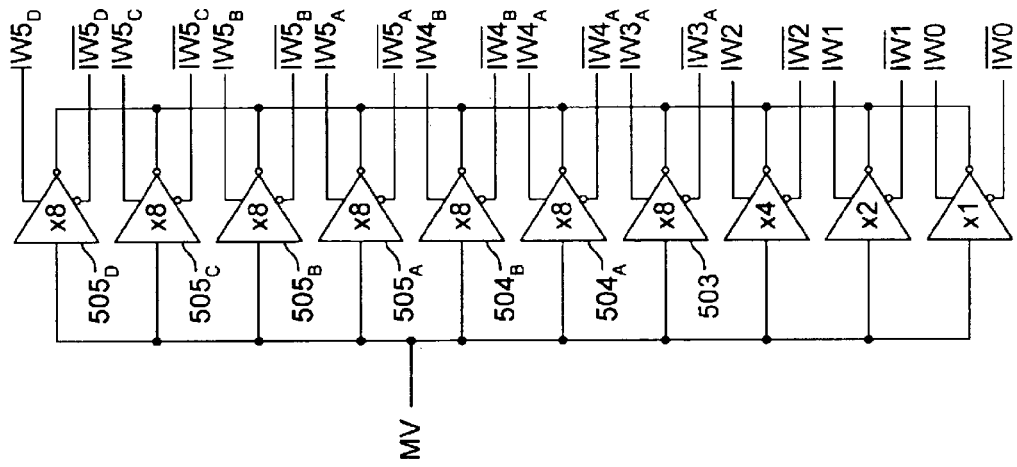
FIG. 24
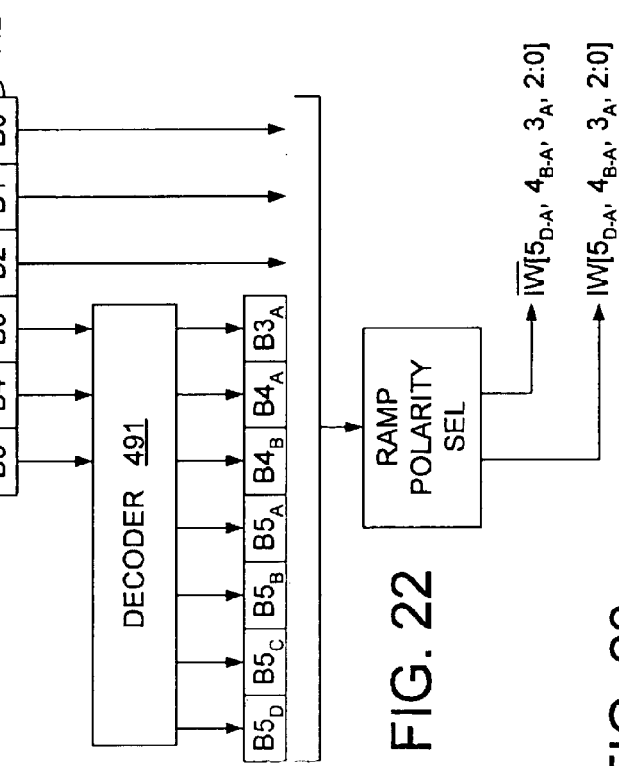
FIG. 22
FIG. 23

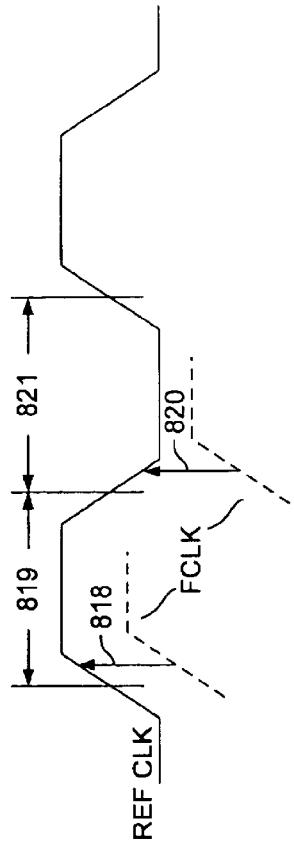
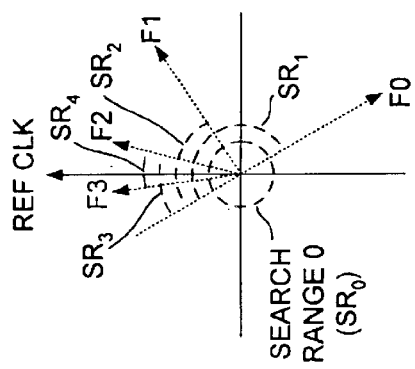
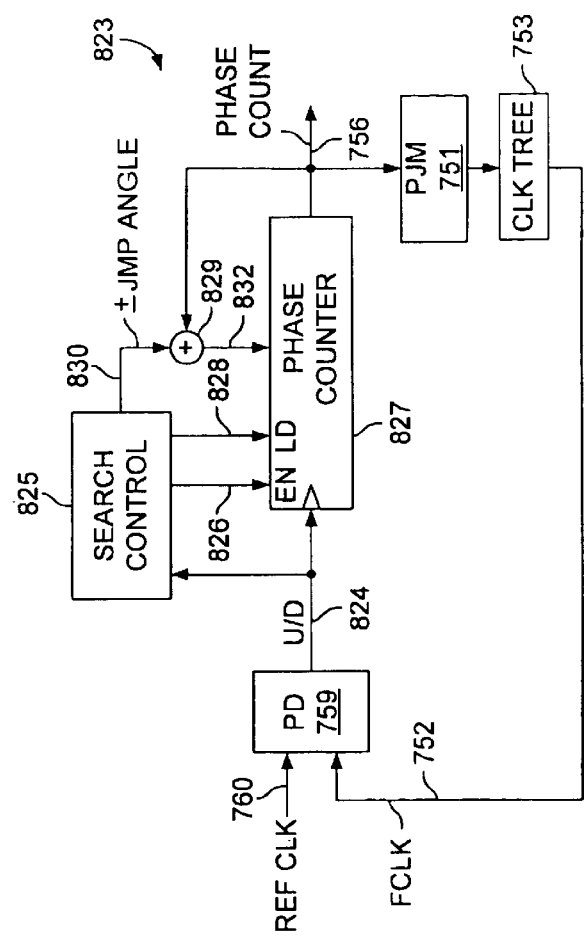
FIG. 34
FIG. 33
FIG. 35

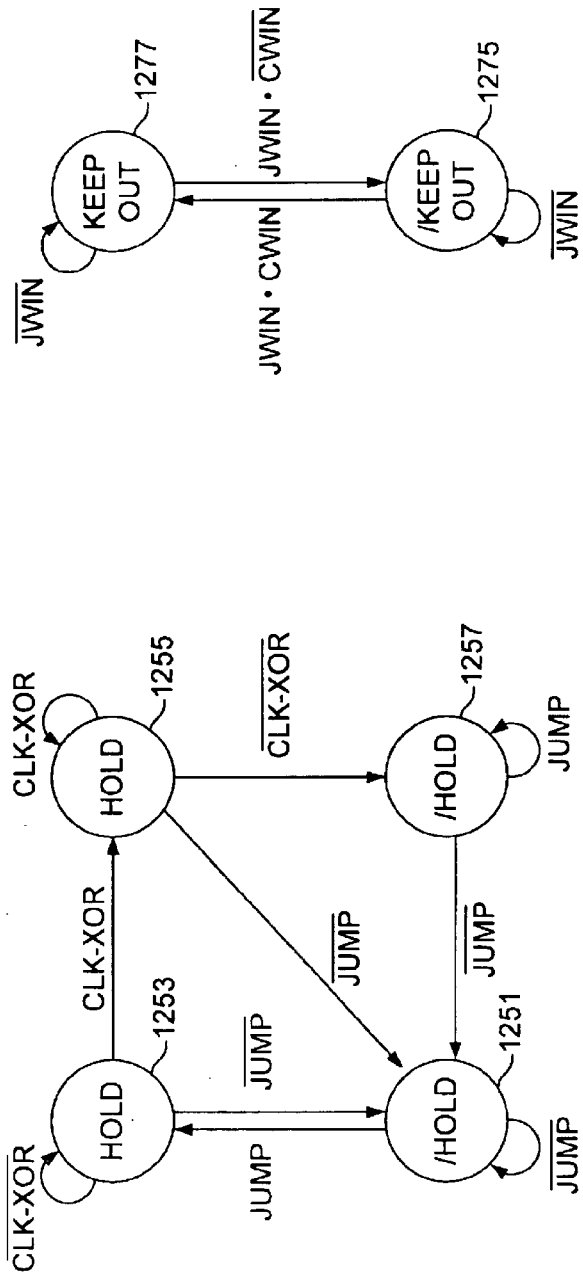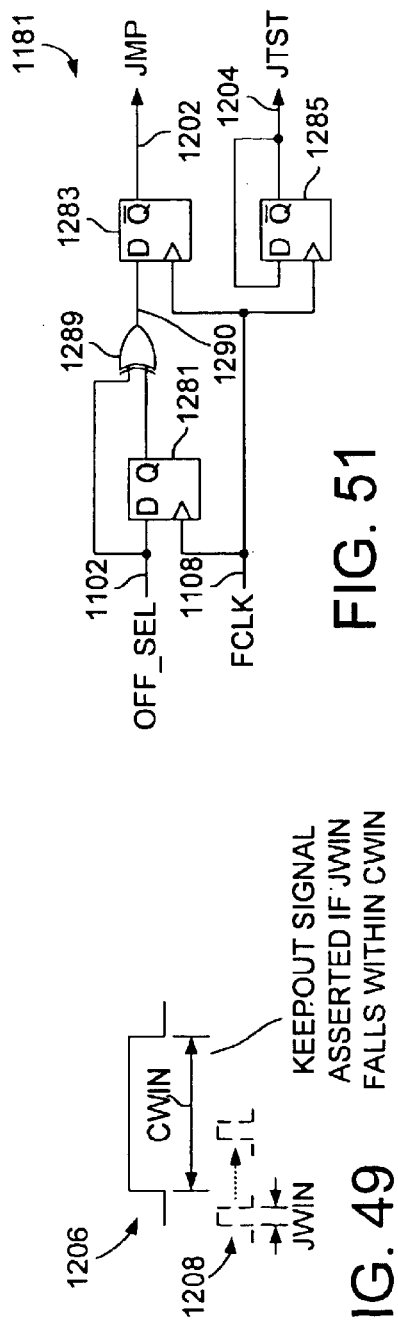

SYSTEM WITH DUAL RAIL REGULATED LOCKED LOOP

CROSS-REFERENCE TO RELATED APPLICATIONS

This application is a continuation-in-part of U.S. patent application Ser. No. 10/104,230, filed Mar. 22, 2002, and claims the benefit of U.S. Provisional Application No. 60/408,063, filed Sep. 3, 2002, U.S. Provisional Application No. 60/408,108 filed Sep. 3, 2002, and U.S. Provisional Application No. 60/436,756 filed Dec. 27, 2002. U.S. patent application Ser. No. 10/104,230 is hereby incorporated by reference in its entirety, and each of U.S. Provisional Application Nos. 60/408,063, 60/408,108 and 60/436,756 is hereby incorporated by reference in its entirety.

FIELD OF THE INVENTION

The present invention relates generally to high speed signaling within and between integrated circuit devices, and more particularly to clock generation in high-speed signaling devices and systems.

BACKGROUND

Delay locked loop (DLL) circuits are often used in high-speed signaling systems to generate clock signals having precisely controlled phase offsets relative to a reference clock. FIG. 1 illustrates one such prior art signaling system including a master device 101 coupled to a N slave devices, $103_1$–$103_N$, via a data path 102, and a clock generator 106 coupled to the master device 101 and the slave devices 103 via a clock line 104. A reference clock signal, CLK, generated by the clock generator 106 is used within the master device 101 to time the transmission of data and is used within the slave devices 103 to time data reception. In theory, the flight time (i.e., signal propagation time) of the clock signal on the clock line 104 is the same as the data flight time on the data path 102 so that a phase relationship between a clock edge passing by the master device 101 and data output by the master device is maintained as the clock edge and data arrive at the various slave devices 103. In reality, however, differences between clock and data path characteristics (e.g., parasitic capacitance, loading, etc.), however small, result in flight time differences (i.e., skew) between the clock and data signals. Because the width of a data eye (i.e., data valid interval) in high-speed signaling systems is extremely brief (e.g., 2 nanoseconds in the case of a 500 MHz symbol rate), even a small amount of skew may result in violation of setup and hold time requirements of sampling circuits within the slave devices and therefore lead to data sampling errors. Accordingly, in the prior art system of FIG. 1, DLL circuits are included within each of the slave devices to generate sampling clock signals that are aligned to the desired sampling instant for the slave device. This arrangement is shown in FIG. 1 by the detail view of slave device 103 which includes a DLL circuit 107 to generate a sampling clock (SCLK) and a sampling circuit 109 to sample data (thereby generating sampled data signal, SDATA) in response to the sampling clock.

FIG. 2 illustrates a prior art DLL circuit. The delay locked loop circuit includes a reference loop 121, a mix loop 123, and a sampling clock generator 125. The reference loop includes a level converter 127, delay line 129 and phase detector 131 which cooperate to generate incrementally delayed versions of a reference clock signal, referred to as phase vectors 122. The level converter converts the signaling level of the incoming reference clock signals (i.e., complementary clock pair, CLK and /CLK) from CMOS (complementary metal oxide semiconductor) to differential pair small swing (DPSS) signals. The DPSS-level clock signals are input to the delay line which is formed by a plurality of differential amplifier delay elements each of which introduces a phase delay according to a bias voltage, DCTL. The phase detector 131 adjusts the bias voltage DCTL as necessary to produce a total delay, through a selected set of the delay elements 133, equal to a full cycle of the reference clock signal, CLK. That is, the phase detector 131 compares a nominally zero degree phase vector with a nominally 360 degree phase vector and increases or decreases the bias voltage (thereby decreasing or increasing the delay of the delay line) according to whether the 360 degree phase vector lags or leads the 0 degree phase vector. The number of delay elements 133 in the delay line is such that each delay element introduces a 45 degree input-to-output delay when the 0 and 360 degree vectors are in phase alignment. Accordingly, the phase vectors 122 range from 0 to 315 degrees in 45 degree phase steps.

The mix loop 123 includes a mixer 141, level converter 143, clock tree circuit 145 and phase detector 147 which cooperate to generate a mix control signal, MCTL. The mixer receives the phase vectors 122 from the reference loop 121 and interpolates between a selected pair of the phase vectors to generate a mix clock signal 142. The mix clock signal 142 is converted from a DPSS signaling level to a CMOS signaling level by converter 143, and is then passed through the clock tree circuit 145 (typically a series of amplifiers that enable fan out of multiple instances of the clock signal) to generate a feedback clock signal, FCLK. The phase detector 147 compares the feedback clock signal with the reference clock signal and generates the mix control signal according to which clock signal leads the other. For example, if the reference clock signal leads the feedback clock signal, the phase detector 147 signals the mixer 141 (i.e., by appropriate state of the mix control signal) to shift interpolation toward the leading one of the selected phase vectors (and away from the trailing phase vector), thereby advancing the phase of the feedback clock. Conversely, if the reference clock signal lags the feedback clock signal, the phase detector 147 signals the mixer to shift interpolation toward the trailing one of the selected phase vectors. If the reference clock still leads or lags the feedback clock signal after interpolation has been shifted completely to one of the selected phase vectors, a different pair of phase vectors (i.e., bounding an adjacent range of phase angles) is selected by the mixer 141.

The sampling clock generator 125 includes a mixer 149, converter 151 and clock tree circuit 153 that essentially mirror the operation of the mixer, converter and clock tree circuit within the mix loop 123 to generate a sampling clock signal, SCLK. The mixer 149 receives the mix control signal, MCTL, generated within the mix loop 123 and therefore, when an offset control signal, OCTL, indicates zero offset, performs the same interpolation operation on the same pair of selected vectors as the mixer 141. As the mix control signal is incremented and decremented, the mixer 149 tracks the operation of the mixer 141 such that the sampling clock signal tracks the feedback clock signal (i.e., the sampling clock signal and feedback clock signal have the same phase). The offset control value, OCTL, is a value that is added to a count maintained within the mixer 149 to provide a controlled, adjustable offset between the sampling clock and reference clock, thereby allowing correction of skew between the reference clock and a desired sampling instant.

FIG. 3 illustrates, in part, a prior art mixer 141 for mixing DPSS-level clock signals. The mixer 141 includes mix logic 161 and a number of differential amplifier circuits 163 (only two of which, $163_1$ and $163_2$, are shown in the simplified diagram of FIG. 3). The differential amplifiers 163 each receive respective pairs of complementary phase vectors and have output nodes that are pulled up through a common pair of load resistances, R. By this arrangement, the resultant mix clock signal, MCLK, will have a phase that is between the phases of the input phase vectors according to the bias voltages, ICTL and /ICTL, applied to the respective biasing transistors of the differential amplifiers 163. The mix logic 161 maintains a counter 171 that is incremented and decremented in response to the mix control signal, MCTL, and a pair of digital-to-analog converters (DACs) 173 which generate bias voltages, ICTL and /ICTL according to the count value and complement count value (generated by inverter 175), respectively. Thus, as the count value is incremented, the bias voltage ICTL is increased (increasing the gain of differential amplifier $163_2$) and bias voltage /ICTL is decreased (decreasing the gain of differential amplifier $163_1$), thereby shifting the phase of the output clock signal toward phase vector $V_B$ and away from phase vector $V_A$.

Because of the high impedance load driven by the DACs 173 (i.e., the gate terminals of biasing transistors $165_1$ and $165_2$), several cycles of the reference clock signal are typically needed for the DAC to settle and, therefore, for the mix control signal to become valid. This is a significant disadvantage of the mixer 141, as a relatively long time is typically required to perform a phase locking operation in which numerous successive phase steps are needed to reach phase lock. Also, the ability to rapidly switch between phase offsets is limited by the DAC settling time.

The presence of the DPSS-to-CMOS converter 143 at the mixer output (see FIG. 2) presents another problem. Referring to FIG. 4, which illustrates a prior art CMOS-to-DPSS converter 127, it can be seen that the DPSS-level signals used within the reference loop 121 and mixers 141 and 149 of FIG. 2 are generated by pulling down the drain terminals of transistors 183 of a differential amplifier 181 according to the states of differential CMOS input signals, $IN_C$ and $/IN_C$. In order to produce linear conversion from CMOS to DPSS signaling levels, it is desirable for the current drawn by the biasing transistor 185 (controlled by bias voltage $V_{BIAS}$) to be as constant as possible. Accordingly, the minimum signal swing of the DPSS signals are constrained to be at least high enough to maintain the biasing transistor 185 in the linear region of operation (i.e., in saturation). Consequently, when a CMOS input signal is high, the corresponding DPSS signal is pulled down to a signal level that is substantially above the ground potential, and when the CMOS input signal is low, the DPSS signal is pulled up to the supply voltage level, $V_{DD}$. That is, as shown in FIG. 5, the DPSS signal swing is asymmetric with respect to the midpoint of the CMOS signal swing (i.e., $V_{DD}/2$).

The asymmetric swing of the DPSS signal relative to CMOS signal swing tends to complicate the return conversion from DPSS to CMOS signaling levels. FIG. 6 illustrates a prior art DPSS-to-CMOS converter circuit that receives complementary differential input DPSS signals, $IN_{DPSS}$ and $/IN_{DPSS}$, and that outputs a single-ended CMOS output signal, $OUT_C$. As $IN_{DPSS}$ goes high, transistor 201 is switched on, resulting in current I1 through transistor 205. Transistor 205 is coupled in a current mirror configuration with transistor 207, so that current I1 flows through transistor 207 and also through diode-configured transistor 209. Transistor 209 is coupled in a current mirror configuration with transistor 211, so that transistor 211 is switched on, thereby pulling output signal, $OUT_C$, to ground. While $IN_{DPSS}$ is high, $/IN_{DPSS}$ is low, so that transistor 203 is switched off, thereby switching off transistors 213 and 215. Thus, when $IN_{DPSS}$ is high, the output signal is pulled low by the switching on of transistors 201, 205, 207, 209 and then 211. By contrast, when $IN_{DPSS}$ is low and $/IN_{DPSS}$ is high, transistors 203, 213 and 215 are switched on to pull up the output signal, $OUT_C$, to the supply voltage. Thus, five transistors change state in sequence to pull the output signal low and only three transistors change state to pull the output signal high. Consequently, the output signal tends to transition more slowly in response to a low-to-high transition of the DPSS input signal than in response to a high to low transition of the DPSS input signal. That is, the conversion from DPSS to CMOS signaling levels tends to introduce duty cycle distortion to an otherwise distortion free DPSS clock signal. Duty cycle correction circuits may be added to correct the duty cycle distortion, but, at least in the architecture of FIG. 2, such circuits need to be added not only in the mix loop 123, but also within sampling clock generator 125 to avoid phase error due to propagation delay through the duty cycle correction circuit. Also, because of the process dependent nature of the DPSS to CMOS converter (and ensuing duty cycle distortion circuit), the propagation delays through the converter tend to be difficult to match between the converter 151 in the sample clock generator 125 and the converter 143 within the mix loop 123, thereby introducing a potential source of phase error in the sampling clock. Duty cycle correction circuits, if included, may introduce further phase error. Also, while only two DPSS-to-CMOS converters 143 and 151 are shown in the architecture of FIG. 2, it is often necessary to convert the DPSS-level phase vectors generated by the reference loop 121 to CMOS levels for exportation to the mixers 141 and 149, then convert back from CMOS to DPSS signaling levels at the front end of the mixers. Such conversions may introduce further duty cycle distortion and phase error in the sampling clock.

BRIEF DESCRIPTION OF THE DRAWINGS

The present invention is illustrated by way of example, and not by way of limitation, in the figures of the accompanying drawings and in which like reference numerals refer to similar elements and in which:

FIG. 3 illustrates a portion of a prior art mixer;

FIG. 4 illustrates a prior art signal converter circuit;

FIG. 5 illustrates the relative signal swings of CMOS and differential pair small-swing (DPSS) signals;

FIG. 6 illustrates another prior art signal converter circuit;

FIG. 8 illustrates a dual regulated small-swing (DRSS) reference loop according to an embodiment of the invention;

FIG. 9 illustrates a DRSS mixer according to an embodiment of the invention;

FIG. 10 illustrates a CMOS-to-DRSS signal converter according to an embodiment of the invention;

FIG. 11 depicts a DRSS-level signal superimposed over a CMOS-level signal;

FIG. 12 illustrates a DRSS-to-CMOS signal converter according to an embodiment of the invention;

FIG. 17 is a table that illustrates an exemplary relationship between an octant select signal, multiplexer control signals, mix vectors, and the ramp polarity of an interpolation word and complement interpolation word generated within the DRSS mixer of FIG. 16;

FIG. 18 illustrates an embodiment of a multiplexer that may be used within the DRSS mixer of FIG. 16;

FIG. 19 illustrates a DRSS mix amplifier according to an embodiment of the invention;

FIG. 20 illustrates the phase mixing of a leading mix vector and trailing mix vector in incremental phase steps;

FIG. 21 illustrates a transient phase error that may result from a race condition within the DRSS mix amplifier of FIG. 19;

FIG. 22 illustrates a decoder circuit to thermometer code selected bits of a phase vector interpolation value according to an embodiment of the invention;

FIG. 23 is a table that illustrates an exemplary decoding of selected bits of an interpolation value;

FIG. 24 illustrates a mix amplifier according to an alternative embodiment of the invention;

FIG. 33 illustrates a binary phase searching operation according to an embodiment of the invention;

FIG. 34 illustrates possible phase relationships between a reference clock signal and a feedback clock signal generated by a tracking loop;

FIG. 35 illustrates a tracking loop for performing a phase searching operation according to an embodiment of the invention;

FIG. 48 is an exemplary state diagram of the hold control circuit of FIG. 47;

FIG. 49 illustrates exemplary timing relationships between a clock window and a jump window;

FIG. 50 is an exemplary state diagram of the keepout circuit of FIG. 47; and FIG. 51 illustrates an exemplary embodiment of the synchronizing logic of FIG. 47.

DETAILED DESCRIPTION

Figure 1:
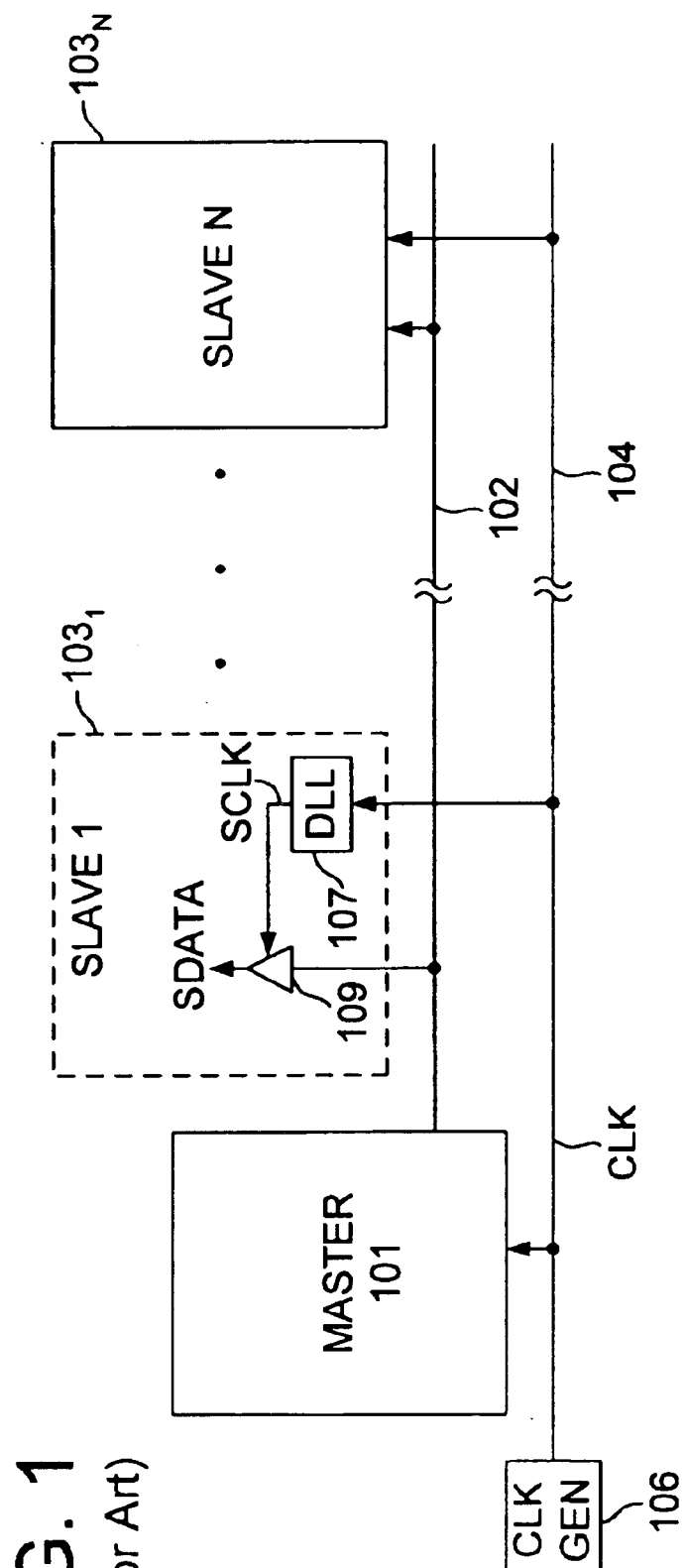
FIG. 1 illustrates a prior art signaling system.
Figure 2:
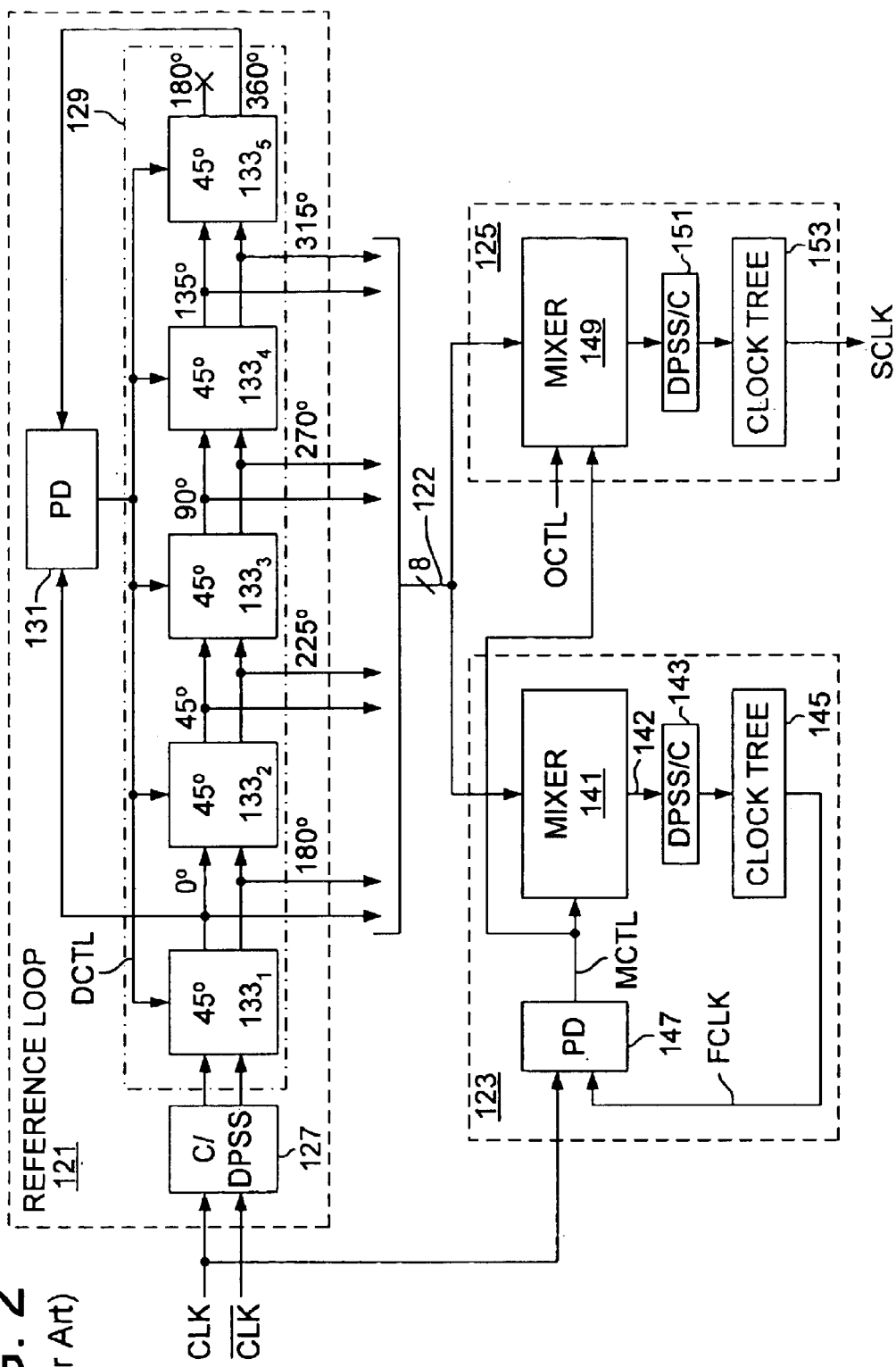
FIG. 2 illustrates a prior art delay locked loop circuit.

In the following description, for purposes of explanation, specific nomenclature is set forth to provide a thorough understanding of the present invention. However, it will be apparent to one skilled in the art that these specific details may not be required to practice the present invention. In some instances, the interconnection between circuit elements or circuit blocks may be shown as multi-conductor or single conductor signal lines. Each of the multi-conductor signal lines may alternatively be single signal conductor lines, and each of the single conductor signal lines may alternatively be multi-conductor signal lines. A signal is said to be "asserted" when the signal is driven to a low or high logic state (or charged to a high logic state or discharged to a low logic state) to indicate a particular condition. Conversely, a signal is said to be "deasserted" to indicate that the signal is driven (or charged or discharged) to a state other than the asserted state (including a high or low logic state, or the floating state that may occur when the signal driving circuit is transitioned to a high impedance condition, such as an open drain or open collector condition). A signal driving circuit is said to "output" a signal to a signal receiving circuit when the signal driving circuit asserts (or deasserts, if explicitly stated or indicated by context) the signal on a signal line coupled between the signal driving and signal receiving circuits. A signal line is said to be "activated" when a signal is asserted on the signal line, and "deactivated" when the signal is deasserted. Additionally, the prefix symbol "/" attached to signal names indicates that the signal is an active low signal (i.e., the asserted state is a logic low state). A line over a signal name (e.g., '$\overline{\text{<signal name>}}$') is also used to indicate an active low signal. Active low signals may be changed to active high signals and vice-versa as is generally known in the art.

Dual Rail Regulated Delay Locked Loop

In embodiments of the present invention, both the upper and lower supply voltages to a chain of inverters are adjusted by a voltage regulation circuit to produce a desired input-to-output delay through the inverter chain. Signals generated by individual inverters within the inverter chain are output as reference phase vectors to a mixing circuit and have signaling levels referred to herein as dual regulated small swing (DRSS) signaling levels. Because both supply voltages to the inverter chain are adjusted toward or away from a midpoint between system supply voltages (e.g., toward or away from $V_{DD}/2$), the signal swing of each DRSS-level phase vector is substantially symmetric with respect to the signal swing of CMOS signals, thereby avoiding the duty cycle distortion problems that plague prior art converters upon re-conversion from small-swing to CMOS signaling levels.

In one embodiment, a mixing circuit within a DLL is formed by inverters that are sized to achieve a binary weighted delay in proportion to the delay introduced by an inverter within the inverter chain. By this arrangement, a pair of phase vectors may be mixed by inputting the phase vectors into respective sets of the binary weighted inverters and selectively enabling the binary weighted inverters to achieve a desired phase contribution from each of the phase vectors. Thus, unlike the prior art mixer described above, no DAC-generated bias voltage is needed, and the multi-clock cycle DAC settling time is avoided. As a result, substantially faster phase locking may be achieved and the time required to switch between arbitrary phase offsets may be reduced.

Overview of a DLL Circuit According to an Embodiment of the Invention

Figure 7:
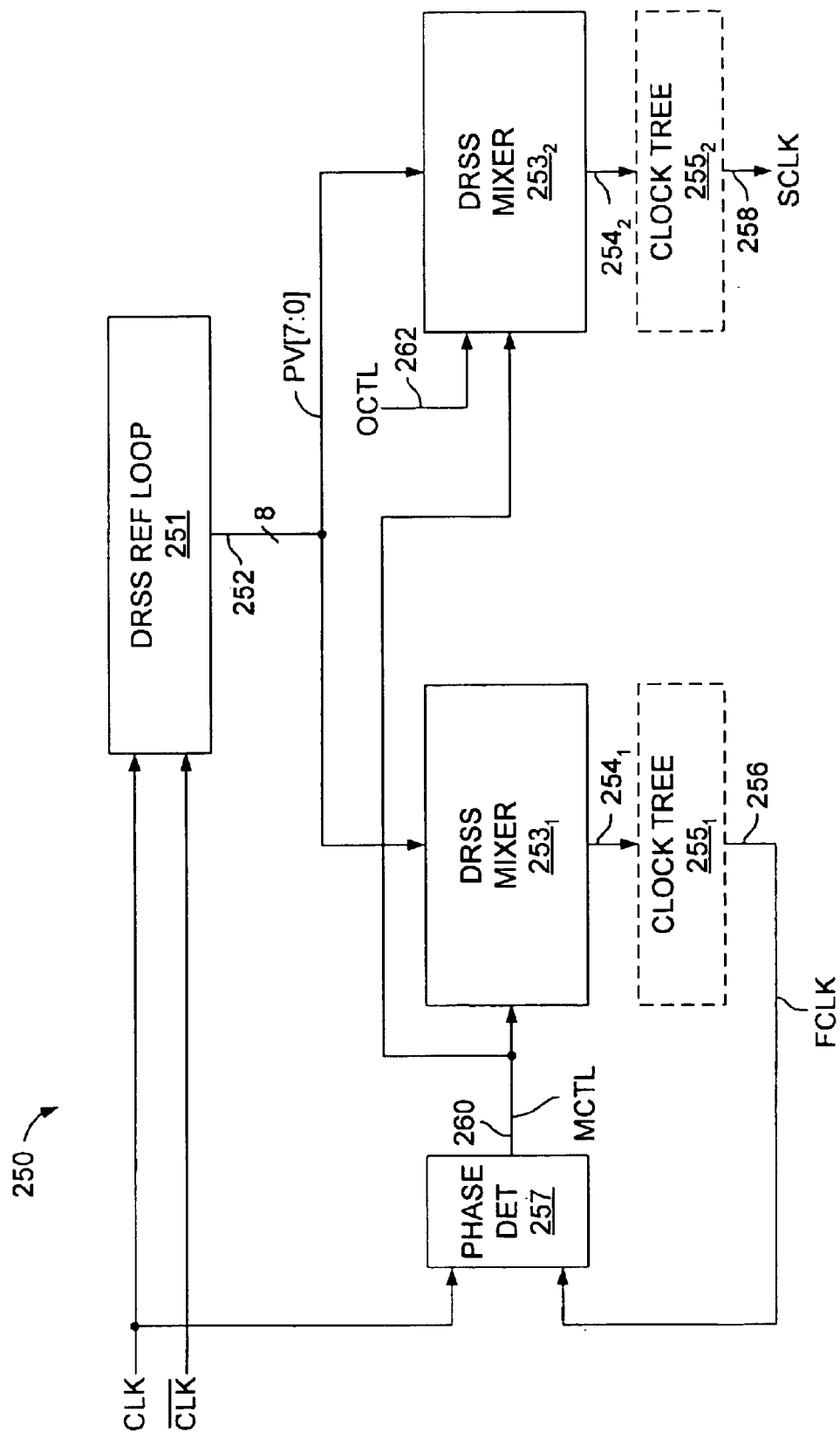
FIG. 7 illustrates a DLL circuit according to an embodiment of the invention.

FIG. 7 illustrates a DLL circuit 250 according to an embodiment of the invention. The DLL circuit 250 includes a DRSS reference loop 251, a pair of DRSS mixers 253$_1$ and 253$_2$, a pair of clock tree circuits 255$_1$ and 255$_2$, and a phase detector 257. The DRSS reference loop 251 receives a reference clock signal, CLK, and complement (i.e., inverted) reference clock signal, /CLK, and generates a set of phase vectors 252 (eight phase vectors in this example) that are incrementally offset in time (i.e., phase spaced) within a cycle period of the reference clock signal. The phase vectors 252 are supplied to the DRSS mixer circuits 253, each of which generates a respective mix clock signal, 254$_1$ and 254$_2$. The mix clock signal 254$_1$ is output to the clock tree circuit 255$_1$ which, in turn, generates a feedback clock signal 256 (FCLK). The mix clock signal 254$_2$ is output to the clock tree circuit 255$_2$ which outputs multiple instances of a sampling clock signal 258 (SCLK). In an alternative embodiment, where fan out of the sampling clock signal 258 is limited, the clock tree circuits 255$_1$ and 255$_2$ may be omitted. If present, the clock tree circuits 255$_1$ and 255$_2$ may be designed to have substantially the same electrical characteristics such that the mix clocks 254$_1$ and 254$_2$ experience the same propagation delays to generate clock signals 256 and 258, respectively.

The phase detector 257 receives the feedback and reference clock signals (FCLK and CLK) and generates a mix control signal 260 (MCTL) that indicates whether the reference clock signal leads or lags the feedback clock signal. Mix logic within the DRSS mixer 253$_1$ responds to the mix control signal 260 by advancing or retarding the phase of the mix clock signal 254$_1$ and, therefore, advancing or retarding the phase of the feedback clock signal 256. In one embodiment the phase detector 257 is a zero phase detector (ZPD) in which the feedback clock signal 256 is used to sample the reference clock signal and thereby generate the mix control signal 260 according to whether the reference clock signal has changed state before or after the sampling instant (i.e., before or after an edge of feedback clock signal 256). Alternatively, the reference clock signal may be used to sample the feedback clock signal 256. Also, other types of phase detectors may be used in alternative embodiments.

The DRSS mixer 253$_2$ receives both the mix control signal 260 and an offset control value 262 (OCTL). The offset control value 262 is used to provide an adjustable offset between the sampling clock signal 258 and the reference clock signal. Mix logic within the DRSS mixer 253$_2$ responds to the state of the mix control signal 260 by advancing or retarding the phase of the mix clock signal 254$_2$ and, therefore, the sampling clock signal 258. Thus, if the offset control value specifies a zero phase offset, the sampling clock signal 258 and feedback clock signal 256 will remain substantially phase aligned with one another and with the reference clock signal.

In one embodiment, the offset control value 262 is maintained in a configuration circuit within the integrated circuit device that includes the DLL circuit 250. The configuration circuit may be a volatile or non-volatile memory, or a fusible or otherwise one-time programmable circuit. Also, instead of on-chip configuration, the offset control value 262 may be maintained or generated by a device that is external to the integrated circuit that contains the DLL circuit 250. Whether maintained on or off chip, the offset control value 262 may be initialized at system startup (e.g., as part of a calibration procedure that determines a desired offset between the sampling clock signal and reference clock signal) and/or updated in periodic calibration operations or in response to predetermined events (e.g., detection of threshold error rate or threshold phase difference between center of data eye and edge of sampling clock signal 258). Also, because the DRSS mixer 253$_2$ is able to adjust the phase of the sampling clock signal 258 relatively quickly in response to changes in the mix control signal 260 and/or offset control value 262, the offset control value 262 may be adjusted between successive reception and/or transmission operations to achieve a phase-jumping mode of operation. Phase jumping is discussed below in greater detail.

Dual Regulated Small Swing Signal Conversion

FIG. 8 illustrates a DRSS reference loop 280 according to an embodiment of the invention. The DRSS reference loop 280 may be used, for example, to implement DRSS reference loop 251 of FIG. 7 and includes a CMOS-to-DRSS converter 281 (CDC), a DRSS phase vector generator 283 and a DRSS-to-CMOS converter 285 (DCC). The CMOS-to-DRSS converter 281 receives the complementary CMOS-level reference clock signals, CLK and /CLK, and converts the CMOS reference clock signals to complementary clock signals 282 having DRSS signal levels. The DRSS phase vector generator 283 receives the complementary DRSS-level reference clock signals 282 and generates a set of DRSS-level phase vectors 284. In the embodiment of FIG. 8 there are eight phase vectors 284 offset from an arbitrary reference phase by n*45 degrees, where n=0, 1, 2, . . . , 7. That is, the phase vectors have phase angles of 0, 45, 90, 135, 180, 225, 270 and 315 degrees. In alternative embodiments, there may be more or fewer phase vectors separated by smaller or larger phase angles, respectively. Also, in the embodiment of FIG. 8, the phase vectors are output to the DRSS-to-CMOS converter 285 for conversion from DRSS to CMOS signaling levels. The CMOS-level phase vectors 286 are then exported to the mixer circuits 253 of FIG. 7. In an alternative embodiment, the DRSS-level phase vectors themselves are output to the mixer circuits 253 and the DRSS-to-CMOS converter 285 is omitted from the DRSS reference loop 280.

FIG. 9 illustrates a DRSS mixer 300 according to an embodiment of the invention. The DRSS mixer 300 may be used, for example, to implement either of mixers 253 of FIG. 7. In the case of DRSS mixer 253₁, the offset control signal 262 may be omitted as indicated by the dashed input arrow. The DRSS mixer 300 includes mix logic 301, phase vector selector 303, CMOS-to-DRSS converter 305, DRSS mix amplifiers 307 and DRSS-to-CMOS converter 309. The mix logic 301 responds to the mix control signal 260 (i.e., from phase detector 257 of FIG. 7) and, optionally, the offset control signal 262 to generate a select signal 302 (SEL) and interpolation word 304 (IW). The select signal 302 is output to the phase vector selector 303 to control the selection of a pair of mix vectors, MV0 and MV1, and a pair of complement mix vectors, /MV0 and /MV1. The selected mix vectors (and complement mix vectors) are converted from CMOS to DRSS signaling levels by converter 305, then input to DRSS mix amplifiers 307. In an embodiment in which DRSS-level phase vectors (i.e., vectors 284 of FIG. 8) are output directly from the DRSS reference loop 280 of FIG. 8, the CMOS-to-DRSS converter 305 may be omitted. The DRSS mix amplifiers 307 mix the selected mix vectors and complement mix vectors in accordance with the interpolation word 304 to generate a DRSS-level mix clock signal, $MCLK_{DRSS}$, and complement mix clock signal, $/MCLK_{DRSS}$. The mix clock signal and complement mix clock signal are converted to complementary CMOS-level clock signals, $MCLK_C$ and $/MCLK_C$ by the DRSS-to-CMOS converter 309, then output from the DRSS mixer 300.

FIG. 10 illustrates a CMOS-to-DRSS converter 320 according to an embodiment of the invention. The converter 320 may be used, for example, within the DRSS reference loop 280 of FIG. 8 (i.e., to implement converter 281) and within the DRSS mixer 300 of FIG. 9 (i.e., using two converters 320 to implement converter 305). The converter 320 includes a PMOS (positively-doped, metal oxide semiconductor) transistor 321 and an NMOS (negatively-doped, metal oxide semiconductor) transistor 323 coupled in an inverting configuration. That is, the gate terminals of the transistors 321 and 323 are each coupled to an input signal line 322 to receive a CMOS-level input signal, $IN_C$, and the drain terminals of the transistors are each coupled to an output signal line 324 to drive a DRSS-level output signal $OUT_{DRSS}$. The source terminal of transistor 321 is coupled to a first regulated supply voltage, REG+, and the source terminal of transistor 323 is coupled to a second, lower regulated supply voltage, REG−. Together, the regulated voltages, REG+ and REG−, constitute dual regulated supply voltages which are generated by a dual rail regulation circuit to achieve a specific delay through inverter circuits within the DRSS reference loop. The operation of the dual rail regulation circuit is discussed below. When the input signal $IN_C$ is low, transistor 323 is switched off and transistor 321 is switched on to couple the more positive regulated voltage, REG+, to the output signal line 324. When the input signal is high, transistor 321 is switched off and transistor 323 is switched on to couple the more negative regulated voltage, REG−, to the output signal line 324. Thus, the CMOS-to-DRSS converter 320 is a dual-rail regulated inverter (i.e., both supply voltages are regulated) which generates an inverted output signal (relative to the input signal) that swings between the regulated supply voltages, REG+ and REG−.

FIG. 11 depicts a DRSS-level signal 328 superimposed over a CMOS-level signal 328 to illustrate the symmetry between the swings of the two signals. The CMOS signal 328 swings between a system supply voltage and a ground reference voltage (referred to herein as $V_{DD}$ and GND, respectively), while the DRSS signal swings between regulated voltages (REG+ and REG−) that are offset from the system supply and ground voltages, respectively, by substantially equal voltage offsets. That is, REG− is more positive than GND by a given voltage offset, and REG+ is more negative than $V_{DD}$ by the same voltage offset. Consequently, the swing of the DRSS signal 326 is centered about the CMOS common mode voltage, (VDD−GND)/2 (referred to herein as CMOS common mode, $V_{DD}/2$), like the CMOS signal 328 itself. This symmetric swing about the CMOS common mode distinguishes the DRSS signal level from the DPSS signal swing which is asymmetric with respect to the CMOS common mode. As discussed below in reference to FIG. 12, the symmetry between the DRSS and CMOS signal swings enables conversion from DRSS to CMOS signaling level without the duty cycle distortion that plagues the prior art DPSS-to-CMOS conversion circuit described above.

FIG. 12 illustrates a DRSS-to-CMOS signal converter 335 according to an embodiment of the invention. The converter 335 may be used, for example, within the DRSS reference loop 280 of FIG. 8 (i.e., to implement converter 285) and within the DRSS mixer 300 of FIG. 9 (i.e., to implement converter 309). The converter 335 includes a first pair of transistors 337 and 339 and a second pair of transistors 341 and 343, each transistor pair being coupled in an inverting configuration between current sourcing transistor 345 and current sinking transistor 347. Each pair of inverter-coupled transistors includes a PMOS transistor (337, 341) having a source coupled to a source terminal of current sourcing transistor 345, and a NMOS transistor (339, 343) having a drain coupled to the drain of the PMOS transistor (337, 341, respectively) and a source coupled to the drain of current sinking transistor 347. The gate terminals of transistors 337 and 339 are each coupled to signal line 336 to receive a DRSS input signal, $IN_{DRSS}$, and the gate terminals of transistors 341 and 343 are each coupled to signal line 338 to receive a complement DRSS input signal, $/IN_{DRSS}$. Each transistor pair 337/339 and 341/343 operates in the same manner, but in a complementary fashion. Thus, when the input signal 336 transitions from low to high, transistor 337 switches off and transistor 339 switches on, thereby pulling output line 340 down to a potential close to ground (i.e., ground plus the voltage drop across transistor 347). At the same time, the complement input signal 338 transitions from high to low so that transistor 343 switches off and transistor 341 switches on, thereby pulling output line 342 up to a potential close to $V_{DD}$ (i.e., $V_{DD}$ less the voltage drop across transistor 345). Due to the different operating characteristics of the PMOS and NMOS transistors within a given transistor pair (337/339 and 341/343), the pull-up and pull-down operation of the transistor pair tends to be asymmetric. Because the two transistor pairs are transitioned in response to complementary input signals, however, the loading is balanced for both rising and falling edges of the input signal, so that the rise and fall times of the output clock signal are substantially symmetrical. That is, little or no duty cycle distortion occurs in the transition from DRSS to CMOS signaling levels. Consequently, in contrast to the prior art DLL circuit described in reference to FIGS. 1–6, no duty cycle correction circuits are necessary to correct for conversion-induced duty cycle distortion, simplifying system design and removing a potential source of phase error in the final sampling clock signal.

Still referring to FIG. 12, because the input signals, $IN_{DRSS}$ and $/IN_{DRSS}$, are DRSS-level signals, the transistors within either transistor pair 337/339 and 341/343 may not be switched all the way off or all the way on, and therefore tend to draw static current. The current sourcing and current sinking transistors 345 and 347 are biased by respective bias voltages (which may be different) to limit the static current drawn by the converter circuit 335. Because the current sourcing and current sinking transistors introduce voltage offsets between full scale CMOS levels (e.g., $V_{DD}$ and GND), additional inverter stages may be coupled to the output lines 340 and 342 to increase the amplitude of the $OUT_C$ and $/OUT_C$ signals.

Dual Regulated Small Swing Reference Loop

Figure 13:
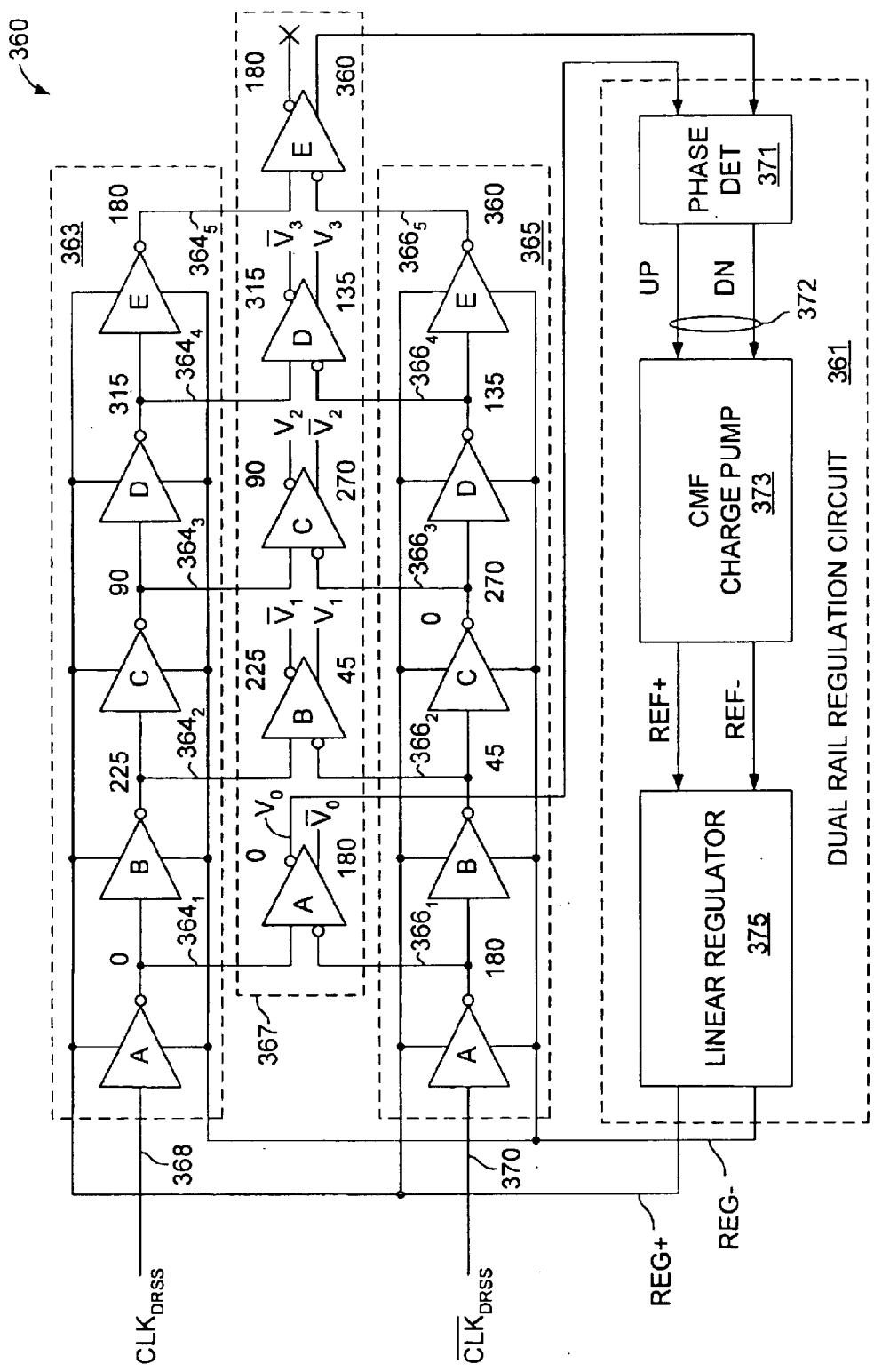
FIG. 13 illustrates a DRSS reference loop according to an embodiment of the invention.

FIG. 13 illustrates a DRSS reference loop 360 according to an embodiment of the invention. The DRSS reference loop 360 may be used, for example, to implement DRSS reference loop 251 of FIG. 7. The reference loop 360 includes a dual rail regulation circuit 361, a pair of delay lines 363 and 365, and a set of DRSS-to-CMOS converters 367. Each of the delay lines 363 and 365 is formed by a chain of delay elements (i.e., elements A–E) that receives a DRSS-level reference clock (i.e., $CLK_{DRSS}$ or $/CLK_{DRSS}$) at an input node (368 and 370, respectively) and that outputs a set of incrementally delayed phase vectors. In the embodiment of FIG. 13, each of the delay elements within delay lines 363 and 365 is an inverter that introduces an input-to-output delay (i.e., phase delay) that varies according to regulated supply voltages, REG+ and REG−, generated by the dual rail regulation circuit 361. Each of the delay lines 363 and 365 includes five such inverters, A, B, C, D and E, coupled in a daisy-chained manner. That is, the output of inverter A is coupled to the input of inverter B, the output of inverter B is coupled to the input of inverter C, the output of inverter C is coupled to the input of inverter D, and the output of inverter D is coupled to the input of inverter E. The input of the first inverter in the chain (i.e., inverter A) forms the input node of the delay line and the output of each inverter in the chain forms a respective output node of the delay line. In alternative embodiments, non-inverting amplifiers (e.g., formed by back-to-back inverters) may be used to implement each delay element. Also, there may be more or fewer delay elements per delay line than shown in FIG. 13.

The dual rail regulation circuit 361 adjusts the regulated voltages, REG+ and REG−, to achieve a desired delay through each of the delay lines. More specifically, the dual rail regulation circuit 361 adjusts the upper and lower regulated voltages, REG+ and REG−, in response to a phase difference between a selected pair of clock signals output by the delay lines 363 and 365 (and, optionally converted to CMOS signaling levels) such that the propagation delay through a subset of the delay elements within each delay line 363 and 365 is equal to half the period (i.e., 180 degrees) of the reference clock signal. In the example of FIG. 13, the subset of delay elements for which the propagation delay is controlled includes inverters B–E within each delay line 363, 365 such that, designating the output of inverter A of delay line 363 to be a zero degree phase vector, the output of inverter E of delay line 363 is a 180 degree phase vector and, similarly the output of inverter A of delay line 365 is a 180 degree phase vector and the output of inverter E of delay line 365 is a 360 degree phase vector. Because four delay elements are used to achieve the 180 degree delay within each delay line, the delay introduced by any one of the delay elements is substantially equal to $\frac{1}{8}^{th}$ the period (i.e., 45 degrees) of the reference clock signal, a time interval referred to herein as a 45 degree interval. That is, from the time an input signal to a given delay element crosses the midpoint voltage between the REG+ and REG− voltages to the time that delay element output signal crosses the midpoint voltage is substantially equal to a 45 degree interval. Accordingly, the outputs of each of the inverter elements A–E within a given delay line are offset from one another by 45 degree intervals, plus an inversion angle (i.e., 180 degrees) at the outputs of inverters B and D. By this arrangement, the outputs of each of the delay elements A–D of delay line 363 constitute 0, 225, 90 and 315 degree phase vectors ($364_1$–$364_4$), while the outputs of delay elements A–D within delay line 365 constitute 180, 45, 270 and 135 degree phase vectors ($366_1$–$366_4$). Thus, when the regulated voltages, REG+ and REG−, are adjusted to produce a half cycle delay from the output of inverter A to the output of inverter E within each delay line 363 and 365, the eight DRSS-level clock signals output by inverters A–D within each delay line (i.e., signals $364_1$–$364_4$ and $366_1$–$366_4$) constitute eight phase vectors spaced at incremental 45 degree phase offsets throughout a cycle of the reference clock signal. The set of converters 367 includes DRSS-CMOS converters A–E to convert signals $364_1$–$364_5$ and $366_1$–$366_5$ from DRSS to CMOS signaling levels. Note that while phase delay is introduced by the converter circuits (including, in an embodiment that employs the converter 335 of FIG. 12, an inversion angle of 180 degrees), the selection of the zero degree reference point is arbitrary such that the CMOS-level phase vectors output by converter A may be viewed as 0 and 180 degree phase vectors, the outputs of converter B as 45 and 225 degree phase vectors and so forth to converter E, which outputs 180 and 360 degree phase vectors. The phase vectors output by converters A–D are designated in FIG. 13 (and referred to hereinafter) as vectors $V_0$ (0 degrees), $V_1$ (45 degrees), $V_2$ (90 degrees) $V_3$ (135 degrees), $/V_0$ (180 degrees), $/V_1$ (225 degrees), $/V_2$ (270 degrees) and $/V_3$ (315 degrees).

In the embodiment of FIG. 13, the 180 degree phase vector output by converter E is unused and the 360 degree phase vector output by converter E is provided to the dual rail regulation circuit for phase comparison with the 0 degree phase vector, $V_0$. Note that in alternative embodiments, more or fewer delay elements may be interposed between the 0 and 180 degree generating delay elements within delay line 363 and between the 180 and 360 degree generating delay elements within delay line 365 such that the reference clock cycle is subdivided by more or fewer phase vectors.

The dual regulation circuit 361 includes a phase detector 371, common-mode-feedback charge pump 373 and linear regulator 375. The phase detector 371 is coupled to receive the nominally 360 degree phase vector from a converter E (a most delayed phase vector) and to receive the 0 degree phase vector, $V_0$, from converter A (a least delayed phase vector). The phase detector 371 compares the 0 and 360 degree phase vectors and generates a voltage control signal 372 according to which of the vectors leads the other. More specifically, the phase detector 371 asserts (e.g., to a logic high state) an up signal (UP) to reduce the delay through the delay lines 373 and 375 if the 360 degree phase vector lags the zero degree phase vector, and asserts a down signal (DN) to increase the delay if the 360 degree phase vector leads the zero degree phase vector. In one embodiment the phase detector 371 is a zero phase detector (ZPD) in which the 0 degree phase vector is used to sample the 360 degree phase vector and thereby generate the voltage control signal 372 according to whether the 360 degree phase vector has changed state before or after the sampling instant (i.e., before or after an edge of the 0 degree phase vector). Alternatively, the 360 degree phase vector may be used to sample the 0 degree phase vector. Also, other types of phase detectors may be used in alternative embodiments.

The up and down signal components of the voltage control signal 372 are received by the common-mode-feedback charge pump 373 and used to adjust the levels of reference voltages, REF+ and REF−. The reference voltages, REF+ and REF−, are output to the linear regulator 375 where they are used to generate the regulated voltages, REG+ and REG−. Overall, the negative feedback operation of the reference loop 360 drives the regulated voltages, REG+ and REG−, to the levels necessary to achieve phase alignment between the 360 degree and 0 degree phase vectors input to the phase detector 371. As discussed below, the common-mode-feedback charge pump 373 includes a negative-feedback bias control circuit that maintains the common mode between the REF+ and REF− voltages, and therefore the common mode between the REG+ and REG− voltages, substantially at the common mode of the system supply voltages, $V_{DD}$ and GND. That is, the regulated voltages, REG+ and REG−, generated by the dual rail regulation circuit 361 are maintained substantially centered about the CMOS common mode. In an alternative embodiment, the set of DRSS to CMOS converters 367 maybe omitted, and the 0 degree phase vector output by inverter A of delay line 363 and the 360 degree phase vector output by inverter E of delay line 365 may be input directly to the phase detector 371.

Figure 14:
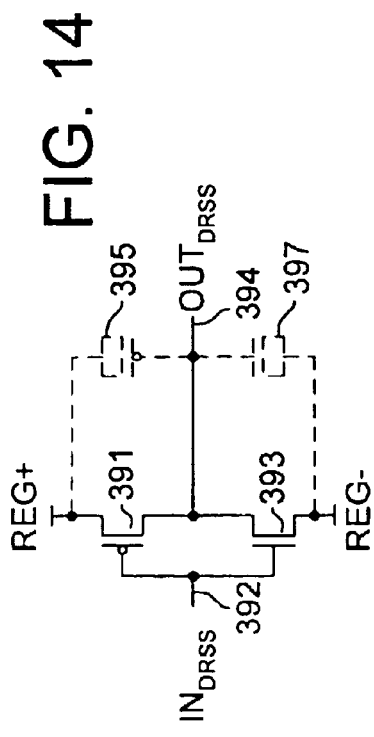
FIG. 14 illustrates a DRSS delay element according to an embodiment of the invention.

FIG. 14 illustrates a DRSS delay element 390 according to an embodiment of the invention. The DRSS delay element 390 may be used, for example, to implement inverters A–E within either of the delay lines 363, 365 of FIG. 13. As shown, the DRSS delay element 390 includes a PMOS transistor 391 and an NMOS transistor 393 coupled in an inverting configuration. That is, a source terminal of transistor 393 is coupled to the regulated voltage, REG−, and a source terminal of transistor 391 is coupled to the regulated voltage, REG+. The gate terminals of the transistors 391 and 393 are each coupled to an input line 392 to receive a DRSS-level input signal, and the drain terminals of the transistors 391 and 393 are each coupled to an output line 394 to output a delayed DRSS-level output signal.

Figure 15:
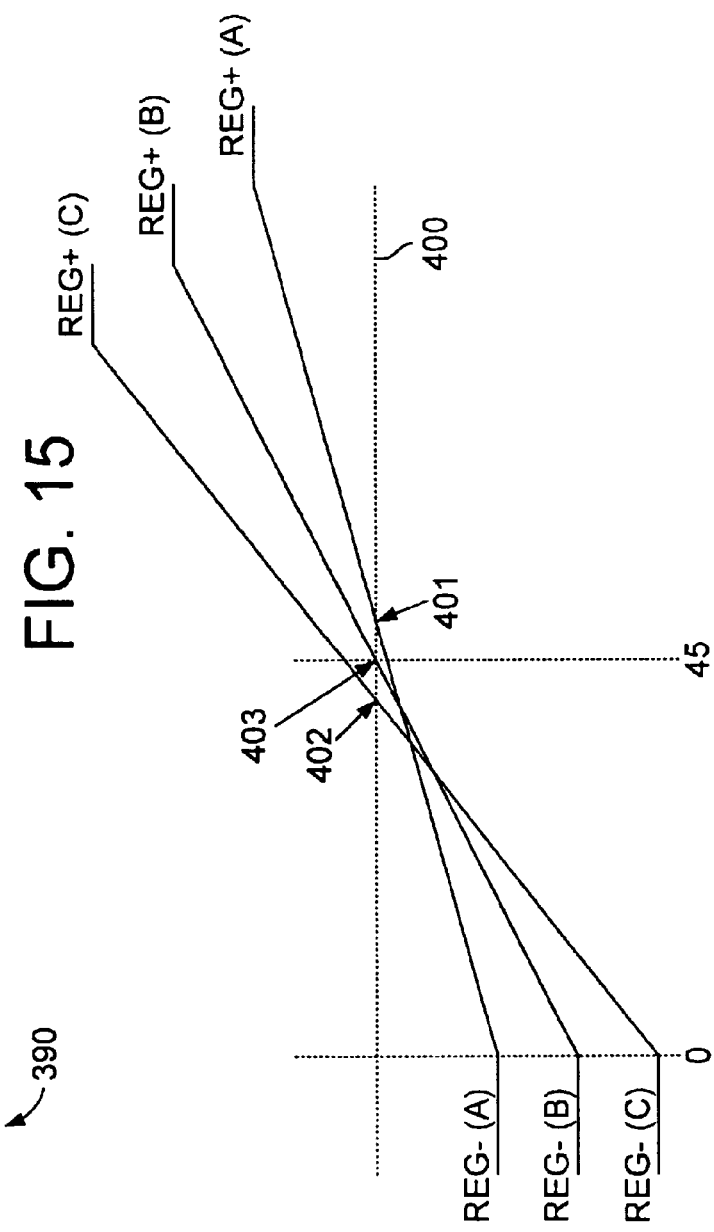
FIG. 15 illustrates output signals generated by the delay element of FIG. 14 for three different pairs of regulated voltages.

Still referring to FIG. 14, when a DRSS-level input signal transitions from low to high (i.e., from REG− to REG+), transistor 391 is switched off and transistor 393 is switched on such that the output line is pulled down from the REG+ to the REG− voltage level. Conversely, when the input signal transitions from high to low, transistor 391 is switched on and transistor 393 is switched off such that the output line is pulled up from the REG− to the REG+ voltage level. The rate at which the transistors 391 and 393 charge and discharge the output line 394 is determined, in part, by the regulated voltages REG+ and REG−. Referring to FIG. 15, for example, the slew rates of the output signal generated by delay element 390 are shown for three different pairs of regulated voltages, A, B and C. In the case of regulated voltage pair A, the difference between REG+ and REG− (i.e., the rail-to-rail potential) is relatively low, resulting in a relatively slow slew rate between low and high output levels (note that only the low to high transition is shown in FIG. 15, but that the high to low slew rate is likewise slowed by the low rail-to-rail potential). Thus, the transition from low to high when the regulated voltages are at level A occurs slowly enough that the crossing of the regulated common mode voltage 400 (i.e., midpoint between REG+ and REG− voltages) occurs late relative to the 45 degree time (as shown by arrow 401). Accordingly, the output of the next inverter in an inverter chain will begin transitioning late relative to the 45 delay point resulting in an accumulation of late transitions. Consequently, the clock delay introduced by a chain of four delay elements 390 powered by regulated voltage pair A will be greater than 180 degrees. In the case of regulated voltage pair C, the slew rate of the output signal generated by delay element 390 is fast enough that the regulated common mode voltage crossing occurs prior to the 45 degree time, as indicated by arrow 402. Accordingly, the clock delay introduced by a chain of four delay elements 390 powered by regulated voltage pair C will be less than 180 degrees. At regulated voltage pair B, the drive strength of the delay element 390 is such that the output signal crosses the regulated common mode voltage 400 coincidentally with the 45 degree time, as indicated by arrow 403. Consequently, at regulated voltage pair B, each delay element 390 introduces a 45 degree delay between input and output crossings of the regulated common mode voltage and a chain of four delay elements 390 powered by regulated voltage pair B will produce a clock delay substantially equal to 180 degrees.

Referring again to FIG. 14, the output drive strength of the delay element 390 is dependent, in part, upon the gain of the transistors 391 and 393, which may be controlled, for example, by process (e.g., doping) and/or transistor sizing (e.g., width/length ratio). In one embodiment, the gain of transistors 391 and 393 is selected such that the slowest process satisfies the maximum anticipated reference clock frequency. Other parameters may be used to specify and/or set the gains in alternative embodiments. Also, capacitive elements 395 and 397 (e.g., drain-to-source coupled PMOS transistor and drain-to-source coupled NMOS transistor) may be coupled in parallel with transistors 391 and 393 in applications where a sufficiently slow slew rate cannot conveniently be achieved by transistor sizing, process selection, etc.

Note that, in a delay line formed by a chain of delay elements 390, the desired delay between input and output transitions of any single delay element in the chain depends, in part, on the number of delay elements interposed between the 0 and 180 degree outputs. If four such delay elements are used (as in the delay lines 363 and 365 of FIG. 13), an input-to-output delay (i.e., of each delay element 390) equal to the 45 degree interval is needed to create phase alignment between the 0 degree phase vector and the 360 degree phase vector. If, for example, eight such delay elements are used instead of four, a delay of 180/8=22.5 degrees is needed to create the same phase alignment. Although 45 degree intervals are described as the desired separation between phase vectors in the remainder of the description, different degrees of phase vector separation may be used in alternative embodiments.

Referring again to FIG. 15, it should be noted that the slew rate changes exponentially in response to a change in the rail-to-rail potential. That is, as the difference between the upper and lower regulated voltages, REG+ and REG−, is increased and decreased, the slew rate of a delay element output signal increases and decreases rapidly enough that the regulated common mode voltage crossing time is advanced and delayed. Consequently, an equilibrium point may be reached at which the difference between the upper and lower regulated voltages will produce a desired midpoint crossing time. In the case of FIG. 15, in which the desired crossing time corresponds to the 45 degree interval, the equilibrium point is at voltage pair B.

Dual Regulated Small Swing Mixer

Figure 16:
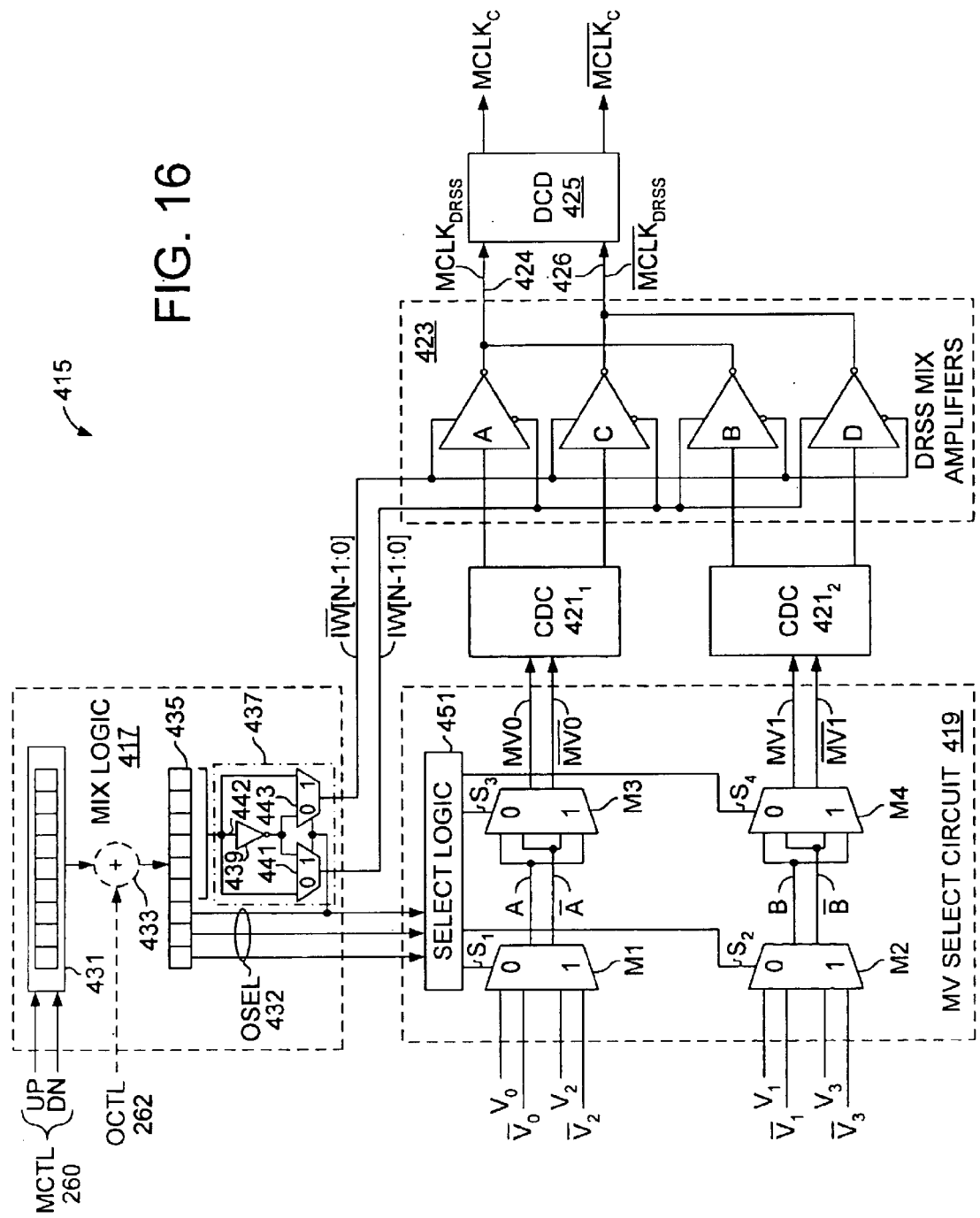
FIG. 16 illustrates a DRSS mixer according to an embodiment of the invention.

FIG. 16 illustrates a DRSS mixer 415 according to an embodiment of the invention. The DRSS mixer 415 may be used, for example, to implement either the DRSS mixer $253_1$, or the DRSS mixer $253_2$ of FIG. 7. The DRSS mixer 415 includes mix logic 417, mix vector select circuit 419, CMOS-to-DRSS converters $421_1$ and $421_2$, DRSS mix amplifiers 423, and DRSS-to-CMOS converter 425. The mix logic 417 includes a counter 431 that is incremented up or down in response to a mix control signal 260, MCTL; an optional adder circuit 433 that is used to add an offset control value 262 (OCTL) to the count value maintained within the counter 431, and a ramp polarity selector 437. In the case of the DRSS mixer $253_1$ of FIG. 7, the adder circuit 433 is omitted and no offset value is added to the count value maintained within the counter 431. By contrast, in the DRSS mixer $253_2$ of FIG. 7, the adder 433 is included to generate an offset count value by adding the offset control value 262 to the count value maintained within the counter 431. The offset count value may be stored within a register 435 (or other storage circuit) or directly output to the mix vector select circuit 419 and ramp polarity selector 437. In the embodiment of FIG. 16, the count value maintained within the counter 431 (and the offset count value, if used) is a 9-bit value in which the most significant three bits constitute an octant select signal 432 (OSEL) and the least significant six bits forms an interpolation value 442. More or fewer bits may be used to form the octant select signal 432 and/or interpolation value 442 in alternative embodiments.

The mix vector select circuit 419 receives the octant select signal 432 and includes select logic 451 and multiplexers M1, M2, M3 and M4 to select a pair of octant-bounding phase vectors and their complements from the set of eight phase vectors output from the reference loop (i.e., V0–V3 and /V0–/V3). That is, the mix vector select circuit 419 selects, according to the octant select signal 432, a pair of phase vectors (and their complements) that are offset from one another by a 45 degree interval and that therefore bound an octant within the 360 degree phase plot of a reference clock signal. The selected pairs of phase vectors are referred to herein as mix vectors, MV0 and MV1, and complement mix vectors, /MV0 and /MV1, as they are mixed by the DRSS mix amplifiers 423 to produce mix clock signals, MCLK and /MCLK.

Note that, in a system in which more or fewer than eight phase vectors are input to the mix vector select circuit 419, the number of bits maintained within counter 431 (and offset count register 435, if used) for selection of a vector pair may be greater or less than three. In general, if N phase vectors are input to the mix vector select circuit 419, $\log_2 N$ bits are needed to select a pair of mix vectors and complement mix vectors.

Still referring to FIG. 16, the select logic 451 responds to the octant select signal 432 by outputting control signals S1, S2 S3 and S4 to multiplexers M1, M2, M3 and M4, respectively. Multiplexer M1 receives phase vectors $V_0$ and $V_2$ (and complement vectors /$V_0$ and /$V_2$), while multiplexer M2 receives phase vectors $V_1$ and $V_3$ (and complement vectors /$V_1$ and /$V_3$). Depending upon the state of control signal S1, multiplexer M1 will output either phase vectors V0 and /V0 or phase vectors V2 and /V2 as vectors A and /A. Similarly, multiplexer M2 will output, according to control signal S2, either phase vectors V1 and /V1 or phase vectors V3 and /V3 as vectors B and /B. Multiplexer M3 receives vectors A and /A from multiplexer M1 and outputs, according to control signal S3, either vector A or vector /A as mix vector MV0 and, conversely, vector /A or A as complement mix vector /MV0. Similarly, multiplexer M4 receives vectors B and /B from multiplexer M2 and outputs, according to control signal S4, either vector B or vector /B as mix vector MV1 and, conversely, vector /B or B as complement mix vector /MV1. By this arrangement, any pair of octant-bounding phase vectors may be selected as mix vectors MV0 and MV1, and their complements selected as mix vectors /MV0 and /MV1.

The CMOS-to-DRSS converters $421_1$ and $421_2$ are provided to convert the signal levels of the selected mix vectors (i.e., MV0, MV1, /MV0 and /MV1) from CMOS to DRSS signal levels before the mix vectors are input to the DRSS mix amplifiers 423. As discussed above, in an embodiment in which the DRSS reference loop outputs DRSS-level phase vectors, the converters $421_1$ and $421_2$ may be omitted.

Referring again to the mix logic 417, the ramp polarity selector 437 includes an inverter 439 and a pair of multiplexers 441 and 443 to generate an N-bit interpolation word, IW, and N-bit complement interpolation word, /IW, in response to the interpolation value 442. The purpose of the ramp polarity selector 437 is to ramp the interpolation word (i.e., in response to increases in the count value) in an increasing direction for certain selected pairs of mix vectors and to ramp the interpolation word in a decreasing direction for other selected pairs of mix vectors. This operation is described in further detail below. Note that a stage of flip-flops or other synchronizing circuits may be provided to synchronize the outputs of the mix logic so that the interpolation word, IW, complement interpolation word, /IW, and octant select signal 432 all change state synchronously in response to changes in the count value (i.e., maintained within counter 431) or offset count value.

The DRSS mix amplifier block 423 includes four mix amplifiers A, B, C and D, that each receive a respective one of the mix vectors, MV0, MV1, /MV0 and /MV1, and that each receive the interpolation word, IW, and complement interpolation word, /IW. More specifically, mix amplifiers A and B receive the uncomplemented mix vectors, MV0 and MV1, respectively, while mix amplifiers C and D receive complement mix vectors, /MV0 and /MV1. Also, mix amplifiers A and C receive the interpolation word and complement interpolation word at inverting and noninverting control inputs, respectively, while mix amplifiers B and D receive the interpolation word at a noninverting control input and the complement interpolation word at an inverting control input. By this arrangement, constituent amplifier circuits within mix amplifiers A and C are enabled while the corresponding constituent amplifier circuits within mix amplifiers B and D are disabled, and vice-versa. The outputs of mix amplifiers A and B are coupled together to supply a DRSS-level mix clock signal ($MCLK_{DRSS}$) to converter 425, and the outputs of mix amplifiers C and D are similarly coupled together to supply a DRSS-level complement mix clock signal (/$MCLK_{DRSS}$) to converter 425. Thus, mix amplifiers A and B each output a respective mix vector onto a first output line 424, and mix amplifiers C and D each output a respective complement mix vector onto a second output line 426. Converter 425 converts the DRSS-level mix clock signal and complement clock signal to CMOS-level mix clock signals, $MCLK_C$ and /$MCLK_C$.

The interpolation word, IW, and complement interpolation word, /IW, generated by the mix logic are used to control the relative drive strengths of the mix amplifiers A, B, C and D such that the resultant mix clock signals have phase offsets that fall within the range of phase angles bounded by the input mix vectors. As the interpolation word, IW, is incremented (and the complement interpolation word, /IW, correspondingly decremented), the phase angle of the mix clock signal is progressively stepped away from the leading mix vector and toward the trailing mix vector (i.e., mix clock signal is incrementally delayed). Conversely, as the interpolation word is decremented (and the complement interpolation word correspondingly incremented), the phase angle of the mix clock signal is progressively stepped away from the trailing mix vector and toward the leading mix vector (i.e., the mix clock signal is incrementally advanced). For example, in the case of a six bit interpolation word that is used to control the mixing of vectors $V_0$ (selected to be mix vector MV0) and $V_1$(selected to be mix vector MV1), the interpolation word might initially be 0 such that the complement interpolation word is at a maximum value, thereby causing vector $V_0$ to be driven onto the $MCLK_{DRSS}$ output line by mix amplifier A at maximum drive strength and mix amplifier B to be disabled (i.e., a zero drive strength used to drive vector $V_1$ onto the $MCLK_{DRSS}$ output line). As the interpolation word, IW, is incremented (and the complement interpolation word, /IW, decremented), the drive strength of mix amplifier A is decreased and the drive strength of mix amplifier B is increased to adjust the phase of the resultant mix clock signal, $MCLK_{DRSS}$, away from vector $V_0$ and toward vector $V_1$. Eventually, when the interpolation word reaches a maximum value, the complement interpolation word applied to mix amplifier A will be 0 and a full drive strength (i.e., due to the maximum value interpolation word, IW) will be enabled within mix amplifier B. As a result, vector $V_1$ will be output as the mix clock signal, $MCLK_{DRSS}$ with zero contribution from vector $V_0$. If the count value within the mix logic is incremented further, the interpolation value will roll from a maximum value to a minimum value and the octant select value will be incremented to select a different pair of mix vectors. In the case of an increment beyond the $V_0/V_1$-bounded octant, vector $V_2$ will be selected by multiplexer M1 instead of vector $V_0$ such that mixing will now take place between vectors $V_2$ and $V_1$. The least significant bit of the octant select signal is applied to the multiplexers 441 and 443 within the ramp polarity selector 437 to cause the interpolation word, IW, to be decremented from a maximum value to a minimum value and the complement interpolation word, /IW, to be incremented from a minimum value to a maximum value.

FIG. 17 is a table that illustrates an exemplary relationship between the octant select signal 432, control signals S1 through S4, mix vectors MV0, MV1, /MV0 and /MV1, and the ramp polarity of the interpolation word, IW, and complement interpolation word, /IW. Starting with the first row of the table, when the octant select signal 432 is 0 (i.e., 000b), select signals S1–S4 are driven low (e.g., logic 0) resulting in selection of the '0' input port in multiplexers M1 and M2 and M3 and M4 of FIG. 16. Accordingly, multiplexer M1 passes vectors $V_0$ and $/V_0$ to the A and /A inputs of multiplexer M3 which, in turn, outputs vector A as mix vector MV0 and /A as mix vector /MV0. Similarly, multiplexer M2 outputs vector $V_1$ and $/V_1$ as vector B and /B, respectively, and multiplexer M4 outputs vector B and /B as mix vectors MV1 and /MV1, respectively. Thus, when the octant select signal 432 is 000, phase vectors $V_0$ and $V_1$ are selected to be mix vectors MV0 and /MV0, respectively, and phase vectors $/V_0$ and $/V_1$ are selected to be mix vectors MV1 and /MV1. Also because the least significant bit of the octant select signal 432 is 0, the ramp polarity of the interpolation word is positive; ramping from 0 to a maximum value ($2^N-1$). Accordingly, mix amplifier B will initially receive a zero weight while mix amplifier A receives a maximum weight, causing the phase delay of the mix clock to be increased (i.e., stepped from vector $V_0$ toward vector $V_1$) in response to an increase in the count value within the mix logic. When the octant select signal 432 is incremented from 000 to 001, select signal S1 goes high to select vectors $V_2$ and $/V_2$ instead of vectors $V_0$ and $/V_0$. Consequently, mix amplifiers A and B will now mix vectors $V_1$ and $V_2$ and mix amplifiers C and D will mix vectors $/V_1$ and $/V_2$. Because the least significant bit of the octant select signal 432 is now a '1', multiplexers 441 and 443 within the ramp polarity selector will select a complemented version of the interpolation value 442 to be the interpolation word, IW, and an uncomplemented version of the interpolation value 442 to be the complement interpolation word, /IW. Thus, even though the interpolation word value has rolled over from a maximum value to zero in response to incrementing the count value within the mix logic, a maximum weight is still applied to inverter B and a minimum weight is applied to inverter A. As a result, mix amplifier B initially drives vector $V_1$ onto the mix clock signal output line at full strength, while mix amplifier A is disabled. As the interpolation value 442 is incremented, the weight applied to mix amplifier B is decreased (ramp polarity of IW is negative) and the weight applied to mix amplifier A is increased (ramp polarity of /IW is positive) such that the interpolation between vectors $V_1$ and $V_2$ is stepped toward vector $V_2$ and away from vector $V_1$. Referring to the table of FIG. 17 it can be seen that each of the different octant select values 000 through 111 (0 through 7, decimal) selects an incrementally different pair of phase vectors that bound an incrementally different octant within an overall cycle of a reference clock signal. Thus, vectors $V_0$ and $V_1$ are initially selected, vectors $V_1$ and $V_2$ are selected thereafter, then vectors $V_2$ and $V_3$, then vectors $V_3$ and $/V_0$ and so forth ultimately to vectors $/V_3$ and $V_0$. The foregoing assumes an incremented count value within the mix logic 417. If the count value is decremented, the octants are traversed in the opposite direction. Also, the interpolation word, IW, is alternately ramped up from 0 to a maximum value and then back down from the maximum value to zero with each transition of the least significant bit of the octant select signal 432. The ramp polarity of the complement interpolation word, /IW, is opposite that of the interpolation word, IW, and therefore is similarly alternated between positive and negative ramp polarities with each toggling of the least significant bit of the octant select signal 432.

FIG. 18 illustrates an embodiment of a multiplexer 461 that may be used to implement any of multiplexers M1–M4 of FIG. 16. The multiplexer 461 includes four tri-state inverter circuits A, B, C and D, each of which receives a corresponding input vector, $V_A$, $V_B$, $V_C$ and $V_D$. The outputs of inverters A and C are coupled to an output line 462 to output either vector $V_A$ or vector $V_C$ as output vector $V_{OUT1}$. The output of inverters B and D are similarly coupled to an output line 464 to output either vector $V_B$ or vector $V_D$ as output vector $V_{OUT2}$. Inverters A and C are enabled by a logic low select signal 463 (S), and logic high complement select signal 465 (/S), and inverters B and D are alternately enabled when the select signal 463 is high and the complement select signal 465 is low. Accordingly, when select signal 463 is low and complement select signal 465 is high, inverters A and B are enabled, and inverters C and D are disabled. Consequently, input vector $V_A$ is output as vector $V_{OUT1}$, and input vector $V_B$ is output as vector $V_{OUT2}$. Conversely, when select signal 463 is high and complement select signal 465 is low, inverters A and B are disabled and inverters C and D are enabled so that input vector $V_C$ is output as vector $V_{OUT1}$ and input vector $V_D$ is output as vector $V_{OUT2}$. Note that while the multiplexers M1–M4 of FIG. 16 are depicted as having single ended control signals, S1–S4, respectively, complementary control signals may alternatively be used as in multiplexer 461.

FIG. 19 illustrates a DRSS mix amplifier 471 according to an embodiment of the invention. The DRSS mix amplifier 471 may be used, for example, to implement mix amplifiers A–D within circuit block 423 of FIG. 16. The mix amplifier 471 includes N tri-state inverters each having a binary weighted drive strength ranging from 1 to $2^{N-1}$ in multiples of 2 (i.e., drive strength=1, 2, 4, 8, ... $2^{N-1}$). The value of N corresponds to the number of bits in the interpolation word (and complement interpolation word) and is 6 in the exemplary embodiment of FIG. 19. Accordingly, the tri-state inverters are designated x1, x2, x4, x8, x16 and x32 in FIG. 19 to indicate their relative drive strengths. In one embodiment, the different drive strengths of the inverters are achieved by using different width transistors within each inverter. For example, if the constituent transistors of the x1 inverter have widths, W, the transistors of the x2 inverter have widths, 2W, the transistors of the x4 inverter have widths, 4W, and so forth. In alternative embodiments, other transistor characteristics (including a combination of characteristics) may be changed to achieve the binary weighted drive strengths.

Each of the tri-state inverters within the mix amplifier 471 is enabled by respective bit of the interpolation word, IW, and complement interpolation word, /IW. For example, if bit 0 of the interpolation word (i.e., IW0) is high and its complement (/IW0) is low, the x1 inverter will be enabled to drive the input mix vector, MV, onto the output signal line 472. Note that the interpolation word and complement interpolation word connections shown in FIG. 19 correspond to the connections for mix amplifiers B and D of FIG. 16 and are reversed for mix amplifiers A and C. The x2 inverter is similarly enabled by IW1 and /IW1, the x4 inverter by IW2 and /IW2, the x8 inverter by IW3 and /IW3, the x16 inverter by IW4 and /IW4, and the x32 inverter by IW5 and /IW5. By this arrangement, as the interpolation word is incremented (and the complement decremented), the x1, x2, x4, x8, x16 and x32 inverters are turned on in a binary pattern to produce a total mix amplifier drive strength that ranges from zero to 63 in steps equal to the strength of the x1 inverter.

The tri-state inverters within the DRSS mix amplifier 471 are powered by the regulated supply voltages, REG+ and REG−, generated by the dual rail regulation circuit within the DRSS reference loop. Consequently, by sizing the tri-state inverters such that the full scale drive strength of the mix amplifier 471 is equal (or substantially equal) to the drive strength of a delay element within the DRSS reference loop (i.e., one of the delay elements A–E within delay lines 363 and 365 of FIG. 13), the full-scale slew rate of the mix amplifier 471 may be aligned with the slew rate of the reference loop delay element. For example, by establishing the drive strength of the x32 inverter (e.g., by transistor width selection) to be half the drive strength of a 45 degree delay element within the DRSS reference loop, then the full scale drive strength of the mix amplifier 471 will be substantially equal to the drive strength of the 45 degree delay element (i.e., x32+x16+x8+x4+x2+x1=x63≅2 times x32), and the full scale mix amplifier output will cross the regulated common mode voltage at the 45 degree interval. Thus, as shown in FIG. 20, a leading mix vector 478 and trailing mix vector 480 may be incrementally stepped through their respective interpolation weights with the weight applied to the mix amplifier for the leading vector 478 incrementally decreased and the complement weight applied to the mix amplifier of the trailing vector 480 incrementally increased such that the output drive strength of the leading vector is incrementally decreased and the output drive strength of the trailing vector is incrementally increased. The result is a progression of phase steps from the leading vector 478 to the trailing vector 480. Because of the drive strength correspondence between the mix amplifiers and reference loop delay elements, when the full interpolation weight is initially on the leading vector 478 (with zero weight applied to the trailing vector), the resultant mix clock corresponds to the leading vector 478 and the regulated common mode voltage crossing occurs 45 degrees after the leading vector 478 begins to transition. With each increment of the interpolation word, IW (and corresponding decrement of the complement interpolation word, /IW), the drive strength of the leading vector 478 is decreased, causing the slope of the leading vector to fall incrementally such that when the 45 degree time is reached, the mix clock output has not yet reached the regulated common mode voltage. At the 45 degree time, the trailing vector 480 begins to contribute to the output mix vector, thereby increasing the drive strength to that of a full strength inverter. Consequently, a substantially linear phase step is achieved with each increment of the interpolation weight. Ultimately, the interpolation weight applied to the leading vector 478 is decremented to zero, so that no ramping of the mix clock occurs until the 45 degree time when the trailing vector 480 begins to transition. Thus, mixing occurs in a substantially linear manner between leading and trailing vectors.

Phase Jumping

Because the DRSS mixer described in reference to FIGS. 16–18 exhibits relatively fast settling time between phase steps (i.e., as compared to DAC output to high impedance load described in reference to FIG. 3), a number of applications which require rapid, relatively large, phase changes become possible. For example, in an application in which the DRSS mixer is used to generate a transmit clock (i.e., to time transmission of signals), it may be desirable to select a different phase offset between the transmit clock and a reference clock signal according to a data (and clock) propagation distance. More specifically, a respective offset control value (OCTL) may be established for each recipient device in a signaling system and selected (e.g., from a lookup table or other memory) by a transmitting device according to which recipient device is the intended recipient of an outgoing transmission. Because the transmitting device may need to transmit to one or more different recipient devices in rapid succession, delay in generating transmit clock signals having the desired phase offsets would present a substantial bottleneck in such a system. Using the DRSS mixer of FIG. 16, a sequence of transmit clocks having different phase offsets may be rapidly generated by changing the offset control value 262 (OCTL). This type of operation is referred to herein as destination-based phase jumping. While some settling time in the resultant mix clock signal is still necessary, the settling time is, in general, substantially shorter than in the prior art mixer described above.

Embodiments of the present invention may also be used to achieve a rapid succession of different phase alignments of a sampling clock signal, with each different phase alignment corresponding to a respective transmission source within a signaling system. For example, in a master/slave system in which slave transmissions to a master device occur deterministically in response to master device commands or requests (i.e., when the master device issues a command or request, the master device may anticipate a responsive transmission from the slave a predetermined time later), the master device may select a previously determined sampling clock offset according to which slave device is scheduled to transmit at a given time. Such operation is referred to herein as source-based phase jumping and may be implemented within a master device, for example, by storing a respective offset control value (OCTL) for each slave device in a signaling system and selecting (e.g., from a lookup table or other memory) different ones of the stored offset controlled values according to the identities of the slave devices scheduled to transmit. More generally, source-based phase jumping may be used in any device that has or receives forehand information of transmission sources. Such forehand information may result from system determinism (i.e., predetermined response times to system events such as commands, requests, interrupts, timing signals, etc.) or from other communications including, without limitation, communications via out-of-band signaling channels (e.g., handshaking signals).

Both destination and source-based phase jumping may be implemented within the same integrated circuit device (e.g., one or more master devices within a master/slave system) and a shared memory structure used to store offset control values for the various transmission destinations and sources. Offset control values may be determined, for example, by transmission of predetermined test patterns between system devices to learn the leading and lagging phase boundaries beyond which transmission errors are detected. Methods and apparatuses for performing such timing calibration operations are disclosed, along with other locked-loop applications in which embodiments of the present invention may be used, in U.S. patent application Ser. No. 09/421,073, filed Oct. 19, 1999 (entitled "Bus System Optimization"), and U.S. Pat. No. 6,321,282, each of which is hereby incorporated by reference in its entirety.

Embodiments of the present invention may also be applied to achieve destination and/or source-based phase jumping in signaling systems in which integrated circuit devices (or components within an integrated circuit device) are clocked by different clock signals having nominally the same frequency, but arbitrary phase relationships. In such a system, the phase offsets between various transmit and sampling clock signals used to time signal transmission and reception may be systematically determined and used to generate offset control values. The offset control values may then be dynamically retrieved (e.g., from a lookup table or other memory) to time data reception and/or transmission operations in one or more of the integrated circuits according to the source or destination of the data transmission. In one such system, for example, a memory controller mounted to a motherboard (or other substrate) is coupled to multiple memory modules (i.e., daughterboards or other substrates having one or more integrated circuit memory devices mounted thereon) via a common signaling path, the memory modules being clocked by respective clock signals having nominally the same frequency, but arbitrary phase relationships. The memory controller may receive any or all of the clock signals provided to the memory modules, and/or a separate clock signal. In one embodiment, the memory controller includes a DLL circuit or PLL circuit according to the present invention to achieve rapid, source and/or destination-based phase jumping.

The phase jumping capability of the DRSS mixer of FIG. 16 may also be applied in phase locking operations performed upon device power up or exit from a reduced power state. In phase locking operations, the phase of a sampling clock signal and/or transmit clock signal generated by a locked loop circuit (i.e., DLL or PLL) is incrementally rotated through a cycle (or part of a cycle) of a reference clock signal until a desired phase offset is reached. The phase jumping operation of the DRSS mixer may be used to jump between different phases in search of the desired phase offset, for example, in a binary search in which the search range is repeatedly halved to converge on the desired phase offset. Alternatively, a combination of binary and linear searching techniques may be used, for example, by using a binary search to reduce the search range to a predetermined phase range, then stepping through the predetermined phase range in linear increments until a desired phase offset is reached. In general, any searching technique in which it is desirable to rapidly switch between different phase offsets may potentially benefit from the short settling time of the DRSS mixer of FIG. 16.

Avoiding Transient Phase Errors Due to Mix Amplifier Switching

Referring to FIG. 19, incrementally increasing the drive strength of the mix amplifier 471 will, in some instances, involve enabling one tri-state inverter while simultaneously disabling others. For example, to increment the drive strength of the mix amplifier from a x31 to a x32 drive strength, the x32 inverter is enabled, while the x1, x2, x4, x8 and x16 inverters are all disabled. Because the enabling of the x32 inverter may not happen at precisely the same instant as the disabling of the lower strength inverters, the drive strength of the mix amplifier may, for a brief interval, be erroneously high or low. As shown in FIG. 21, for example, if the x32 inverter is enabled faster than the other inverters are disabled, a transient, high spiking drive strength will occur, producing a transient phase error.

In one embodiment of the invention the most significant bits of the interpolation value 442 of FIG. 16 are thermometer coded so that none of the most significant bits are simultaneously turned on and off. Referring to FIG. 22, for example, the three most significant bits of a 6-bit interpolation value 442 (i.e., bits B3, B4 and B5) are input to a decoder circuit 491 which generates decoded bits, $B5_A$–$B5_D$, $B4_A$, $B4_B$ and $B3_A$, that correspond to eight possible values represented by the most significant three bits of the interpolation word. FIG. 23 is a table that illustrates an exemplary decoding of the most significant three bits of the interpolation value 442 and FIG. 24 illustrates a mix amplifier 500, according to an alternative embodiment of the invention, that responds to the decoded interpolation value after it is passed through the ramp polarity selector 437 to generate a interpolation word, IW, and complement interpolation word, /IW (note that the interpolation word and complement interpolation word connections are opposite those shown in FIG. 24 for mix amplifiers A and C of FIG. 16). In the mix amplifier 500, the x32 inverter has been replaced by four x8 inverters each of which is enabled by a respective one of bits $IW5_A$ through $IW5_D$ of the interpolation word, IW (and by bits $/IW5_A$ through $/IW5_D$ of the complement interpolation word, /IW). Similarly, the x16 inverter has been replaced by two x8 inverters that are enabled by respective bits $IW4_A$ and $IW4_B$ of the interpolation word, IW (and complement bits $/IW4_A$ and $/IW4_B$). Bits B3, B4 and B5 of the interpolation value 442 effectively indicate the number of x8 inverters within mix amplifier 500 to be enabled. For example, when B3–B5 are all 0, all the x8 inverters are disabled (i.e., tri-stated). When B3 is high, decoded control bit $IW3_A$ goes high (and the complement bit, $/IW3_A$, low), to enable the corresponding x8 inverter, 503. All the other x8 inverters remain disabled. When bit B4 goes high (indicating that a x16 drive strength is needed), an additional x8 inverter $504_A$ is enabled by decoded control bit $IW4_A$ and its complement. Note that in the mix amplifier of FIG. 18, the x16 inverter is enabled and the x8 inverter disabled simultaneously to achieve a x16 drive strength. Thus, the race between the x16 enable and x8 disable in the mix amplifier of FIG. 18 is avoided in the mix amplifier of FIG. 24, as the x8 inverter 503 remains enabled while an additional x8 inverter $504_A$ is enabled to achieve the x16 drive strength. When bits B3 and B4 of the interpolation value 442 are both high (indicating a total drive strength of x24), another x8 inverter $504_B$ is enabled by decoded control bits IW4B, so that three x8 inverters are enabled to achieve the x24 drive strength. The x8 inverters 503, $504_A$, $504_B$, $505_A$, $505_B$, $505_C$ and $505_D$ are incrementally turned on in this manner to produce a drive strength that ranges from 0times x8 (B3–B5=000) to eight times x8 (B3–B5=111). Referring to the table of FIG. 23, it can be seen that only one decoded control bit changes state at a time, and therefore only one x8 inverter is enabled or disabled at a time, as the drive strength is incremented through the different states of the B3–B5 signals. By this arrangement, race conditions between on and off transitions of high drive strength inverters may be avoided, thereby reducing the likelihood and severity of transient phase errors. In alternative embodiments, more or less decoding may be provided such that there are more or fewer constituents inverters within the mix amplifier 500 of FIG. 24. For example, more or fewer of the most significant bits of the interpolation value 442 may be decoded to generate a set of interpolation control signals.

Charge Pump with Common Mode Feedback

Figure 25:
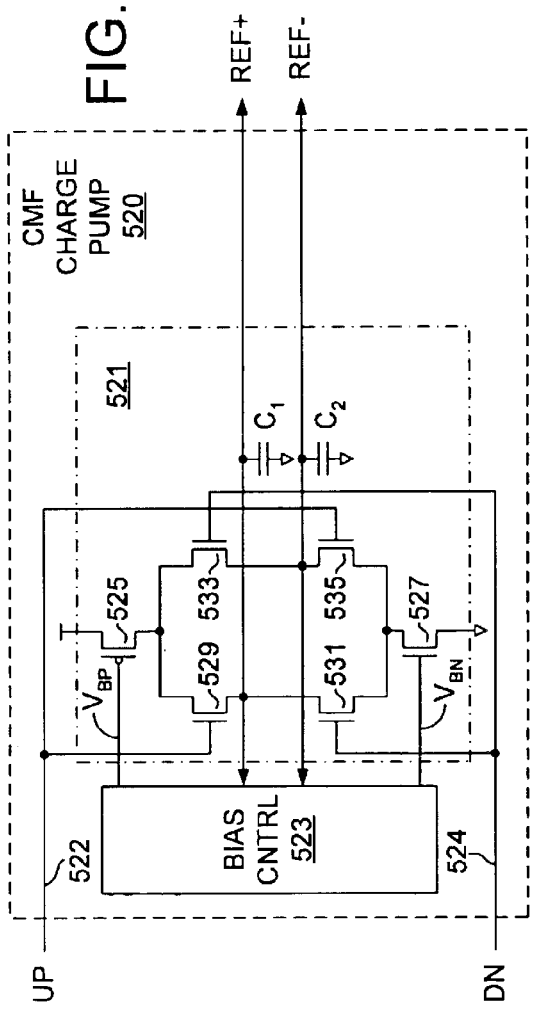
FIG. 25 illustrates a common-mode-feedback charge pump according to an embodiment of the invention.

FIG. 25 illustrates a common-mode-feedback (CMF) charge pump 520 according to an embodiment of the invention. The charge pump 520 may be used, for example, to implement charge pump 373 within the dual rail regulation circuit 361 of FIG. 13. The charge pump 520 includes a charging circuit 521 and a bias control circuit 523. The charging circuit 521 includes current sourcing transistor 525 and current sinking transistor 527, capacitive elements $C_1$ and $C_2$, and switching transistors 529, 531, 533 and 535. Switching transistors 529 and 533 are coupled between the current sourcing transistor 525 and capacitive elements, $C_1$ and $C_2$, respectively, while switching transistors 531 and 535 are coupled between the current sinking transistor 527 and the capacitive elements, $C_1$ and $C_2$, respectively. Also, gate terminals of switching transistors 529 and 535 are coupled to a first signal line 522 to receive a first component signal of a voltage control signal (i.e., up signal, UP), and gate terminals of switching transistors 531 and 533 are coupled to a second signal line 524 to receive a second component signal of the voltage control signal (i.e., down signal, DN). By this arrangement, when the up signal is high, indicating that the potential between reference voltages, REF+ and REF−, is to be increased, transistor 529 is switched on to couple capacitive element $C_1$ to the current sourcing transistor 525, and transistor 535 is switched on to couple capacitive element $C_2$ to the current sinking transistor 527. Because the down signal is deasserted (i.e., low), transistors 531 and 533 are switched off. Consequently, capacitive element $C_1$ is charged to a higher potential by the current sourcing transistor 525, and capacitive element $C_2$ is discharged to a lower potential by the current sinking transistor 527. That is, REF+ is increased and REF− is decreased when the up signal is asserted on line 522. Conversely, when the down signal is asserted on line 524 (and the up signal deasserted), transistors 531 and 533 are switched on to discharge the capacitive element $C_1$ via the current sinking transistor 527 and to charge the capacitive element $C_2$ via the current sourcing transistor 525 (transistors 529 and 535 are switched off by the deasserted up signal), thereby decreasing REF+ and increasing REF−. Referring to FIG. 13, because the regulated voltages, REG+ and REG−, track the reference voltages REF+ and REF−, the assertion of the up and down signals by phase detector 371 increases and decreases, respectively, the rail-to-rail regulated voltage output by the dual rail regulation circuit 361. Because an increased rail-to-rail regulated voltage shortens the delay through the delay lines 363 and 365 of the reference loop 360, assertion of the up signal produces a phase advance in the output of the nominally 360 degree phase vector, reducing the phase lag which resulted assertion of the up signal by the phase detector 371. Conversely, a decreased rail-to-rail regulated voltage increases the delay through the delay lines 363 and 365 of the reference loop 360, so that assertion of the down signal retards the phase of the 360 degree clock cycle, reducing the phase lead which resulted in assertion of the down signal by the phase detector 371. Thus, the overall operation of the common mode feedback charge pump in response to the up and down signals from the phase detector 371 is a negative feedback operation in which the delay through the delay elements within the reference loop is increased if the 360 degree phase vector leads the 0 degree phase vector and decreased if the 360 degree phase vector lags the 0 degree phase vector.

Referring again to FIG. 25, the bias control circuit 523 is coupled to the capacitive elements $C_1$ and $C_2$ to receive the reference voltages REF+ and REF−, respectively, and outputs a bias voltage $V_{BP}$ to the current sourcing transistor 525 and a bias voltage $V_{BN}$ to the current sinking transistor 527. The bias control circuit 523 adjusts the bias voltages $V_{BP}$ and $V_{BN}$ as necessary to maintain the common mode of the REF+ and REF− signals (i.e., the regulated common mode voltage) substantially equal to the CMOS common mode voltage. That is, the bias control circuit 523 biases the current sinking and current sourcing transistors 527 and 525 to ensure that the peak-to-peak swing of DRSS-level signals is symmetric with respect to the signal swing of CMOS-level signals.

Figure 26:
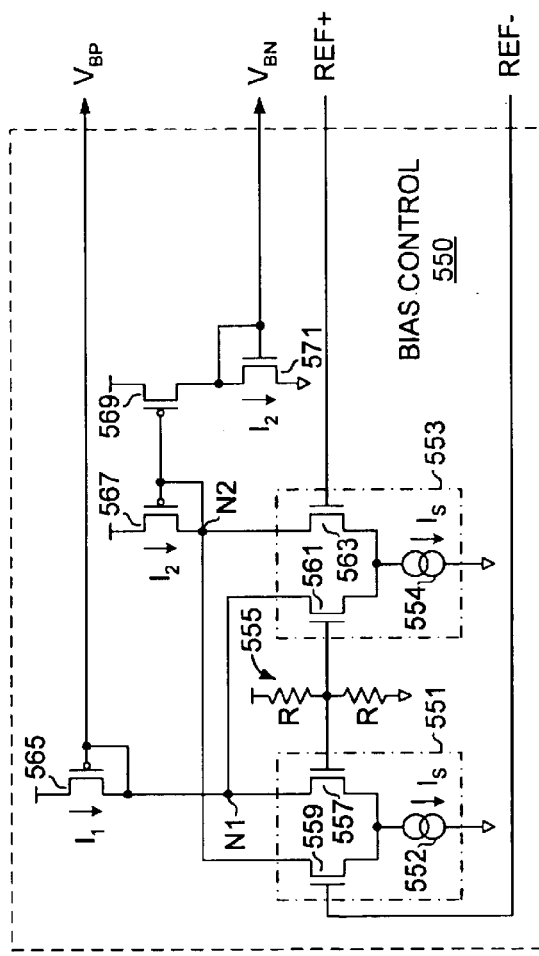
FIG. 26 illustrates a bias control circuit according to an embodiment of the invention.

FIG. 26 illustrates a bias control circuit 550 according to an embodiment of the invention. The bias control circuit 550 may be used, for example, to implement the bias control circuit 523 of FIG. 25. The bias control circuit 550 includes a pair of differential amplifiers 551 and 553 each biased by a respective current source 552 and 554 which draws current, $I_S$. A resistor divider circuit 555 is coupled between $V_{DD}$ and ground to generate a CMOS common mode reference signal (e.g., $V_{DD}/2$) which is applied to the gate terminal of a transistor within each differential amplifier 551 and 553 (i.e., to the gate terminals of transistors 557 and 561). Also, the upper and lower reference voltages, REF+ and REF−, are coupled to the gate terminals of transistors 563 and 559, respectively, of each of the differential amplifiers 553 and 551. The drain terminal of transistor 557, designated node N1 in FIG. 26, is coupled to the drain terminal of diode-configured transistor 565 and to the drain terminal of transistor 561. The drain terminal of transistor 563, designated node N2 in FIG. 26, is coupled to the drain terminal of diode-configured transistor 567 and also to the drain terminal of transistor 559. Current $I_1$ flows through diode-configured transistor 565 according to the transconductance of the differential amplifier 551 and the difference between the REF− voltage and the CMOS common mode reference voltage. Because diode-configured transistor 565 is coupled in a current mirror configuration with the current sourcing transistor 525 of FIG. 25, the bias voltage developed at the gate of transistor 565 (i.e., voltage $V_{BP}$) will appear at the gate terminal of the current sourcing transistor 525 such that the current sourcing transistor 525 delivers charging current $I_1$ to either capacitive element $C_1$ or $C_2$ according to whether the up signal or the down signal is asserted. Current $I_2$ flows through diode-configured transistor 567 according to the transconductance of the differential amplifier 553 and the difference between the REF+ voltage and the CMOS common mode reference voltage. Transistor 567 is coupled in a current mirror configuration with transistor 569 which itself is coupled, at a drain terminal, to diode-configured transistor 571. Accordingly, current $I_2$ also flows through transistors 569 and 571, thereby developing voltage $V_{BN}$ at the gate terminal of transistor 571. Because transistor 571 is coupled in a current mirror configuration with current sinking transistor 527 of FIG. 25, bias voltage $V_{BN}$ is applied to the gate of transistor 527, thereby causing transistor 527 to draw current $I_2$ from either capacitive element $C_1$ or $C_2$ according to whether the up signal or the down signal is asserted. Current $I_2$ may be expressed as a function of the transconductance of the differential amplifiers (G), the bias currents ($I_S$) and the differential inputs as follows:

$$I_2 = [I_S/2 + G(REF^+ - V_{DD}/2)] + [I_S/2 + G(REF^- - V_{DD}/2)]$$
$$= I_S + G((REF^+ + REF^-) - 2V_{DD}/2)$$
$$= I_S + 2G(REF_{CM} - V_{DD}/2),$$

where $$REF_{CM} = (REF^+ + REF^-)/2$$

Current $I_1$ may similarly be expressed as a function of differential amplifier gains, bias currents and differential inputs as follows:

$$I_1 = [I_S/2 + G(V_{DD}/2 - REF^+)] + [I_S/2 + G(V_{DD}/2 - REF^-)]$$
$$= I_S + G(2V_{DD}/2 - (REF^+ + REF^-))$$
$$= I_S + 2G(V_{DD}/2 - REF_{CM})$$

Thus, currents $I_1$ and $I_2$ are each dependent on the difference between the CMOS common mode voltage, $V_{DD}/2$, and the regulated common mode voltage, $REF_{CM}$. Also, referring to FIG. 25, the regulated common mode voltage is determined by the time averaged difference between the current delivered by current sourcing transistor 525 (i.e., $I_1$) and the current drawn by current sinking transistor 527 (i.e., $I_2$). If $I_1$ is greater than $I_2$, the regulated common mode voltage will increase, thereby producing negative feedback to reduce $I_1$ and increase $I_2$. Conversely, if $I_2$ is greater than $I_1$, the regulated common mode will decrease, thereby producing negative feedback to reduce $I_2$ and increase $I_1$. The overall effect of the negative feedback within the bias control circuit 550 is to stabilize $I_1$ and $I_2$ at equal values when the regulated common mode voltage, $REF_{CM}$, is equal (or substantially equal) to the CMOS common mode voltage, $V_{DD}/2$.

Linear Regulator

Figure 27:
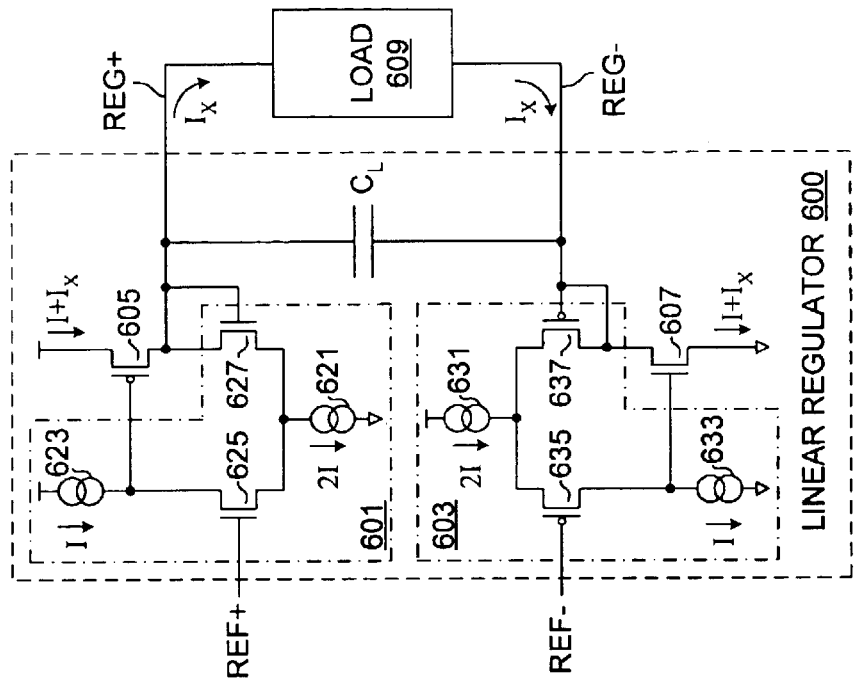
FIG. 27 illustrates a linear regulator according to an embodiment of the invention.

FIG. 27 illustrates a linear regulator 600 according to an embodiment of the invention. The linear regulator 600 may be used, for example, to implement the linear regulator 375 of FIG. 13. The linear regulator 600 includes a pair of differential amplifiers 601 and 603, each coupled in a follower configuration to respective bias voltages, $V_{B1}$ and $V_{B2}$. Bias voltage $V_{B1}$ is applied to a gate terminal of current sourcing transistor 605 and bias voltage $V_{B2}$ is applied to a gate terminal of current sinking transistor 607 to generate regulated voltages, REG+ and REG−, that are substantially equal to the REF+ and REF− voltages generated by the common mode feedback charge pump. The regulated voltages, REG+ and REG−, are applied to a load circuit 609 that includes, for example the delay elements that form the delay lines within the DRSS reference loop, and the mix amplifiers within the DRSS mixers. That is, the follower configuration of the amplifiers 601 and 609 will drive the gate voltages of transistors 605 and 607 to provide current to the load 609 as necessary to maintain equality between the regulated voltages, REG+ and REG−, and the reference voltages, REF+ and REF−, respectively. A noninverting terminal of amplifier 601 is coupled to receive the reference voltage, REF+, and an inverting terminal of the amplifier 601 is coupled to the REG+ output line 602. The output of the amplifier 601 is coupled to the gate terminal of current sourcing transistor 605. Similarly, differential amplifier 603 includes a noninverting terminal coupled to receive the REF− voltage and an inverting terminal coupled to the REG− output line 604. The output of the amplifier 603 is coupled to the gate terminal of the current sinking transistor 607. Each of the current sourcing and current sinking transistors 605 and 607 has some parasitic capacitance, depicted in FIG. 27 as capacitive elements $C_{P1}$ and $C_{P2}$. A capacitive element, $C_L$, is coupled in parallel with the load 609 to absorb transient spikes in the regulated voltages, REG+ and REG−. In one embodiment, $C_L$ is chosen to have significantly higher capacitance than parasitic capacitances $C_{P1}$ and $C_{P2}$.

Figure 28:
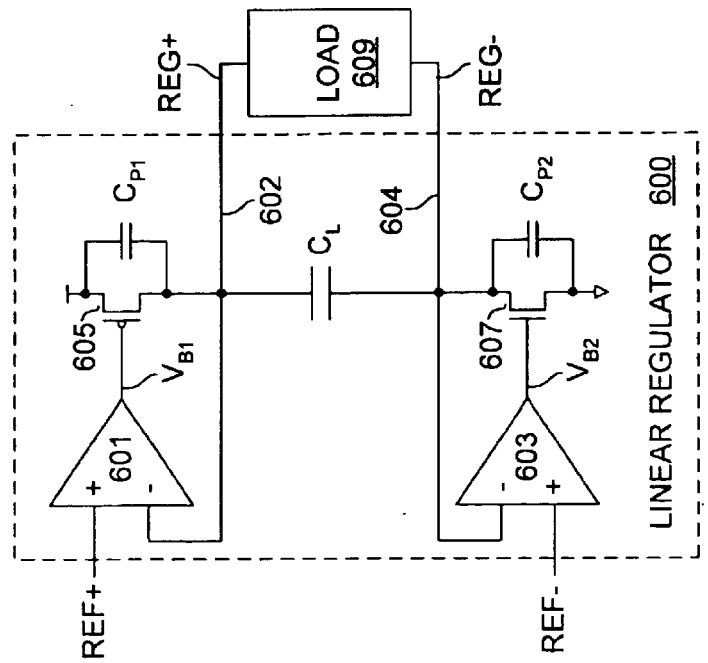
FIG. 28 illustrates an embodiment of the linear regulator of FIG. 27 in greater detail.

FIG. 28 illustrates an embodiment of the linear regulator 600 in greater detail. The linear regulator 600 includes the two differential amplifiers 601 and 603, capacitive element, $C_L$, and current sourcing/sinking transistors 605 and 607 discussed above. The differential amplifier 601 includes a first current source 621 which draws current 2I from the source terminals of the differential transistor pair (i.e., transistors 625 and 627). A second current source 623 generates current, I, which flows through transistor 625 and therefore delivers half the bias current drawn by the current source 621. Current sourcing transistor 605 is coupled in a follower configuration to the differential amplifier (i.e., gate terminal of transistor 605 coupled to the drain terminal of transistor 625, and source terminal of transistor 605 coupled to the gate terminal of diode-configured transistor 627). Current I flows through diode-configured transistor 627, by virtue of the first current source 621 (which draws 2I) and the second current source 623, which sources I through the transistor 625. Accordingly, the REG+ voltage developed at the gate terminal of transistor 627 follows (i.e., is substantially equal to) the REF+ input signal. The load 609 draws a time-varying current, $I_X$, so that the voltage at the drain terminal of the transistor 625 (the output of the differential amplifier 601) is developed as necessary to source current $I+I_X$ via transistor 605, thereby maintaining current I through the transistor 627 and, therefore, maintaining equality (or substantially so) between the regulated output voltage, REG+, and the reference signal, REF+, regardless of the current $I_X$ drawn by the load 609.

The differential amplifier 603 includes a first current source 631 which sources current 2I to the source terminals of differentially coupled transistors 635 and 637, and a second current source 633 which sinks current I via transistor 635. By this arrangement, half the current generated by current source 631 (i.e., current I) flows through transistor 637, thereby causing the regulated voltage, REG−, developed at the gate terminal of transistor 637 to follow the REF− input signal. The current sinking transistor 607 is coupled in a follower configuration with the differential amplifier 603 (i.e., gate terminal of transistor 607 coupled to the drain terminal of the transistor 635, and source terminal of transistor 607 coupled to the gate terminal of the diode-configured transistor 637), drawing current $I_X$ from the load 609 and current I from the first current source via transistor 637. Thus, the voltage at the drain of transistor 635 is developed as necessary to bias transistor 607 to sink current $I+I_X$, thereby maintaining current I through transistor 637 and, therefore, maintaining equality (or substantially so) between the regulated output voltage, REG−, and the reference signal, REF−, regardless of the current $I_X$ drawn from the load 609. Capacitor $C_L$ is coupled in parallel with the load 609 to dampen transient voltage changes as discussed above.

Reflecting on the operation of the linear regulator of FIG. 28, it should be noted that the differential amplifiers 601 and 603 for the linear regulator 600 are implemented using only a single amplifier stage. As a result, the unity gain feedback configuration yields a single-pole feedback system. Thus, the need for special stability compensation techniques of higher ordered systems (e.g., systems with two or more poles) is unnecessary.

It should be noted that the DRSS locked loop architecture described in reference to FIGS. 7–28 can be implemented with either a delay locked loop (DLL) or phase locked loop (PLL) version of a DRSS reference loop. For example, a PLL implementation of a DRSS reference loop would differ from the DRSS reference loop 360 of FIG. 13 primarily in the charge pump circuit (also called a loop filter), where a two-stage filter may be used to stabilize the two pole system (i.e., phase and frequency). Clock divider circuitry may be used within the reference loop to generate frequency-multiplied phase vectors. Also, referring to FIG. 13, the reference clock signal, $CLK_{DRSS}$, would be provided to one input of the phase detector 371 and the free running clock generated by the delay line (e.g., the 360 degree phase vector) provided to the other input of the phase detector. In either type of DRSS reference loop, DLL or PLL, the regulated voltages REG+ and REG− used to lock the reference loop are supplied to mix amplifier circuits within a mixer circuit (e.g., elements $253_1$ and/or $253_2$ of FIG. 7) to provide rapid, substantially linear mixing between a selected pair of phase vectors.

System Application of Locked Loop Circuit

Figure 29:
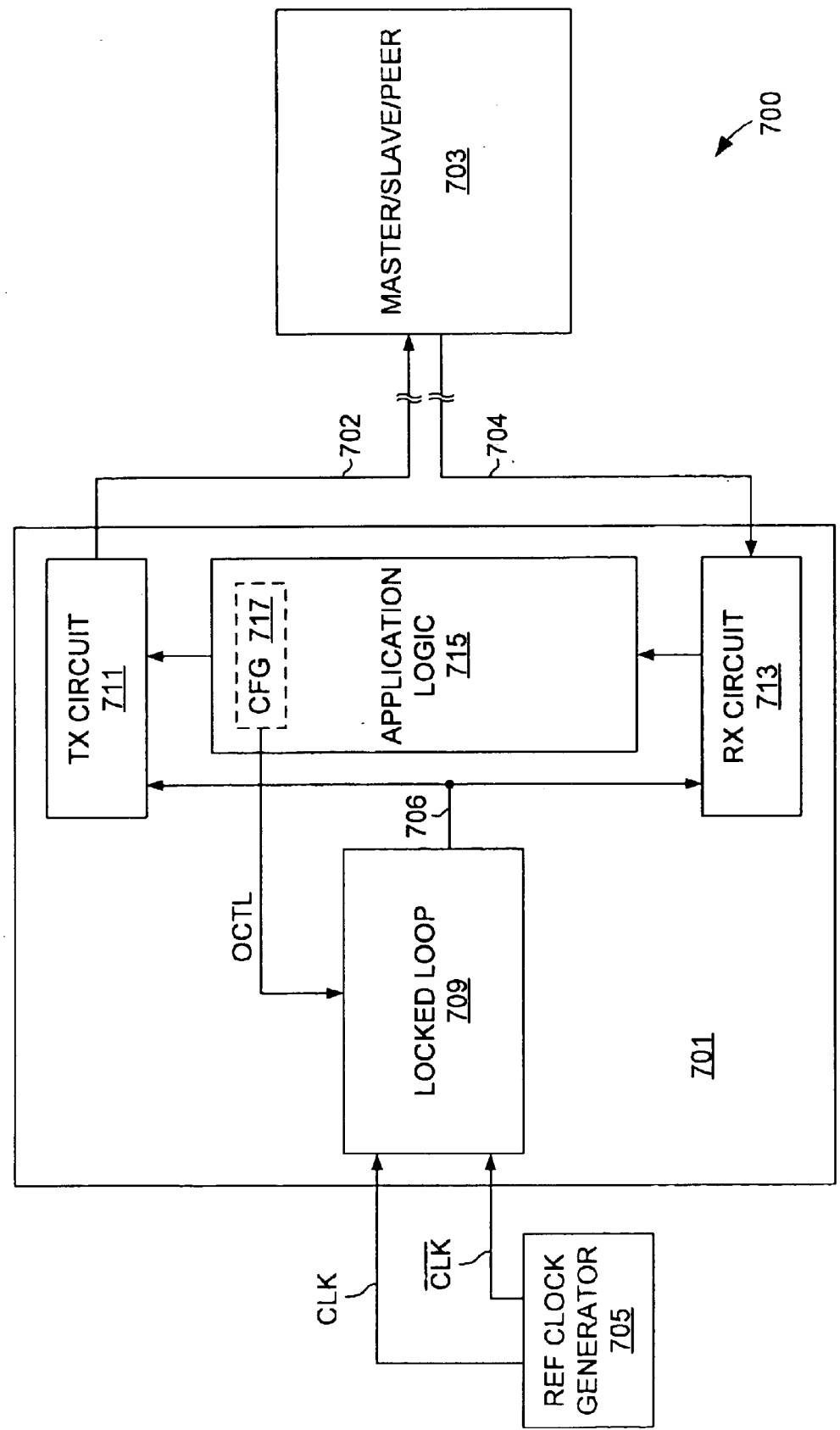
FIG. 29 illustrates a system 700 in which a locked loop circuit according to embodiments of the invention may be used.

FIG. 29 illustrates a system 700 in which a locked loop circuit 709 (i.e., a DLL or PLL circuit) according to embodiments described above in reference to FIGS. 7–28 may be used. The system 700 may be used, for example, within a computing device (e.g., mobile, desktop or larger computer), networking equipment (e.g., switch, router, etc.), consumer electronics device (e.g., telephone, camera, personal digital assistant (PDA), etc.), or any other type of device in which a PLL or DLL circuit may be used. More specifically, the system 700 may be a memory subsystem or any other subsystem within such computing device, networking equipment, consumer electronics device, etc.

The system 700 includes a pair of integrated circuits (ICs) 701 and 703 coupled to one another via a transmit signal path 702 and a receive signal path 704. In the embodiment, shown, the signal paths 702 and 704 are unidirectional high-speed serial links for conducting serialized transmissions from one IC to the other. In alternative embodiments, either or both of the links may be bi-directional (i.e., with appropriate circuitry provided to select which of the ICs is enabled to transmit on the link at a given time), and multiples of such signal paths may be provided to enable transmission of parallel groups of bits (e.g., each group of bits forming a data or control word (e.g., command, address, etc.) or portion of a data or control packet). Also, the transmit signal path 702, receive signal path 704, and/or shared transmit-receive signal path may be a multi-drop bus that is coupled to additional ICs. The ICs 701 and 703 may be peers (e.g., each IC is capable of independently initiating a signal transmission to the other), or master and slave. Also, the relative status of the ICs 701 and 703 may change from time-to-time such that one IC is a master at a first time, then a slave at another time, and/or a peer at another time. IC 701 is shown in simplified block diagram form and includes a transmit circuit 711, receive circuit 713, locked loop circuit 709, and application logic 715. As shown, the locked loop circuit 709 is coupled to receive complementary reference clock signals, CLK and /CLK, from an off-chip reference clock generator 705, and outputs a phase-locked clock signal 706 to the transmit circuit 711 and the receive circuit 713. In an alternative embodiment, the reference clock signals, CLK and /CLK, may be generated within IC 701 or IC 703. A configuration circuit 717 (e.g., register, one-time programmable circuit, non-volatile memory, etc.) may be included within the application logic 715 to store one or more offset control values that are used to establish a phase offset between clock signal 706 and reference clock signal, CLK. Note that clock signal 706 may include a complementary pair of clock signals as described above. Also, while the locked loop 709 is depicted as providing a clock signal to both the transmit circuit 711 (i.e., a transmit clock signal) and to the receive circuit 713 (i.e., a sampling clock signal), separate locked loop circuits may be provided to generate separate transmit and sampling clock signals. Alternatively, multiple clock generation circuits may be provided within the locked loop circuit 709 to generate separate transmit and sampling clock signals. For example, in an embodiment in which locked loop 709 is a DLL circuit implemented as shown in FIG. 7, an additional DRSS mixer and clock tree circuit may be provided to generate a transmit clock in response to a separate offset control value, OCTL. Also, although two ICs are depicted in FIG. 29 (i.e., ICs 701 and 703), the circuits within each of the ICs may alternatively be implemented in a single IC (e.g., in a system-on-chip or similar application), with signal paths 702 and 704 being routed via metal layers or other signal conducting structures fabricated within the IC. Also, if distinct ICs are used as shown in FIG. 29, the ICs may be packaged in separate IC packages (e.g., plastic or ceramic encapsulation, bare die package, etc.) or in a single IC package (e.g., multi-chip module, paper thin package (PTP), etc.).

Time-Multiplexed TX/RX Clock Line

Figure 30:
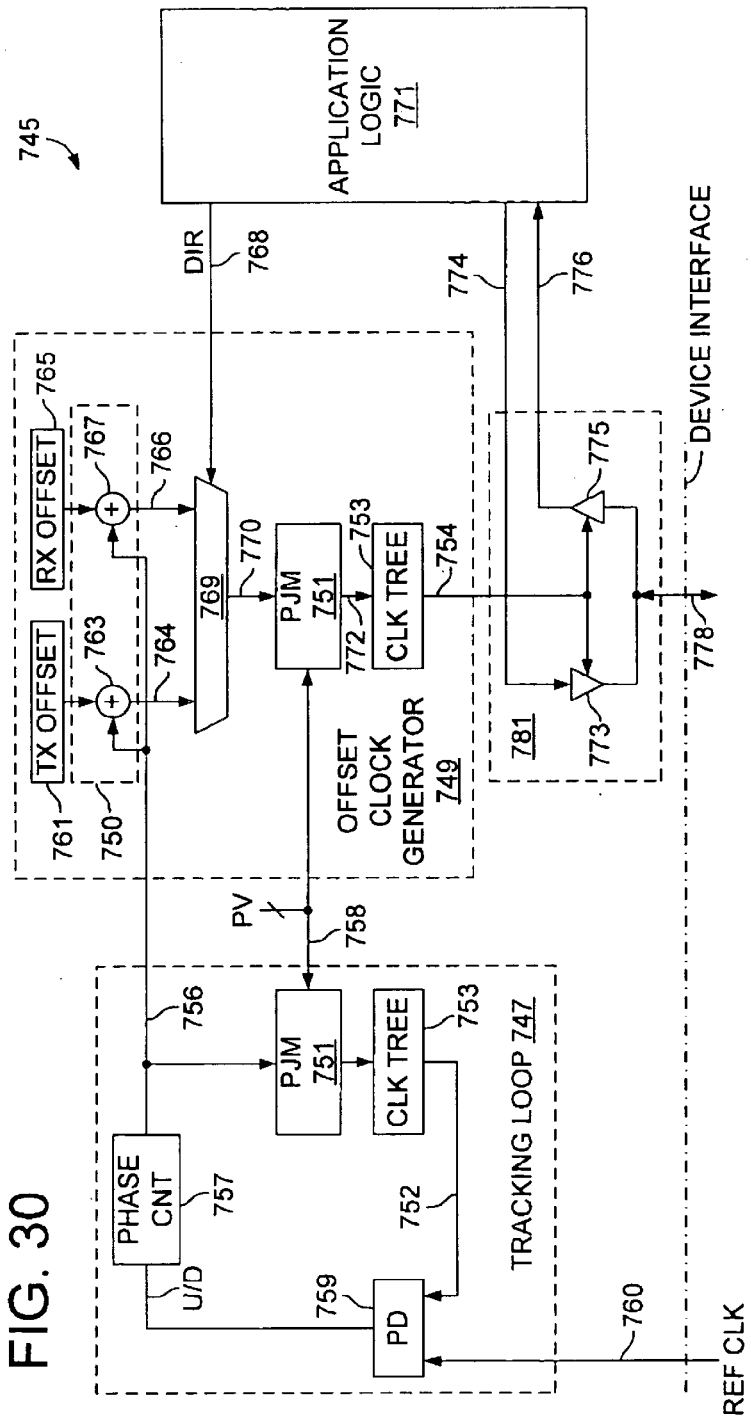
FIG. 30 illustrates a signaling device according to an embodiment of the invention.

FIG. 30 illustrates a signaling device 745 in which transmit and receive phase control values are alternatively supplied to a phase jumping mixer 751 such that a corresponding transmit clock signal and receive clock signal are alternatively output onto a shared clock line 754. That is, the clock signal line 754 is effectively time-multiplexed so that, during a data reception interval, an incoming data waveform on signal path 778 is sampled by a receive circuit 775 in response to transitions of a receive clock signal generated on the clock line 754 and, during a data transmission interval, data is transmitted onto the signal path 778 by a transmit circuit 773 in response to transitions of a transmit clock signal generated on the clock line 754. Note that clock line 754 may be gated within the clock tree circuit 753 or elsewhere such that the signal transitions used to time the reception and transmission of data constitute strobe signals rather than clock signals. Also, signal path 778 may be a single-ended or differential signal path.

The signaling device 745 includes a tracking loop 747, offset clock generator 749, transceiver 781 and application logic 771. The signaling device additionally includes a DRSS-reference loop (not shown) implemented according to the embodiments described above to supply a set of phase vectors 758 and dual regulated supply voltages to the phase jumping mixers 751 within the tracking loop 747 and the offset clock generator 749. The tracking loop 747 includes a phase counter 757, phase jumping mixer 751, clock tree 753 and phase detector 759. The phase jumping mixers 751 within the tracking loop 747 and offset clock generator 749 are implemented in substantially the same manner as the DRSS mixer 415 described in reference to FIGS. 16–24 (including receiving regulated supply voltages to power the DRSS mix amplifiers 423), except that the counter 431 and adder circuit 433 are omitted (the counting and adding functions being performed outside the mixer). By this arrangement, the phase counter 757 may be used to provide a phase count value for use in both the tracking loop 747 and the offset clock generator 749. Thus, the phase detector 749, phase counter 757, phase jumping mixer 751 and clock tree circuit 753 within the tracking loop 747 operate generally as described in reference to the phase detector 257, DRSS mixer $253_1$ and clock tree $255_1$ to generate a feedback clock signal 752 that is phase aligned to a reference clock signal. The phase count value 756 output from phase counter 757 corresponds to the count value generated within counter 431 of FIG. 16 and therefore represents a phase offset between the reference clock signal 760 and a reference phase vector of phase vectors 758 (i.e., one of phase vectors 758 arbitrarily selected to represent a 0 degree phase angle). Within the tracking loop 747, the phase count value 756 constitutes a phase control word that is supplied to the phase jumping mixer 751 to produce a feedback clock signal 752 that is phase aligned with the reference clock signal 760.

The offset clock generator 749 includes a pair of storage circuits 761 and 765, summing circuit 750, select circuit 769, phase jumping mixer 751 and clock tree 753. The storage circuits 761 and 765 are used to store a transmit phase offset value and a receive phase offset value, respectively, which are output to the summing circuit 750. In the embodiment of FIG. 30, the summing circuit 750 includes a pair of adder circuits 763 and 767 each of which is coupled to receive the phase count value 756 from the tracking loop. Adder circuit 763 sums the phase count value 756 with the transmit phase offset value from register 761 to generate a transmit phase control word 764, and adder circuit 767 sums the phase count value 756 with the receive phase offset value from register 765 to generate a receive phase control word 766. The phase control words 764 and 766 are input to the select circuit 769 which outputs a selected one of the phase control words (i.e., as selected phase control word 770) to the phase jumping mixer 751 according to the state of a direction signal 768 received from the application logic 771. The phase jumping mixer 751 mixes a selected pair of phase vectors 758 according to the selected phase control word 770 to produce a mix clock signal 772. The mix clock signal propagates through the clock tree circuit 753 to generate an output clock signal on clock line 754, the output clock signal having a phase offset relative to the reference clock signal 760 according to the selected phase control word 770. Thus, when the direction signal 768 from the application logic 771 indicates a receive operation, the receive phase control word 766 is selected to generate a receive clock signal on clock line 754, the receive clock signal being used to time the sampling instant within a receive circuit 775 (i.e., within transceiver 781), and the data samples captured in response to the receive clock signal being supplied to the application logic 771 via receive data line 776. Conversely, when the direction signal 768 from the application logic 771 indicates a transmit operation, the transmit phase control word 764 is selected to generate a transmit clock signal on clock signal line 754, the transmit clock signal being used to time the transmission of data on signal path 778 by the transmit circuit 773, the data being supplied to the transmit circuit 773 by application logic 771 via transmit data line 774.

The application logic 771 includes circuitry specific to the general function of the integrated circuit device (e.g., memory controller, memory device, processor, application-specific integrated circuit (ASIC), programmable logic device (PLD), or any other type of integrated circuit device. In one embodiment, the transmit circuit 773 is a pull-down type transmit circuit that pulls signal path 778 down from a precharged level (e.g., pulled up to a supply voltage) to transmit a symbol other than a zero-valued symbol, and that transmits a zero-valued symbol by allowing the signal path 778 to remain at the precharged level. Thus, the application logic 771 may effectively disable transmitter 773 from affecting the state of the signal path 778 during a data reception interval by outputting a value onto the transmit data line 774 that corresponds to a zero-valued symbol. In an alternative embodiment in which the transmitter 773 is a push-pull output driver (or any other type of output driver that affects the state of the signal path 778 regardless of the value of the symbol being transmitted), the application logic may output a disable signal to the transmitter 773 to disable the transmitter from affecting the state of the signal path 778 during a data reception interval. Also, while the transmit phase offset value and the receive phase offset value are depicted as being stored in dedicated storage circuits 761 and 765, a shared storage circuit (e.g., a multi-entry memory array) may alternatively be used.

Figure 31:
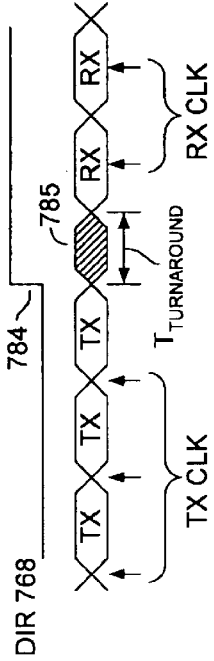
FIG. 31 illustrates the relationship between an exemplary data waveform, the direction signal of FIG. 30 and corresponding transitions of the transmit and receive clock signals generated on the shared clock line of FIG. 30.

FIG. 31 illustrates the relationship between an exemplary data waveform on signal path 778, the direction signal 768 and corresponding transitions of the transmit and receive clock signals generated on clock line 754. When the direction signal 768 is in a first state (low in this example), a transmit clock signal is generated on clock signal line 754 and used to time the transmission of successive data values on signal path 778. In the embodiment shown, a data value (e.g., a symbol represented by one of at least two discrete signal levels, or more than two discrete signal levels in a multi-level signaling embodiment) is transmitted on signal path 778 in response to each transition of the transmit clock signal (i.e., a double data-rate signal in which each symbol is transmitted during a successive half-cycle of the transmit clock signal). In alternative embodiments, more or fewer data values may be transmitted during each cycle of the transmit clock signal. As shown at 784, the application logic 771 transitions the direction signal from low to high in anticipation of receiving data via the signal path 778. During a turnaround interval shown at 785, no data is transmitted or received on the signal path 778, thereby allowing the signal path 778 to settle. The duration of the turnaround interval 785, $T_{TURNAROUND}$, may be longer or shorter than the time between successive data transmissions and/or data receptions. The offset clock generator 749 of FIG. 30 responds to the transition of the direction signal 768 by selecting the receive phase control value 766 to be supplied to the phase jumping mixer 751 and therefore transitioning the phase of the clock signal generated on clock line 754 from the transmit clock signal phase to the receive clock signal phase. Thus, after the turnaround interval 785, the clock signal on clock line 754 has the desired phase offset for sampling data within receive circuit 775 and is used to sample data values for transfer to the application logic 771.

Figure 32:
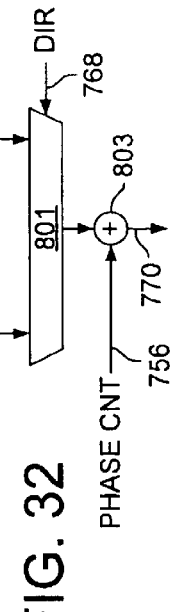
FIG. 32 illustrates an alternative circuit arrangement for generating a phase control value within the offset clock generator of FIG. 30.

FIG. 32 illustrates an alternative circuit arrangement for generating the phase control value 770 within the offset clock generator 749 of FIG. 30. As shown, a select circuit 801 is coupled to receive the transmit and receive offset values from the storage circuits 761 and 765, respectively. The select circuit outputs a selected one of the phase offset values (i.e., selected according to the state of the direction signal 768) to a summing circuit implemented by an adder 803. The adder 803 sums the selected phase offset value with the phase count value 756 received from the tracking loop 747 to generate the phase control value 770. The phase control value 770 is supplied to the phase jumping mixer 751 and used to generate an output clock signal as described in reference to FIG. 30. Note that the registers 761 and 765 depicted in FIGS. 30 and 32 may alternatively be implemented by a memory array having at least two storage entries (i.e., to store the transmit and receive phase offset values), an address decoder to select between the storage entries in response to an address signal (e.g., the direction signal 768) and an output port (e.g., bit lines coupled to columns of storage elements within the memory array) to supply the content of the selected storage entry to the adder 803.

Reflecting on the operation of the device of FIG. 30, it should be noted that, absent the fast phase jumping ability of the mixer 751 within the offset clock generator 749, a transmit or receive clock signal would likely require a time significantly longer than the turnaround interval to stabilize on the clock signal line 754. Thus, the fast phase jumping ability of the mixer 751 enables generation of both transmit and receive clock signals on the same clock signal line, avoiding the need for an additional phase mixer and clock tree. More generally, the architecture of device 745 may be used in any application in which it is desirable to quickly transition an output clock signal between two or more phase offsets. Also, while the phase jumping mixer 751 may be implemented by the phase jumping mixers described above in reference to FIGS. 16–24 (omitting the counter 431 and adder circuit 433), any circuit capable of rapidly transitioning the phase of an output clock signal according to the selection between two or more phase control values may alternatively be used within the clock generating circuit in place of the phase jumping mixer 751.

Phase Searching

To save power during periods of non-communication in a high-speed signaling system, delay locked loop and phase locked loop circuits are often disabled from tracking a reference clock signal (the reference clock signal itself being shut off in some systems). Before communication is restored in such systems, the locked loop circuits are re-enabled in a wake-up operation. In many systems, the time required to complete the wake-up operation is the dominant factor in how quickly communication may be restored, and is directly related to the time required for the locked loop circuit to regain phase lock with the reference clock signal.

FIG. 33 illustrates a binary phase searching operation in which phase jumping within DRSS mixer 253$_1$ of FIG. 7 (or the phase jumping mixer 751 within the tracking loop 747 of FIG. 30) is used to reduce the time required to regain phase lock within the locked loop circuit 200. At the start of a wake-up operation, when the locked loop circuit is enabled (e.g., by enabling the reference clock signal 202 to transition), the tracking loop generates an initial feedback clock signal, F0, having an arbitrary phase with respect to the reference clock signal (REF CLK). The initial feedback clock signal may be generated based on a previously generated (and now stale) phase count value or, in the case of initial wake-up (i.e., at device power-up), a random phase count value or a phase count value that has been reset to a predetermined value (e.g., zero).

FIG. 34 illustrates possible phase relationships between the reference clock signal (REF CLK) and the feedback clock signal (FCLK). If a rising edge transition 818 of the feedback clock signal falls within a high interval 819 of the reference clock signal, the feedback clock signal will be determined by a phase detector (i.e., element 257 of FIG. 7 or 757 of FIG. 30) to lag the reference clock signal. Conversely, if a rising edge transition 820 of the feedback clock signal falls within a low interval 821 of the reference clock signal, the feedback clock signal will be determined by the phase detector to lead the reference clock signal. Thus, shortly after a wake-up operation is begun, the phase detector 257 of FIG. 7 (or phase detector 757 of FIG. 30) will output a phase adjust signal that indicates whether the feedback clock signal leads or lags the reference clock signal.

Reflecting on FIG. 34, it can be seen that if the feedback clock signal is indicated to lag the reference clock signal, the feedback clock signal lags the reference clock signal by at most 180°. Conversely, a feedback clock signal indicated to lead the reference clock signal does so by at most 180 degrees. Thus, as shown in FIG. 33, the initial lead/lag indication by the phase detector may be used to halve an initial 360° search range, SR$_0$ (i.e., range of possible phase offsets between the initial feedback clock signal and reference clock signal), thereby producing 180° search range, SR$_1$. Accordingly, by transitioning the phase of the feedback clock signal (i.e., in a phase-jumping operation) to a phase angle in the center of search range SR$_1$, and repeating the lead/lag determination for the new feedback clock signal (F1), search range SR$_1$ may be halved to produce search range, SR$_2$. Search range SR$_3$ may similarly be determined by jumping to feedback clock signal F2 (i.e., in the center of search range SR$_2$) and halving search range SR$_2$ based on the subsequent lead/lag determination. Search range SR$_3$ is similarly halved to produce search range SR$_4$ based on the lead/lag determination for feedback clock phase F3. This operation is continued with the size of the phase jump being halved for each successively determined search range, until the desired phase offset is determined or until the size of the phase jump reaches a minimum value.

FIG. 35 illustrates a tracking loop 823 for performing the phase searching operation illustrated in FIG. 33. The tracking loop 823 includes a phase detector 759, phase counter 827, phase jumping mixer 751 and clock tree 753, all of which operate generally as described in reference to FIG. 30 and FIG. 7 to generate a feedback clock signal 752. The tracking loop 823 additionally includes search control logic 825 and adder circuit 829 which are used in the phase search operation to load the phase counter 827 with a sequence of conditionally-determined phase count values.

When a locked loop circuit which includes the tracking loop 823 is enabled (e.g., in a wake-up operation), the value in the phase counter 827 may be stale, random or otherwise may not reflect the phase difference between the reference clock signal 760 and the feedback clock signal 752. Accordingly, the phase of the feedback clock signal 752 may have any phase offset relative to the reference clock signal 760 and the phase search operation of FIG. 33 is undertaken to achieve a phase count value 756 within the phase counter 827 that produces phase alignment between the reference and feedback clock signals 760 and 752.

Figure 36:
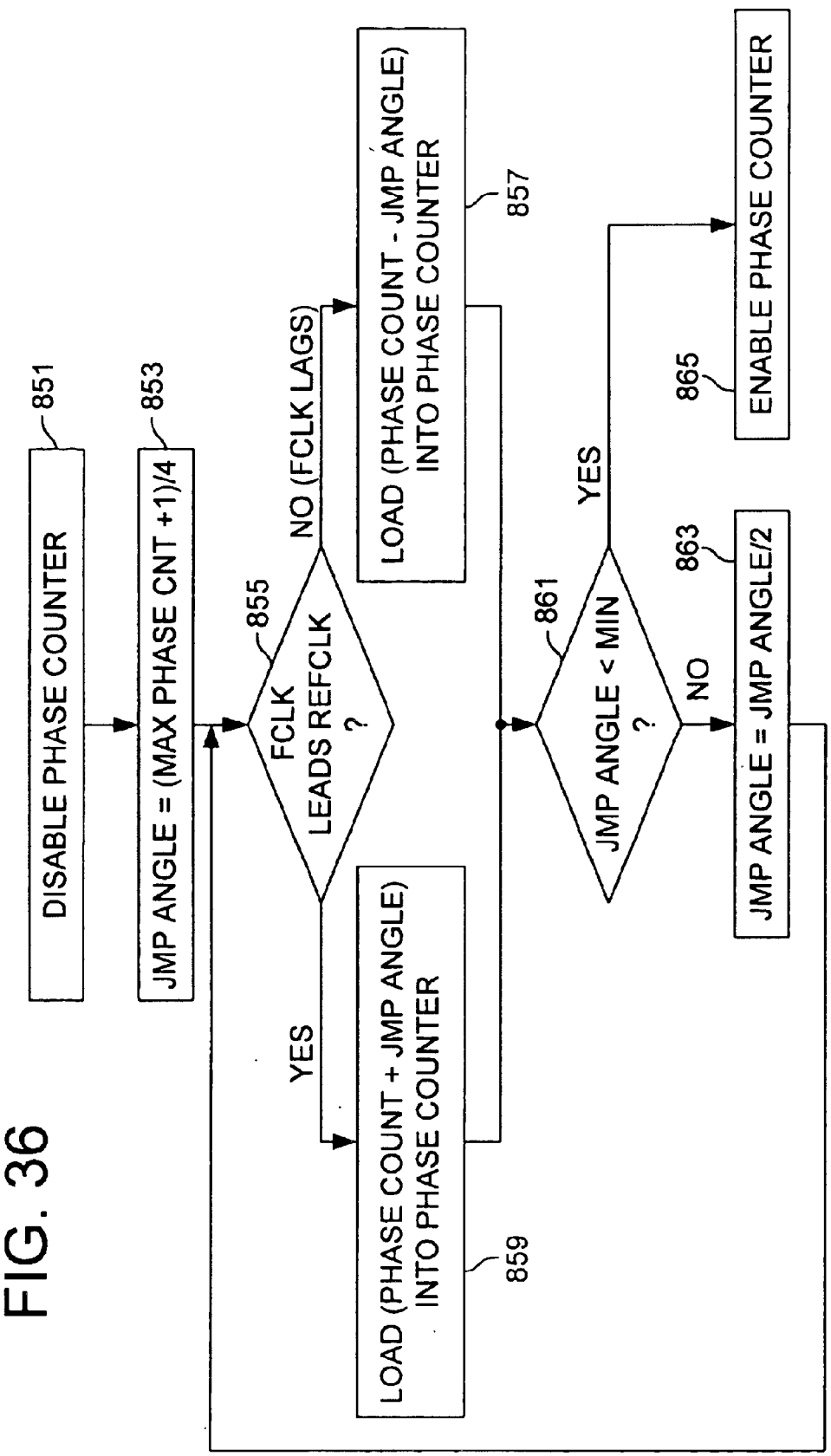
FIG. 36 is a flow diagram of a phase searching operation illustrated according to an embodiment of the invention.

Referring to FIGS. 35 and 36, initially, at block 851, the search control logic 825 deasserts enable signal 826 to disable the phase counter 827 from incrementing and decrementing the phase count 756 in response to the phase adjust signal 824 (U/D) from the phase detector 759. The search control logic 825 also outputs a digital value that represents a phase jump angle; the jump angle initially being set to a value that corresponds to one-fourth of a full cycle of the reference clock signal 760 (i.e., 360°/4=(maximum phase count +1)/4). Note that different initial jump angles may be used, for example, in systems or applications in which the overall search range is less than a full cycle of the reference clock signal 760. The search control logic 825 receives one or more lead/lag indications 824 from the phase detector (e.g., having vote logic to determine a lead/lag result according to whether more lead indications than lag indications, or vice versa, are received within a given time interval) and thereby determines, at decision block 855 whether the feedback clock signal 752 leads or lags the reference clock signal 760. If the feedback clock signal 752 leads the reference clock signal 760, the search control logic 825 outputs a positive jump angle to adder 829 (i.e., via path 830), which responds by adding jump angle to the present phase count value 756 to produce an updated phase count value on path 832. The updated phase count value is loaded into the phase counter 827 in response to assertion of a load signal 828 by the search control logic 825. Thus, as illustrated at block 859 of FIG. 36, the search control logic 825 responds to the lead determination at 855 by loading the phase counter with a sum of the current phase count value and the jump angle, thereby retarding the phase of the feedback clock signal 752 by a phase angle that corresponds to the jump angle. If, at decision block 855, the feedback clock signal 752 is determined to lag the reference clock signal 760, then the search control logic 825 outputs a negative jump angle to the adder 829 (e.g., by operation of a circuit within the search control logic 825 that changes the sign of the jump angle in response to a lag indication), thereby effecting a subtraction of the jump angle from the current phase count value and advancing the phase of the feedback clock signal 752 by a phase angle that corresponds to the jump angle. At block 861 of FIG. 36, the search control logic 825 compares the jump angle to a minimum value. If the jump angle is less than the minimum value, then the search operation is completed and the phase counter 827 is re-enabled at 865 (i.e., search control logic 825 asserts the enable signal 826), thereby enabling linear, incremental phase tracking within the phase counter 827 in response to the phase adjust signal 824 from the phase detector 759. If the jump angle is not less than the minimum value, then the jump angle is halved at block 863 and a new iteration of the binary search operation is begun at 855. In one embodiment, the search control logic 825 includes a shift register to halve the jump angle by right-shifting a binary representation of the jump angle by one bit.

Searching for Leading and Trailing Edges of a Data Eye

After phase lock is achieved within the tracking loop of a locked loop circuit, another phase search may be performed in the offset clock generator (i.e., element 749 of FIG. 30, or the DRSS mixer $253_2$ of FIG. 7) to determine the phase offset between a desired sampling instant and the reference clock signal. Because the tracking loop generates a phase count value that represents an offset between a reference phase vector and the reference clock signal, determining the phase offset for the desired sampling instant may be achieved by determining an offset value to be added to the phase count value to produce a receive clock signal (i.e., sampling clock signal) having the desired phase offset from the feedback clock signal. In one embodiment, this operation involves initiating a data transmission in a remote device to produce an incoming test data stream, then adjusting the phase of the receive clock signal to determine pass-fail phase boundaries that correspond to leading and trailing edges within data eyes of the incoming data stream. The desired sampling instant may then be selected at the midpoint between the pass-fail phase boundaries.

While the task of determining pass-fail phase boundaries may be achieved by incrementing a phase offset value (e.g., the offset control value 262 of FIG. 7, or the value stored in register 765 of FIG. 30) in unitary steps, and testing for correct reception of the test data at each step, this operation can take considerable time, extending the overall system initialization and/or wake-up time. In one embodiment of the invention, the fast-phase jumping ability of the locked loop of FIG. 7 (or FIG. 30) is employed to perform a coarse linear search for leading and trailing edges within data eyes of the test data sequence, for example, by phase jumping through a sequence of clock signals, referred to herein as search vectors, that are offset from one another by a phase angle smaller than an expected minimum eye width. By this operation, at least one of the search vectors, referred to herein as a pass-vector, should fall within the incoming data eye and therefore yield proper reception of the test data sequence. Accordingly, a leading edge of the data eye is known to have a phase offset between a fail-vector (i.e., search vector which fails to yield proper reception of the test data sequence), and an immediately succeeding pass-vector. Similarly, a trailing edge of the data eye is known to have a phase offset between a pass-vector and an immediately succeeding fail vector. The fail-vectors and pass-vectors which bound the leading and trailing edges of the incoming data eye may then be used as bounds in a binary search to rapidly locate the edges of the data eye. A linear search (or other type of search) may be used to locate the edges of the data eye instead of or in addition to the bounded binary search (e.g., bounded binary search to reduce the search range, followed by linear search to determine a precise phase offset). The overall effect of the coarse linear search followed by fine search (binary, linear and/or other), is to significantly reduce the number of phase offsets that are evaluated to locate the edges (and therefore the midpoint) of the data eye, potentially producing a corresponding reduction in the amount of time required to determine the desired receive clock phase offset.

Figure 37:
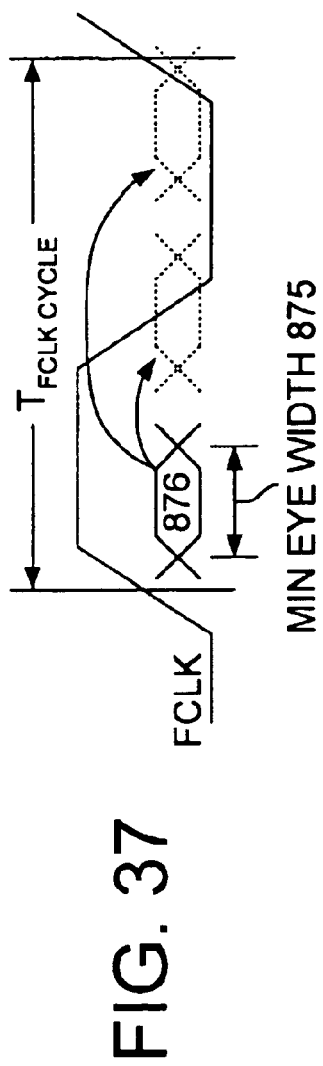
FIG. 37 illustrates the phase offset of an incoming data eye relative to the feedback clock signal generated by a tracking loop.

As shown in FIG. 37, the phase offset of the incoming data eye 876 may have any phase offset within a cycle time of the feedback clock signal, but should have at least some minimum eye width 875. In one embodiment, the minimum eye width is a specified value that is used to determine a number of coarse search ranges by dividing an offset that corresponds to a full cycle angle of the feedback clock signal (i.e., 360°=max offset value+1) by the angle that corresponds to the minimum eye width 875. For example, if the duration of the minimum eye width 875 corresponds to 75° of the feedback clock cycle time, the number of search ranges would be 360°/75°=4 (plus a remainder). In one embodiment, the integer number of search ranges is increased by one to ensure a coarse search range that is smaller than the phase angle of the minimum eye width 875. That is, the number of coarse search ranges=[360°/(phase angle of minimum eye width)]+1. Other formulations for determining the number of coarse search ranges may be used in alternative embodiments.

Figure 38:
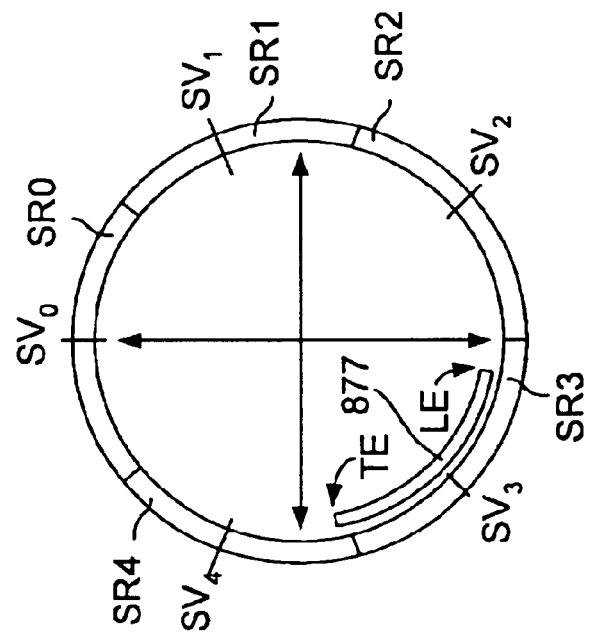
FIG. 38 illustrates a division of a cycle of a feedback clock signal into exemplary search ranges.

FIG. 38 illustrates the division of a cycle of the feedback clock signal (and therefore the reference clock signal) into five search ranges, SR0–SR4, in response to a minimum eye width having an exemplary phase angle of 75°. The minimum eye width may correspond to a substantially smaller or larger phase angle in alternative embodiments. As an example, an actual eye 877 is depicted in FIG. 38 as extending through most of search range SR3 and into part of search range SR4. A search vector is generated for each of the search ranges, SR0–SR4, in sequence by phase jumping from an initial phase offset of zero (search vector, $SV_0$) through a sequence of phase offsets that correspond to the phase angle of the search ranges. That is, a digital phase jump value that corresponds to the size of each search range (i.e., (max phase count +1)/# search ranges) is cumulatively added to the offset control value 262 of FIG. 7 (or the receive clock phase offset value stored in register 765 of FIG. 30) to produce the sequence of search vectors, $SV_0$–$SV_4$, that correspond to the center points of search ranges SR0–SR4, respectively. Thus, in the example of FIG. 38, search vectors $SV_0$, $SV_1$, $SV_2$ and $SV_4$ fall outside the data eye 877 and therefore constitute fail-vectors, while search vector $SV_3$ falls within the data eye and therefore constitutes a pass-vector (i.e., search vector $SV_3$ will yield correct data reception; search vectors $SV_0$–$SV_2$ and $SV_4$ will not). Accordingly, a leading edge of the data eye is bounded by search vectors $SV_2$ and $SV_3$, while a trailing edge of the data eye 877 is bounded by search vectors $SV_3$ and $SV_4$. These bounding vectors may now be used as outer limits in subsequent, finer-granularity searches for the leading and trailing edges of the data eye 877.

Figure 39:
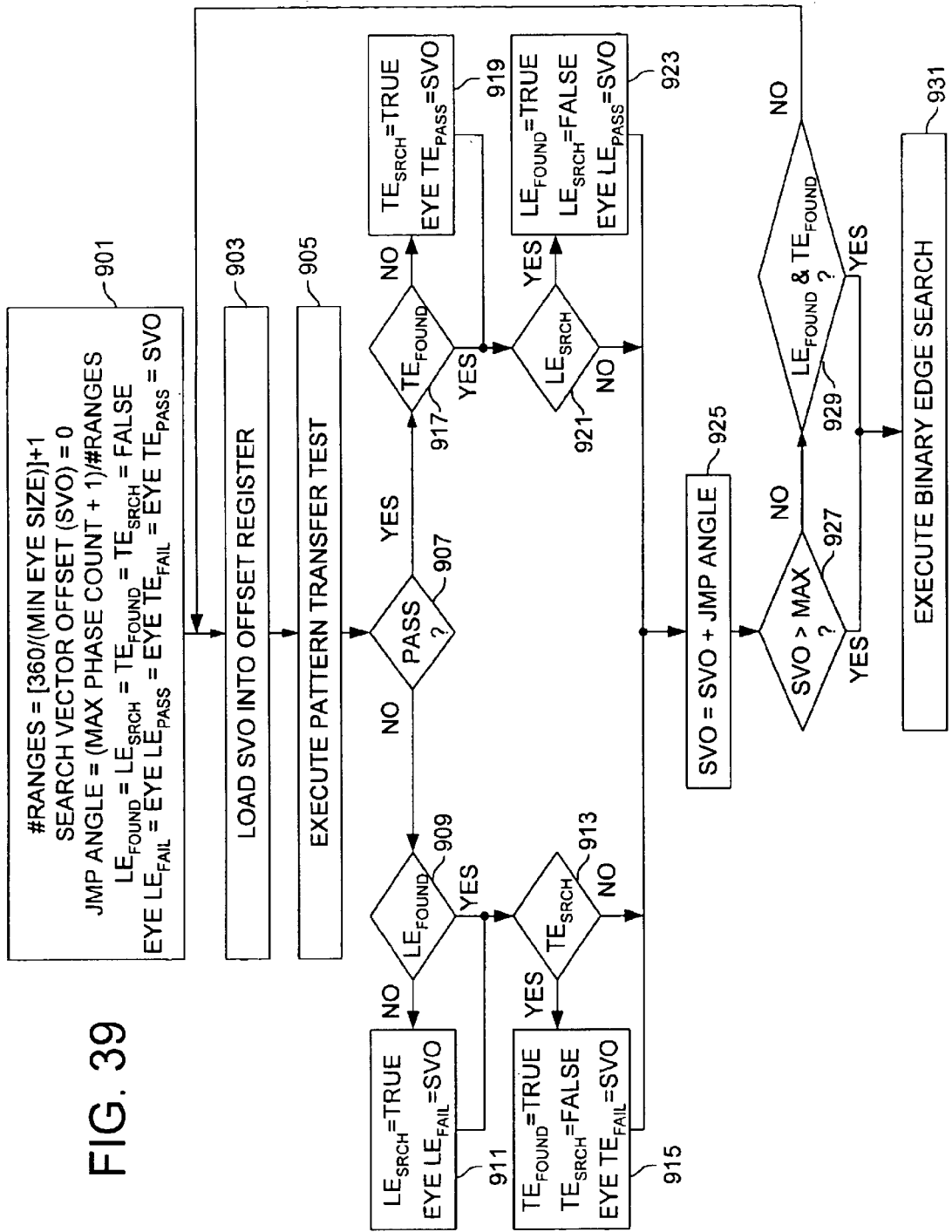
FIG. 39 is a flow diagram of a coarse linear search for leading and trailing edges of a data eye according to an embodiment of the invention.

FIG. 39 is a flow diagram of a coarse linear search for leading and trailing edges of a data eye according to an embodiment of the invention. At 901, the number of search ranges is determined as described above according to the minimum eye size; a search vector offset (SV0), which represents a phase offset value summed with the phase count value from a tracking loop to generate a given search vector, is initialized to zero; a jump angle value (JMP ANGLE) is initialized as described above according to the number of search ranges; Boolean variables, $LE_{FOUND}$, $LE_{SEARCH}$, $TE_{FOUND}$ and $TE_{SEARCH}$, used to indicate the status of the leading and trailing edge searches are initialized to indicate a false state (FALSE); and phase offset variables, EYE $LE_{FAIL}$, EYE $LE_{PASS}$, EYE $TE_{PASS}$ and EYE $TE_{FAIL}$, used to store the phase offsets of search vectors determined to bound the leading and trailing edges of the data eye are initialized to the value of the search vector offset (zero in this example). Note that in alternative embodiments, the number of search ranges may be a predetermined value (i.e., an initial value) or may be generated using other formulations. The jump angle may also be a predetermined value in alternative embodiments.

At 903, the search vector offset is loaded into the offset register to produce an initial search vector (i.e., clock signal generated by the DRSS mixer $253_2$ of FIG. 7 or the offset clock generator 749 of FIG. 30) that is substantially phase aligned with the feedback clock signal. A pattern transfer test is executed at 905 (i.e., receiving a predetermined sequence of test data values transmitted by a remote device). If the test data sequence was not properly received (i.e., pass/fail determination at 907), then the current search vector is a fail-vector and the search operation branches to 909. If the test data sequence was properly received, the current search vector is a pass-vector, and search operation branches to 917. In the case of a fail-vector, if a leading edge of the data eye has not been found (i.e., any preceding executions of the pattern transfer test have not yielded a fail-vector determination followed by a pass-vector determination), then the fail-vector represents a possible bounding vector for a leading edge of the data eye. Accordingly, at 911, Boolean value $LE_{SEARCH}$ is set to true to indicate detection of a fail-vector, and the search vector offset is recorded in EYE $LE_{FAIL}$, a value that represents the phase angle of the bounding fail-vector for a leading edge of the data eye. At 913, Boolean value $TE_{SEARCH}$ is inspected to determine whether a pass-vector was located in a prior execution of the pattern transfer test at 905. If so, the fail-vector detected in the present iteration constitutes an outer bound of a trailing edge of the data eye. Accordingly, at 915, Boolean value $TE_{FOUND}$ is set to TRUE to indicate that pass- and fail-vectors that bound the trailing edge of the data eye have been found, and the search vector offset that yielded the present fail-vector is recorded in EYE $TE_{FAIL}$. Also, Boolean value $TE_{SEARCH}$ is set to FALSE to prevent further update to the EYE $TE_{FAIL}$ value.

Returning to 907, in the case of a pass-vector, if a trailing edge of the data eye has not been found (i.e., any preceding executions of the pattern transfer test have not yielded a pass-vector determination followed by a trail-vector determination), then the pass-vector represents a possible bounding vector for a trailing edge of the data eye. Accordingly, at 919, Boolean value $TE_{SEARCH}$ is set to true to indicate detection of a pass-vector, and the search vector offset is recorded in EYE $TE_{PASS}$, a value that represents the phase angle of the bounding pass-vector for a trailing edge of the data eye. At 921, Boolean value $LE_{SEARCH}$ is inspected to determine whether a fail-vector was located in a prior execution of the pattern transfer test 905. If so, then the pass-vector detected in the present iteration constitutes an outer bound of a leading edge of the data eye. Accordingly, at 923, Boolean value $LE_{FOUND}$ is set to TRUE to indicate that fail- and pass-vectors that bound the leading edge of the data eye have been found, and the search vector offset that yielded the present pass-vector is recorded in EYE $LE_{PASS}$. Also, Boolean value $LE_{SEARCH}$ is set to FALSE to prevent further update to the EYE $LE_{PASS}$ value.

After fail-vector processing in blocks 909–915 or pass-vector processing in blocks 917–923, the jump angle is summed with the search vector offset at 925 to produce a search vector offset that corresponds to the next search vector. At 927, the search vector offset is compared with a maximum value to determine whether all the search vectors have been evaluated. If so, the coarse linear search is completed and a binary edge search is executed at 931. The binary edge search is described in further detail below in reference to FIG. 40. In one embodiment, even if all the search vectors have not been evaluated, the coarse linear search may still be concluded if the leading and trailing edges of the data eye have been found (i.e., $LE_{FOUND}$ and $TE_{FOUND}$ are determined to be true in 929). Otherwise, the coarse linear search is repeated, starting at 903, for the updated search vector offset.

The following table illustrates the result of a coarse linear search according to FIG. 39 assuming the data eye location depicted in FIG. 38:

TABLE 1

| SVO | Test Result | $LE_{SRCH}$ | $LE_{FOUND}$ | $LE_{FAIL}$ | $LE_{PASS}$ | $TE_{SRCH}$ | $TE_{FOUND}$ | $TE_{PASS}$ | $TE_{FAIL}$ |
|---|---|---|---|---|---|---|---|---|---|
| 0° | Fail | True | False | 0° | 0° | False | False | 0° | 0° |
| 72° | Fail | True | False | 72° | 0° | False | False | 0° | 0° |
| 144° | Fail | True | False | 144° | 0° | False | False | 0° | 0° |
| 216° | Pass | True | True | 144° | 216° | True | False | 216° | 0° |
| 288° | Fail | True | True | 144° | 216° | True | True | 216° | 288° |

Thus, at the conclusion of the coarse linear search, a leading edge of the data eye has been determined to be bounded by phase offsets of 144° and 216°, and a trailing edge of the data eye has been determined to be bounded by phase offsets of 216° and 288°. Note that the search vector offset is a digital value, but is listed in degrees in the table above for purposes of illustration.

Still referring to FIG. 39, in one embodiment, if none of the search vector offsets yields a pass-vector determination, the size of the jump angle is decreased (e.g., by a predetermined factor or by a fixed amount), and the coarse linear search repeated. This shrinking of the jump angle produces a corresponding reduction in the size of the search ranges, and may be repeated until at least one pass-vector is found. Similarly, if no fail-vector is identified, the size of the jump angle may be decreased and the coarse search repeated until at least one fail-vector is found. In such embodiments, the initial size of the search range (or minimum eye width) need not be specified, as the system will iteratively shrink or expand the search ranges (i.e., by jump angle decrease or increase) until pass-fail boundaries are located.

Figure 40:
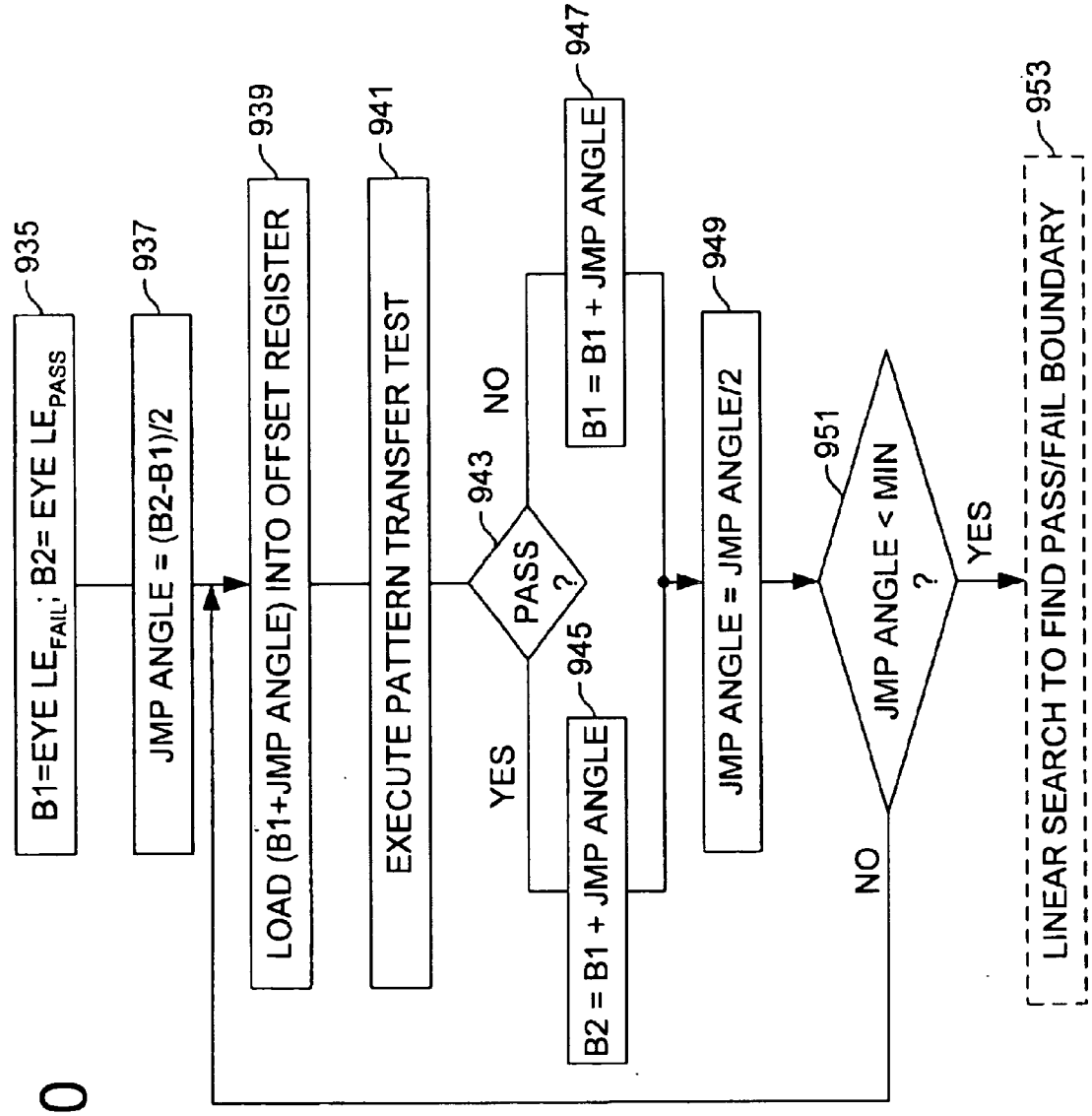
FIG. 40 illustrates a binary search for an edge of a data eye according to an embodiment of the invention.

FIG. 40 illustrates a bounded binary search that may be executed to locate the phase offset of a leading edge of the data eye after execution of the coarse linear search of FIG. 39. Initially, at 935, bounding variables B1 and B2 are loaded with the phase offset values (EYE $LE_{FAIL}$ and EYE $LE_{PASS}$, respectively) determined in the coarse linear search to bound the phase offset of the leading edge of the data eye. At 937, the jump angle (i.e., digital value used to establish a phase jump size) is assigned a value equal to half the size of the phase range defined by bounding phase offsets (i.e., (B2−B1)/2). At 939, a sum of the leading bounding variable, B1, and the jump angle (i.e., B1+JMP ANGLE) is loaded into the offset register (i.e., to control the phase offset of the clock signal generated by the DRSS mixer $253_2$ of FIG. 7 or offset clock generator 749 of FIG. 30) to produce an initial binary search vector that falls substantially midway between the phase vectors represented by bounding variables B1 and B2. A pattern transfer test is executed at 941 by receiving a predetermined sequence of test data values transmitted by a remote device and comparing the sequence test data values with an expected sequence. If the test data sequence was not properly received (i.e., test determined not to have passed at 943), then the search vector falls outside the data eye and the bounding variable B1 is loaded with the offset of the current search vector (i.e., B1+JMP ANGLE) at 947, thereby moving the fail-vector offset (represented by B1) closer to the leading edge of the data eye and halving the search range. If the pattern transfer test is determined to have passed at 943, then the bounding variable B2 is loaded with the offset of the current search value at 945, thereby moving the pass-vector offset (represented by B2) closer to the leading edge of the data eye and halving the search range. At 949 the jump angle is halved in preparation for the next iteration of the bounded binary search. At 951 the jump angle is compared with a minimum jump angle (which may be, for example, a programmable value). If the jump angle is less than the minimum jump angle, then the bounded binary search is concluded an stepwise linear search is optionally performed at 953 to find the precise phase offset of the leading edge of the data eye (i.e., the precise pass-fail boundary). If the jump angle is not less than the minimum jump angle, then the bounded binary search is iterated with the smaller jump angle, starting at 939.

Upon conclusion of the bounded binary search at 951 (and optionally the linear search at 953), the bounded binary search may be repeated to determine the phase offset of the trailing edge of the data eye; the bounding variables B1 and B2 being assigned trailing edge bounding offsets (EYE $TE_{PASS}$ and EYE $TE_{FAIL}$ values, respectively), instead of the leading edge bounding offsets shown in 935; and the operations in 947 and 945 being swapped to account for the opposite direction of the transition between pass- and fail-vectors.

As discussed above, fine linear searches may be used to determine the precise phase offsets of leading and trailing edges of a data eye instead of bounded binary searches. In one embodiment, a coarse linear search is performed as described in reference to FIG. 25 to locate a pair of phase offsets that bound a leading edge of the data eye and a pair of phase offsets that bound a trailing edge of the data eye, then a fine linear search is performed within the phase range bounded by each pair of phase offsets to determine the precise phase offsets of the leading and trailing edges of the data eye. In such an embodiment, the total number of phase search operations (i.e., phase change plus phase comparison) performed may be expressed as follows:

$$N = C + F_1 + F_2, \quad (1)$$

where C is the number of phase search operations performed in the coarse linear search; $F_1$ is the number of phase search operations performed in a fine linear search (i.e., stepwise increment of phase control value, rather than a discontinuous jump) for the phase offset of the leading edge of the data eye, and $F_2$ is the number of phase search operations performed in a fine linear search for the trailing edge of the data eye. Letting M represent the total number of selectable phase offsets within the complete searchable range, then $F_1$ and $F_2$ may be expressed as follows:

$$F_1 = F_2 = (M - C)/C. \quad (2)$$

For example, if an 9-bit phase control value is used to control the phase offset of the mix clock signal generated by a phase jumping mixer, and twenty coarse phase search operations are performed to locate the bounding phases of the leading and trailing edges of the data eye, then $M = 2^9 = 512$, and $F_1 = F_2 = (512 - 20)/20 = 25$ (i.e., after rounding up from 24.6 to an integer value). Thus, 25 stepwise phase search operations are performed between bounding coarse phase offsets to locate the leading edge of the data eye and another 25 stepwise phase comparison operations are performed between bounding coarse phase offsets to locate the trailing edge of the data eye, yielding a total of N=20+25+25=70 phase search operations to precisely locate the phase offsets of the leading and trailing edges of the data eye.

Substituting the right-hand side of expression (2) for the $F_1$ and $F_2$ terms in expression (1), the following expression for N is obtained:

$$N = C + 2(M-C)/C. \quad (3)$$

In locked loop circuits for which M is a predetermined value and therefore fixed (M may alternatively be a programmable or adjustable value), it can be seen that N is a nonlinear function of C. Based on this insight, expression (3) may be rewritten as a differential expression and solved for a relative minima (the second derivative of expression (3) is positive for C>0, so that the zero-valued first derivative is a relative minima) as follows:

$$N = C + 2MC^{-1} - 2 \text{ \{rewriting expression (3) to simplify the differential\}} \quad (4)$$

$$dN/dC = 1 - 2MC^{-2} \quad (5)$$

$$0 = 1 - 2MC^{-2} \text{ \{setting the differential to zero to solve for the relative minima\}} \quad (6)$$

$$C = (2M)^{1/2} \quad (7)$$

Thus, for a locked loop circuit having M selectable phase offsets within a searchable range, the number of coarse linear search operations, C, which yields the lowest total number (N) of coarse and fine linear search operations used to determine the phase offsets of the trailing and leading edges of a data eye is given by the square root of 2M. In the example above in which M=512, expression (7) indicates a minimum N when C=32. Inserting C=32 into expression (2) yields F1=F2=15. Similar analyses may be performed for systems in which a coarse linear search is followed by a bounded binary search, and for systems in which phase comparison operations are performed more than once per phase offset (e.g., performing the phase comparison operation multiple times to filter erroneous lead-lag determinations).

For some values of M (256, for example), the expression (7) yields a non-integer value for C which, when rounded up or down to the nearest integer, may lead to a value of N that is not a minimum. In such cases, neighboring values of C (i.e. C+1, C+2, ..., C−1, C−2, ...) can be checked to determine if the resulting number of searches (i.e. values of N) are lower than with the calculated value of C. Alternatively, the calculated, rounded value of C can be used since the corresponding value of N will be close to the absolute minimum, if not the absolute minimum.

Timing Maintenance; Compensation for Drift

Figure 41:
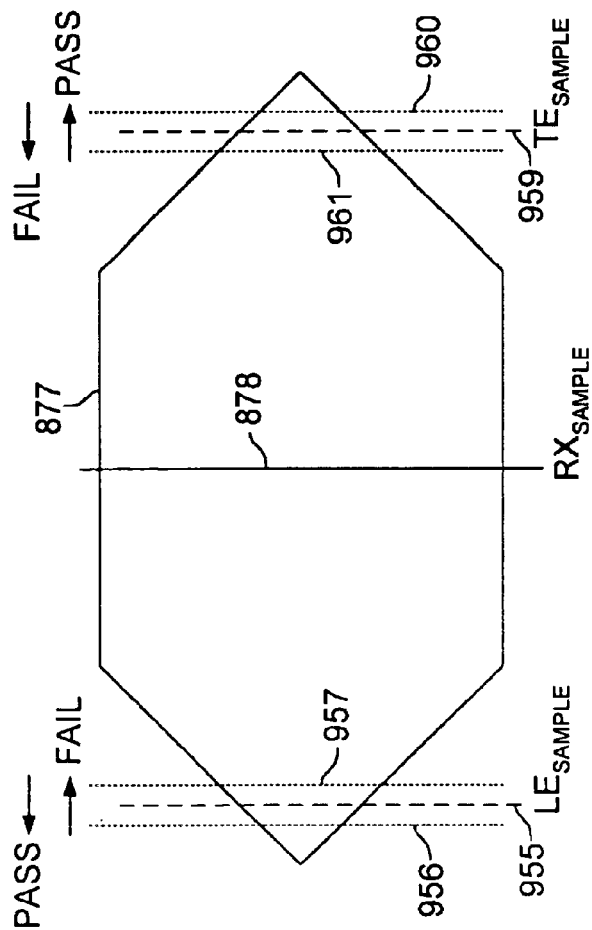
FIG. 41 illustrates a timing maintenance operation according to an embodiment of the invention.

In one embodiment of the present invention, the fast phase-jumping ability of the locked loop circuit 251 of FIG. 7 (or locked loop circuit 745 of FIG. 30) is employed to perform a periodic (and/or event-driven) timing maintenance operation, for example to compensate for a voltage- and/or temperature-induced phase error. Referring to FIG. 41, during normal operation of the locked loop circuit, a receive clock signal is used to sample an incoming data waveform in the center of each successive data eye 877 to provide maximum leading and trailing edge margin (note that sampling instants offset from the center of the data eye may be used in alternative embodiments, particularly where the data setup and hold times of the receiver circuit are asymmetric). Due to changes in voltage, temperature or other environmental or device parameters, the actual sampling instant, indicated by 878 may become skewed relative to the desired sampling instant, resulting in a loss of timing margin.

Figure 42:
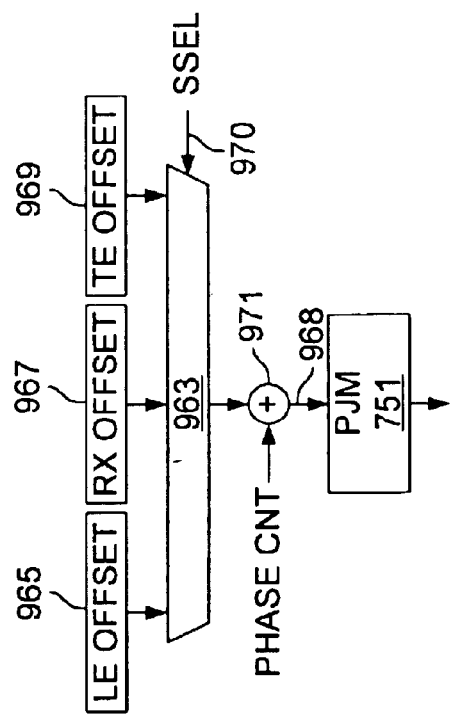
FIG. 42 illustrates a circuit for generating a phase control value according to an embodiment of the invention.

Referring to FIGS. 41 and 42, in one embodiment, leading-edge and trailing-edge phase offset values that correspond to leading and trailing edge boundaries of the data eye 877 are recorded in a storage registers 965 and 969 within a locked loop circuit according to the invention (or elsewhere in the integrated circuit that includes the locked loop circuit) and therefore may be selected for summation with the phase count value (i.e., generated by the counter 431 of FIG. 16 or the counter 757 within the tracking loop 747 of FIG. 30) to generate leading- and trailing-edge sampling clocks. In one embodiment, the leading-edge and trailing-edge phase offset values are generated during system initialization (e.g., by using the search operations described above in reference to FIGS. 37–40), and used to generate a receive phase offset value that is stored in register 967; the receive phase offset value being generated, for example, by averaging the leading-and trailing-edge offset values stored in registers 965 and 969. During normal operation, sample select signal 970 (SSEL) is set to a normal state to select, via select circuit 963, register 967 to source a phase offset value to be summed with the phase count value (PHASE CNT) in adder 971. The resulting phase control value 968 is then supplied to phase jumping mixer 751 which generates an offset clock signal (optionally to propagate through a clock tree) for timing the sampling instant 878.

When a timing maintenance operation is to be performed, the sample select signal 970 is transitioned to a leading-edge-test state, and selects register 965 to source a leading edge phase offset value to adder 971. Consequently, the phase control value 968 is transitioned from the sampling clock phase control value to a leading-edge phase control value. The phase jumping mixer 751 responds to the transition of the phase control value 968 by rapidly transitioning the phase of the output clock signal to the leading edge sampling instant shown at 955 of FIG. 41. A data transfer test is then performed to determine whether an incoming data eye (or sequence of data eyes) is properly received when sampled at the leading fringe of the data eye 877 (i.e., at 955). If the leading-edge data transfer test is passed (i.e., proper data reception confirmed), the leading-edge phase offset value within register 965 is decremented to establish the new leading-edge sampling instant shown at 956. If the leading-edge data transfer test is failed, the leading-edge phase offset value within register 965 is incremented to establish the new leading-edge sampling instant shown at 957.

After a pass/fail result is recorded for the leading-edge data transfer test, the sample select signal 970 is transitioned to a trailing-edge-test state, and selects register 969 to source a trailing edge phase offset value to adder 971. The adder 971 responds to the new phase offset value by transitioning the phase control value 968 from the leading-edge phase control value to a trailing-edge phase control value, and the phase jumping mixer 751 responds in turn by rapidly transitioning the phase of the output clock signal to the trailing edge sampling instant shown at 959 of FIG. 41. A data transfer test is then performed to determine whether an incoming data eye (or sequence of data eyes) is properly received when sampled at the trailing fringe of the data eye 877 (i.e., at 959). If the trailing-edge data transfer test is passed, the trailing-edge phase offset value within register 969 is incremented to establish the new leading-edge sampling instant shown at 960. If the trailing-edge data transfer test is failed, the trailing-edge phase offset value within register 969 is decremented to establish the new leading-edge sampling instant shown at 961.

Still referring to FIG. 41, it can be seen that if the leading-edge data transfer test passes and the trailing-edge data transfer test fails, then the phase of the data eye 877 has shifted in the direction of the leading edge (i.e., the phase of the data eye 877 has advanced relative to the reference clock signal). Thus, the receive clock phase offset value stored in register 967 is decremented in response to a leading-edge pass/trailing-edge fail condition, thereby keeping the sampling instant 878 substantially phase aligned with the center of the data eye 877 (or phase aligned with a desired phase offset from the center of the data eye 877). Conversely, if the leading-edge data transfer test fails and the trailing-edge data transfer test passes, then the data eye 877 has shifted in the direction of the trailing edge (i.e., the phase of the data eye has become increasingly delayed relative to the reference clock signal), and the receive clock phase offset value stored in register 967 is incremented to keep the sampling instant substantially phase aligned with the center of the data eye (or phase aligned with a desired phase offset from the center of the data eye 877). By periodically repeating the phase adjustment operations illustrated in FIG. 41, the sampling instant 878 is enabled to track phase drift in the data eye (e.g., caused by changes in voltage and temperature), thereby conserving system timing margin.

Figure 43:
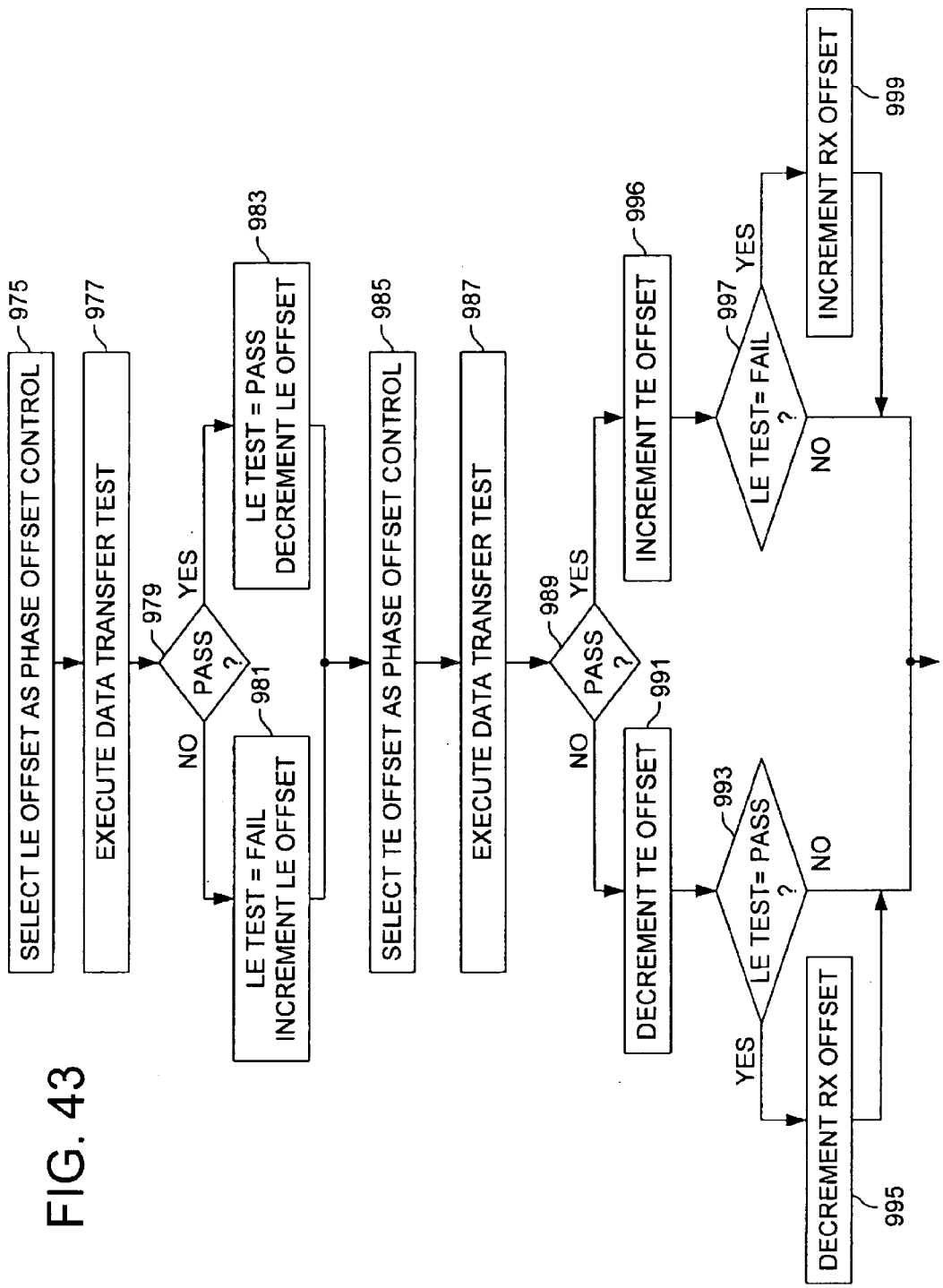
FIG. 43 is a flow diagram of a timing maintenance operation according to an embodiment of the invention.

FIG. 43 is a flow diagram of a timing maintenance operation according to an embodiment of the invention. At 975 the leading-edge phase offset value (i.e., the value stored in register 965 of FIG. 42) is selected to generate a leading-edge-aligned clock signal. At 977, a leading-edge data transfer test is performed. If the leading-edge data transfer test is determined to pass (979), then at 973, a Boolean variable, LE TEST is assigned a PASS value, and the leading edge phase offset value is decremented. If the leading-edge data transfer test is determined not to pass, then at 981, LE TEST is assigned a FAIL value, and the leading edge phase offset value is incremented. At 985, the trailing-edge phase offset value (i.e., the value stored in register 969 of FIG. 42) is selected to generate a trailing-edge-aligned clock signal. At 987, a trailing-edge data transfer test is performed. If the trailing-edge data transfer test is determined not to pass (989), then at 991 the trailing edge phase offset value is decremented. The Boolean variable, LE TEST is inspected at 993 to determine whether the leading-edge phase offset value has also been decremented (i.e., LE TEST=PASS) and, if so, the receive clock phase offset value (i.e., the value stored in register 967 of FIG. 42) is decremented to track the shift in the data eye. If the leading-edge phase offset value has not been decremented, the receive clock phase offset value is not adjusted. If the trailing-edge data transfer test is determined to pass, then the trailing-edge phase offset value is incremented at 996, and the LE TEST variable is inspected at 997 to determine whether the leading-edge phase offset value has also been incremented (i.e., LE TEST=FAIL). If the leading-edge phase offset value has been incremented, then the receive clock phase offset value is incremented at 999 to track the shift in the data eye. If the leading-edge phase offset value has not been incremented, then the receive clock phase offset value is not adjusted. It should be noted that the increment and decrement operations at 999 and 995, respectively, effectively maintain the receive clock phase offset value midway between the leading- and trailing-edge phase offset values. In an alternative embodiment, the receive clock phase offset value may be re-calculated after each update to the leading- and/or trailing-edge phase offset value, for example, by dividing a sum of the leading- and trailing-edge phase offset values by two (i.e., halving the sum of the offset values) or by another predetermined number.

Per-Device Phase Offset; Source- and Destination-Based Phase Jumping

Figure 44:
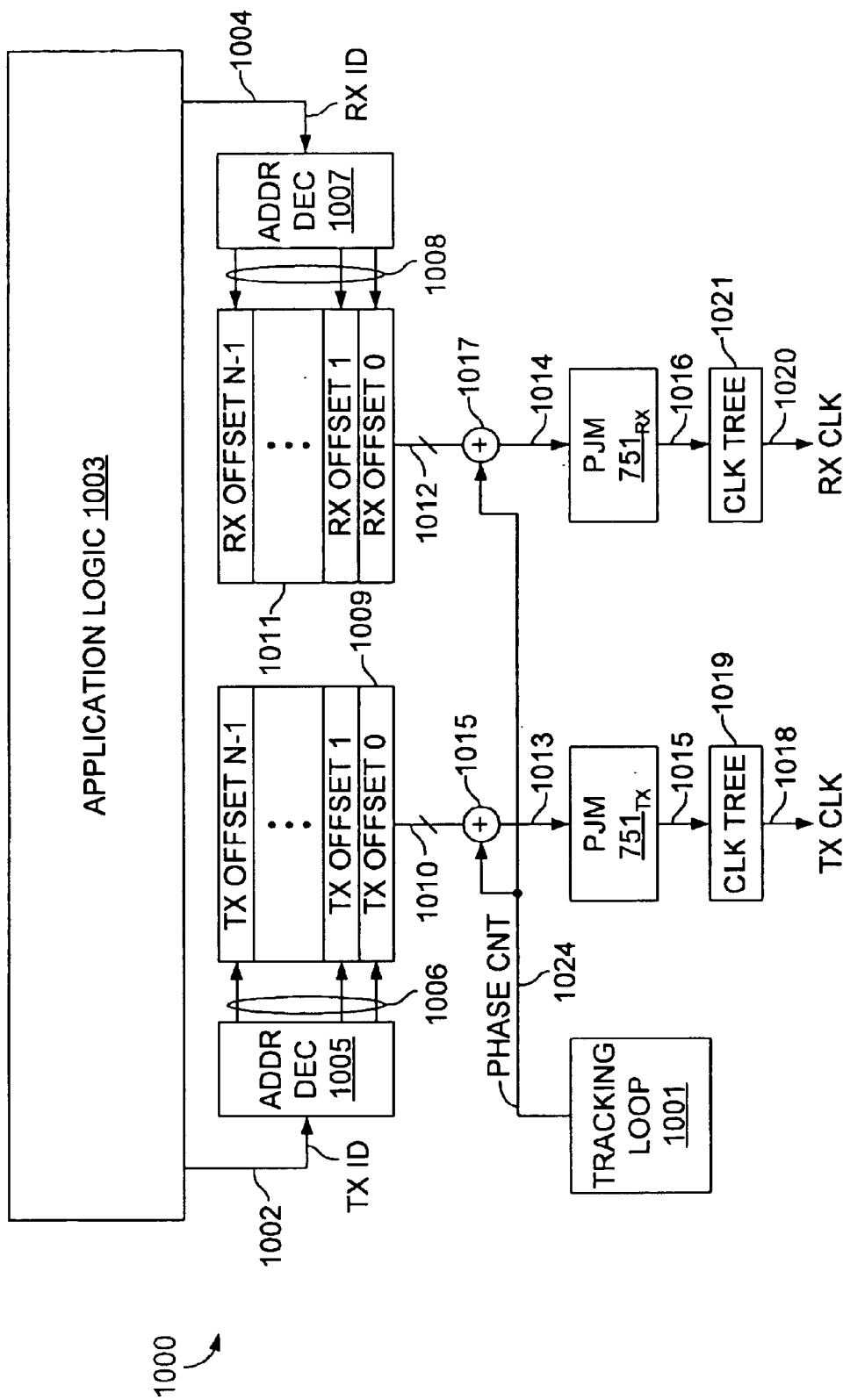
FIG. 44 illustrates a signaling device according to an embodiment of the invention.

In one embodiment of the present invention, the fast phase jumping ability of the locked loop circuit 251 of FIG. 7 (and locked loop circuit 745 of FIG. 30) is employed to enable source- and destination-based phase jumping. FIG. 44 illustrates a signaling device 1000 which includes a storage circuit 1009 to store a number, N, of transmit clock phase offset values, each transmit clock phase offset value corresponding to a respective one of a plurality of remote devices within a signaling system. In one embodiment, the storage circuit 1009 includes a plurality of storage elements arranged in rows and columns. Access enable lines 1006 are coupled to respective rows of storage elements and bit lines (not shown in FIG. 44) are coupled to respective columns of storage elements. When an address-selected one of the access enable lines 1006 is activated, read or write access to the corresponding row of storage cells is enabled, with the access to individual storage elements of the row occurring via respective bit lines. By this arrangement, each of the rows of storage elements is enabled to store a respective phase offset value received via the bit lines in a write operation, and each of the rows of storage elements is enabled to output a previously stored phase offset value in a read operation. When application logic 1003 receives (or generates) a request to transmit data to one of the remote devices, the application logic 1003 outputs a transmit identifier value 1002 which identifies the remote device intended to receive the transmission. The transmit identifier is received within an address decoder 1005 which activates one of the plurality of access-enable lines 1006 to enable a corresponding one of the transmit phase offset values (each being a digital value stored within a row of storage elements within the storage circuit 1009) to be output to adder 1015 via bit lines 1010. The selected transmit phase offset value is added to the phase count value 1023 generated within the tracking loop 1001 to generate an updated phase control word 1013. The phase jumping mixer $751_{TX}$ responds to the updated phase control word 1013 by rapidly transitioning the phase of an output clock signal 1015 to the indicated transmit phase offset. The output clock signal 1015 propagates through a clock tree circuit 1019 (which may be omitted where significant clock signal fan out is not needed) to generate a transmit clock signal 1018 having the desired phase. By this arrangement, the locked loop circuit responds to each new transmit identifier 1002 output by the application logic (and corresponding transmit phase offset value output from the storage circuit 1009) by rapidly transitioning the phase of the transmit clock signal 1018 to the transmit phase offset recorded for the corresponding remote device.

Still referring to FIG. 44, storage circuit 1011 is provided to store a number, N, of receive clock phase offset values, each transmit clock phase offset value corresponding to a respective one of the plurality of remote devices within the signaling system. When application logic 1003 receives (or generates) a request to receive data from one of the remote devices, the application logic 1003 outputs a receive identifier value 1004 which identifies the remote device. The receive identifier is received within an address decoder 1007 which activates one of a plurality of access-enable lines 1008 to enable a corresponding one of the receive phase offset values (each being a digital value stored within a row of storage elements within the storage circuit 1011) to be output to adder 1017 via bit lines 1012. The selected transmit phase offset value is added to the phase count value 1024 to generate an updated phase control word 1014. The phase jumping mixer 751$_{RX}$ responds to the updated phase control word 1014 by rapidly transitioning the phase of an output clock signal 1016 to the indicated receive phase offset. The output clock signal 1016 propagates through a clock tree circuit 1021 (which may be omitted where significant clock signal fan out is not needed) to generate a receive clock signal 1020 having the desired phase. By this arrangement, the locked loop circuit responds to each new receive identifier 1004 output by the application logic (and corresponding receive phase offset value output from the storage circuit 1011) by rapidly transitioning the phase of the receive clock signal 1020 to the receive phase offset recorded for the corresponding remote device. Note that the application logic 1003 may generate the request to receive data from a remote device in response to a previous transmission to the remote device. For example, in a memory system, the signaling device 1000 may be a memory controller that transmits a memory read command (or memory read request) to a remote memory device, the read command evoking a responsive, deterministic transmission by the memory device that is received by one or more receive circuits within the signaling device 1000 under control of the receive clock signal 1020.

Still referring to FIG. 44, the storage circuits 1011 and 1009 and corresponding address decoders 1005 and 1007 may be replaced by a unified storage circuit and corresponding unified address decoder in an alternative embodiment. In such an embodiment, the application logic 1003 may output a device identifier to indicate which device is to be the source or destination of a transmission, with a most significant bit (or least significant bit of the device identifier being used to select between transmit and receive phase offsets. Also, while separate adders (1015, 1017), phase jumping mixers (751$_{TX}$, 751$_{RX}$) and clock tree circuits 1019 and 1021 are depicted in FIG. 44, a single adder (or summing circuit 767 of FIG. 30), phase jumping mixer and clock tree circuit may be alternatively be used in the arrangement described in reference to FIGS. 30–32 to alternatively generate a transmit clock signal (having a phase offset according to the selected one of N transmit phase offset values) and a receive clock signal (having a phase offset according to the selected one of N receive phase offset values) on a shared clock line.

Locked Loop Circuit with Clock Hold Function

Figure 45:
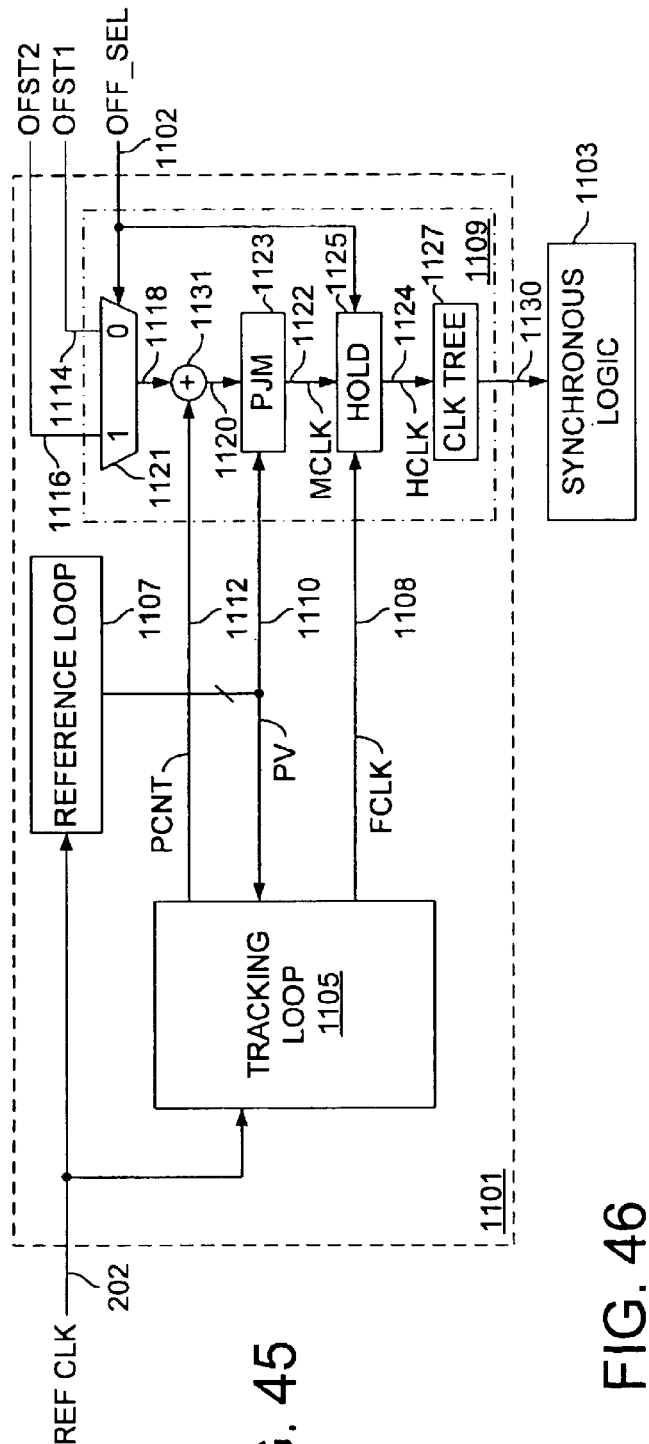
FIG. 45 illustrates another phase-jumping locked loop circuit according to an embodiment of the invention.

FIG. 45 illustrates a phase-jumping locked loop circuit 1101 that generates a clock signal 1130 for clocking a synchronous logic circuit 1103. The locked loop circuit 1101 includes a tracking loop 1105, reference loop 1107, and offset clock generator 1109. The reference loop 1107 operates as described above in reference to FIGS. 8 and 13 to output a plurality of phase vectors 1110 (PV) to phase mixing circuits within the tracking loop 1105 and offset clock generator 1109. The tracking loop 1105 operates as described above in reference to FIG. 30 to adjust a phase count 1112 (PCNT) as necessary to produce a feedback clock signal 1108 (FCLK) that is phase-aligned with a reference clock signal 202. The phase count value 1112 represents a phase offset between the feedback clock signal and a reference phase vector (i.e., one of the phase vectors 1110 designated to have, for example, a zero degree phase angle), and is supplied to the offset clock generator 1109 along with the feedback clock signal 1108.

The offset clock generator 1109 includes an offset selector 1121, adder 1131, phase jumping mixer 1123, clock hold circuit 1125, and clock tree circuit 1127. The offset selector 1121 selects between offset values 1114 and 1116 (OFST1 and OFST2, respectively) according to an offset select signal 1102 (OFF_SEL). The selected offset value 1118 is summed with the phase count value 1112 in adder 1131 to produce a phase control value 1120. In an alternative embodiment more than two offset values may be input to the offset selector 1121, and the offset values or a subset thereof may be maintained within the locked loop circuit 1101 rather than being provided by external logic. Also, the phase count value 1112 may alternatively be summed with each of the offset values in separate adder circuits, with the summed values being input to the offset selector 1121 (see summing circuit 750 of FIG. 30, for example). Further, while the offset selector 1121 is depicted as a multiplexer in FIG. 45, any circuit capable of selecting one of a plurality of offset values or phase control values (e.g., an address decoder in association with a memory array, register file or other storage), may be used in alternative embodiments.

The phase jumping mixer 1123 generates a mix clock signal 1122 (MCLK) by interpolating between a selected pair of the phase vectors 1110 in accordance with the phase control value 1120. The mix clock signal 1122 is provided to the clock hold circuit 1125 which, in response, outputs a hold clock signal 1124 (HCLK) to the clock tree circuit 1127. The hold clock signal 1124 propagates through the clock tree circuit 1127 to produce multiple instances of an offset clock signal, at least one of which is the clock signal 1130 provided to the synchronous logic circuit 1103. The synchronous logic circuit includes one or more logic circuits which respond to transitions in the clock signal 1130 (e.g., flip-flops and/or other edge-triggered logic circuits). Note that the clock tree circuit 1127 may be omitted in embodiments in which the fan out of the hold clock signal 1124 is limited. Also, a delay circuit which exhibits substantially the same propagation delay as the clock hold circuit 1125 may be included within the tracking loop 1105 such that, in the case of a zero-valued offset 1118, clock signal 1130 is substantially phase aligned to with the feedback clock signal 1108.

Figure 46:
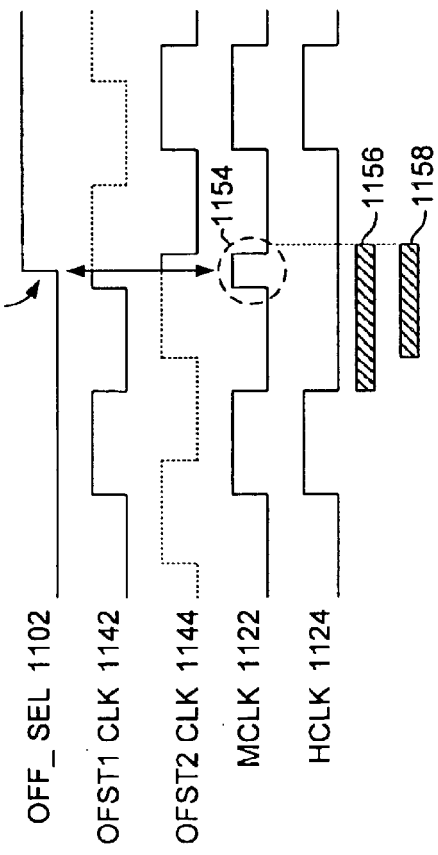
FIG. 46 illustrates an exemplary relationship between the offset select, mix clock, and hold clock signals of FIG. 45.

FIG. 46 illustrates an exemplary relationship between the offset select signal 1102, mix clock signal 1122 and hold clock signal 1124. Also shown are two clock signals, OFST1 CLK (1142) and OFST2 CLK (1144), which correspond to mix clock signals 1122 that will be generated by the phase jumping mixer 1123 for corresponding selections of the offset control values 1114 and 1116 (OFST1 and OFST2, respectively). To be clear, clock signals OFST1 CLK and OFST2 CLK are not separately generated within the locked loop circuit 1101, but rather represent instances of the mix clock signal 1122 that correspond to OFST1 and OFST2, respectively. Thus, when the offset select signal 1102 is low, OFST1 is selected as the offset control value 1118, and the mix clock signal 1122 has a phase according to the OFST1 CLK 1142. When the offset select signal 1102 goes high at 1152, a phase jump is initiated within the phase jumping mixer to transition the phase of the mix clock signal 1122 from the phase of OFST1 CLK 1142 to the phase of OFST2 CLK 1144. Because of the phase difference between OFST1 CLK and OFST2 CLK, the phase jump produces a short-duration pulse 1154 within the mix clock signal 1122, referred to herein as a runt pulse. Depending on the starting time and duration of the phase jump operation, the runt pulse 1154 may be wider or narrower than shown in FIG. 46, and may be a low-level runt pulse rather than a high-level runt pulse.

Clock signals exhibiting occasional runt pulses may be tolerated in some systems, (e.g., where the clock signal is used solely to clock input/output circuits), but tend to produce undesirable meta-stable states and/or race conditions in synchronous logic circuits due to the inability to guarantee signal setup and hold times and due to the uncertain transition time of state variables (e.g., flip-flop outputs). In the locked loop circuit 1101 of FIG. 45, the clock hold circuit suppresses runt clock pulses to avoid meta-stability and race conditions.

Still referring to FIGS. 45 and 46, the clock hold circuit 1125 is coupled to receive the offset select signal 1102 and, upon detecting a transition in the offset select signal 1102, latches the state of the hold clock signal 1124 over a clock hold interval 1156 that is long enough to avoid generation of a low-level or high-level runt pulse. In one embodiment, the mix clock signal 1122 may have an arbitrary phase relative to the transition time of the offset select signal, and therefore the hold clock signal 1124 may be in transition at the start of the clock hold interval 1156. To prevent latching or otherwise capturing an indeterminate state of the hold clock signal 1124, the clock hold circuit includes circuitry to predict whether the leading edge of the clock hold interval 1156 will coincide with a transition of the hold clock signal 1124 and, if so, to delay the start of the clock hold interval to a later time, thereby producing a delayed clock hold interval 1158. In this way, a determinate state of the hold clock signal 1124 will be latched by the clock hold circuit 1125, regardless of when the offset select signal 1102 transitions.

Figure 47:
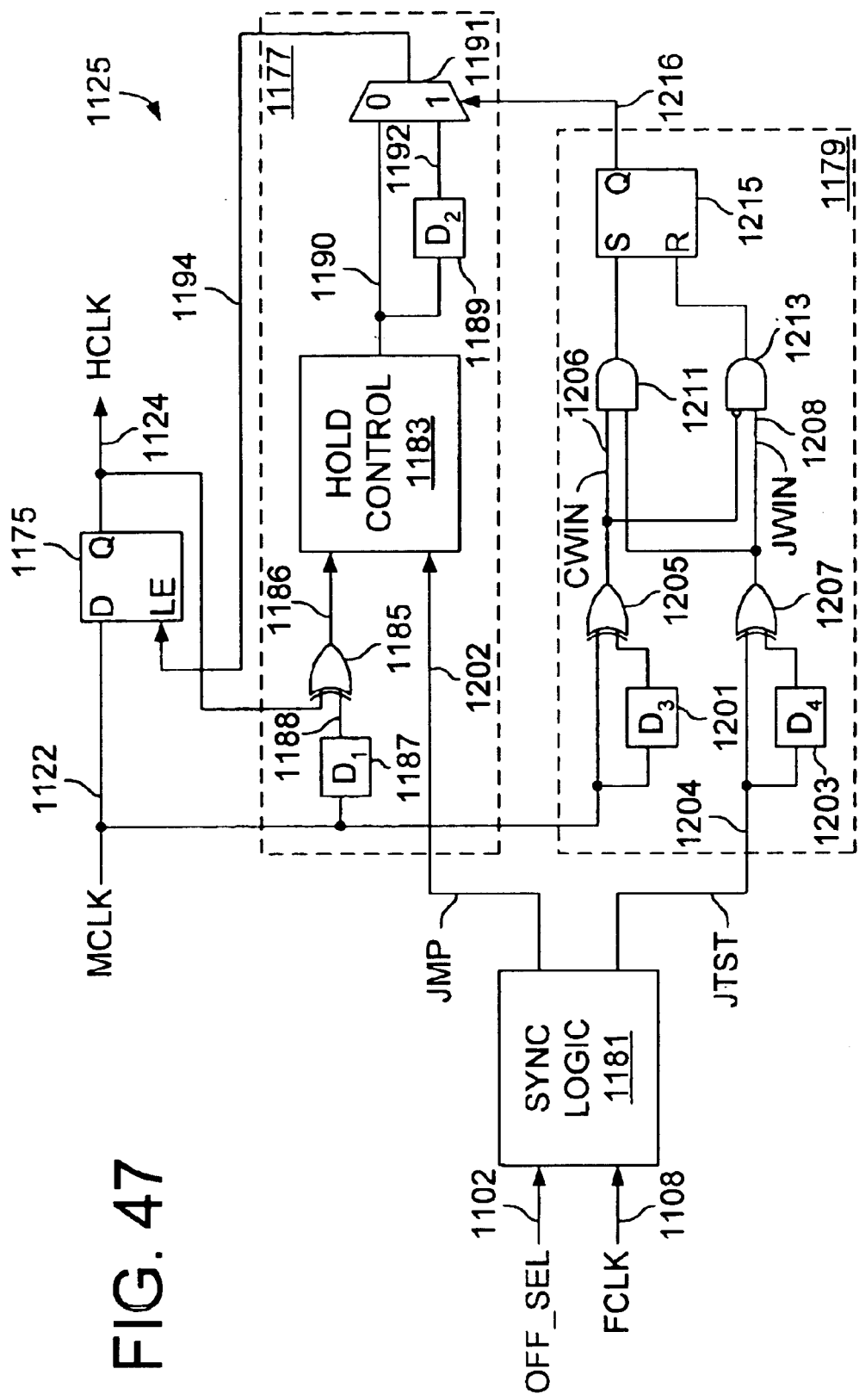
FIG. 47 illustrates the clock hold circuit of FIG. 45 according to an embodiment of the invention.

FIG. 47 illustrates the clock hold circuit 1125 of FIG. 45 according to an embodiment of the invention. The clock hold circuit 1125 includes a latch 1175, hold signal generator 1177, synchronizing logic 1181, and keepout signal generator 1179. The latch 1175 receives the mix clock signal 1122 from a phase jumping mixer and, so long as a qualified hold signal 1194 is deasserted (i.e., at a latch-enable input, LE), passes the mix clock signal 1122 to the latch output (Q) as the hold clock signal 1124. When the qualified hold signal 1194 is asserted, the latch 1175 maintains (i.e., latches) the hold clock signal 1124 at its most recently output state, even as the mix clock signal 1122 changes state at the input of latch 1175.

The hold signal generator 1177 includes ahold control circuit 1183, delay element 1187 ($D_1$), exclusive-OR gate 1185, delay element 1189 ($D_2$) and multiplexer 1191. In one embodiment, the hold control circuit 1183 is a finite state machine that outputs a hold signal 1190 as a state variable, and that transitions between states according to the respective states of a jump signal 1202, and a clock-XOR signal 1186. The jump signal 1202 is asserted by the synchronizing logic 1181 in response to a transition in the offset select signal 1102, and therefore indicates that a phase jump in the mix clock signal 1122 is being initiated. The clock-XOR signal 1186 is high whenever the hold clock signal 1124 and a delayed instance 1188 of the mix clock signal 1122 (i.e., delayed by delay element 1187), have different states. In one embodiment, the delay element 1187 is formed by an inverter chain that matches an inverter chain in a non-latching input-to-output path within the latch 1175. Consequently, when the qualified hold signal 1194 is deasserted, the delayed mix clock signal 1188 is phase aligned with the hold clock signal 1124, and the clock-XOR signal 1186 is low. By contrast, when the qualified hold signal 1194 is asserted, the clock-XOR signal goes high when the delayed mix clock signal 1188 transitions to a state different from the latched state of the hold-clock signal. That is, the clock-XOR signal goes high at the start of the first high- or low-level pulse following assertion of the qualified hold signal 1194.

FIG. 48 is an exemplary state diagram of the hold control circuit 1183 of FIG. 47. Referring to FIGS. 47 and 48, the hold control circuit 1183 is initialized to a first state 1251 and remains in state 1251 until the jump signal is asserted. State 1251 is a non-hold state, meaning that the hold signal 1190 is deasserted and therefore that the qualified hold signal 1194 is deasserted and the hold clock signal 1124 tracks the mix clock signal. When the jump signal 1202 is asserted, the hold control circuit 1183 transitions to a second state 1253. In state 1253, the hold signal 1190 is asserted, producing a corresponding assertion of qualified hold signal 1194 to latch the state of the hold clock signal 1124. When the hold signal 1190 is initially asserted, the state of the hold clock signal and the delayed mix clock signal 1188 are the same so that the clock-XOR signal 1186 is low. At the first transition of the delayed mix clock signal 1188 following assertion of qualified hold signal 1194, the states of the delayed mix clock signal 1188 and the latched hold clock signal 1124 will diverge, thereby causing the clock-XOR signal 1186 to go high. The hold control circuit 1183 responds to the high-going clock-XOR signal 1186 by transitioning to a third state 1255 in which the hold signal 1190 (and therefore the qualified hold signal 1194) remains asserted. Referring briefly to FIG. 46, it can be seen that the first transition of the mix clock signal 1122 following the start of a clock hold interval (1156 or 1158) is a leading edge (rising or falling) of a potentially short-duration pulse (i.e., a potential runt pulse). The hold control circuit 1183 remains in state 1255 while the both the clock-XOR signal 1186 and the jump signal 1202 are high. After the second transition of the delayed mix clock signal 1188 (i.e., a trailing edge of the potential runt pulse), the delayed mix clock signal 1188 again matches the state of the latched hold clock signal 1124 so that the clock-XOR signal 1186 goes low. The hold control circuit 1183 transitions to a fourth state 1257 in response to the low-going clock XOR signal. In state 1257, the hold signal 1190 is deasserted, resulting in a corresponding deassertion of the qualified hold signal 1194 and restoration of the latch 1175 to a non-latched condition. Thus, after the potential runt pulse within the mix clock signal 1122 has passed, the hold clock signal 1124 is enabled to continue tracking the mix clock signal 1122. When the jump signal 1202 is deasserted, the hold control circuit 1186 returns to the initial state 1251. In one embodiment, illustrated in FIG. 48, the hold control circuit 1186 is further adapted to transition to state 1251 from any other of the states (1253, 1255 or 1257) in response to a low going jump signal 1202.

As briefly discussed above, if the qualified hold signal 1194 is asserted coincidentally with a transition of the hold clock signal 1124 (or transition of the mix clock signal 1122 or an intermediary clock signal generated within the latch 1175), a metastable hold clock signal 1124 may be output by latch 1175 (i.e., the voltage level of hold clock signal 1124 may fall within an invalid range between two valid output voltage levels). In addition to the potential for producing undesired results in the synchronous logic circuit 1103 of FIG. 45, a metastable hold clock signal 1124 will potentially produce a metastable XOR-clock signal 1186 and therefore disrupt the operation of the hold control circuit 1183 and the clock hold circuit 1125 generally. The keepout circuit 1179 of FIG. 47 is provided to prevent such undesired results.

Referring to FIG. 47, the keepout circuit 1179 includes delay elements 1201 ($D_3$) and 1203 ($D_4$), exclusive-OR gates 1205 and 1207, AND gates 1211 and 1213 and set/reset (S-R) flip-flop 1215. A jump-test signal 1204 (JTST) is supplied to a first input of exclusive-OR gate 1207 and to an input of delay element 1203. The output of delay element 1203 is supplied to a second input of exclusive-OR gate 1207 so that each transition of the jump test signal 1204 causes exclusive-OR gate 1207 to output a pulse 1208. The duration of pulse 1208 corresponds to the propagation delay through delay element 1203 and defines a time interval referred to herein as a jump window (JWIN). The mix clock signal 1122 is supplied to a first input of exclusive-OR gate 1205 and to an input of delay element 1201. The output of delay element is supplied to a second input of exclusive-OR gate 1205 so that each transition of the mix clock signal 1122 causes exclusive-OR gate 1205 to output a pulse 1206. The duration of pulse 1206 corresponds to the propagation delay through delay element 1201 and defines a time interval referred to herein as a clock window (CWIN). In one embodiment, delay element 1201 produces a substantially longer delay than delay element 1203 (e.g., by including a longer chain of inverters or other delay circuits) so that the clock window is substantially wider than the jump window.

FIG. 49 illustrates exemplary timing relationships between the clock window and the jump window defined respectively by signals 1206 and 1208 of FIG. 47. Because the leading edge of the clock window is generated in response to a transition of the mix clock signal 1122, the clock window represents a time interval during which assertion of the jump signal 1202 may result in coincident transitions in the hold clock signal 1124 and the qualified hold signal 1194. In one embodiment, the jump test signal 1204 is a periodic signal that is phase aligned with the jump signal 1202 so that the jump window corresponds to a potential assertion time of the jump signal 1202 (i.e., if the offset select signal is transitioned). Thus, as indicated in FIG. 49, if the jump window falls within the clock window, a keepout signal 1216 is asserted. Referring to FIG. 47, the output of S-R flip-flop 1215 constitutes the keepout signal 1216. The S-R flip flop 1215 is initially in a reset state in which the keep out signal 1216 is deasserted. When signals 1206 and 1208 are both high (i.e., the jump window falls at least partially within the clock window), the output of AND gate 1211 goes high to set the S-R flip-flop and thereby assert the keepout signal 1216. Multiplexer 1191 within the hold signal generator 1177 responds to the asserted keepout signal 1216 by selecting a delayed hold signal 1192 (i.e., generated by propagation of hold signal 1190 through delay element 1189 ($D_2$)) to be output as the qualified hold signal 1194 to the latch 1175. If the jump window falls outside the clock window, then signal 1208 will be high while signal 1206 is low, causing AND gate 1213 to reset the S-R flip flop and thereby deassert the keepout signal 1216. The multiplexer 1191 responds to the deasserted keepout signal 1216 by selecting the hold signal 1190 to be output as the qualified hold signal 1194. Thus, the delayed hold signal 1192 is output as the qualified hold signal 1194 when the relative transition times of the jump test signal 1204 and the mix clock signal 1122 indicate a likelihood that an assertion of the hold signal 1190 will coincide with a transition in the mix clock signal 1122 (and therefore with a transition in the hold clock signal 1124). Conversely, the hold signal 1190 is output as the qualified hold signal 1194 when the relative transition times of the jump test signal and the mix clock signal indicate that an assertion of the hold signal 1190 will not coincide with a transition in the mix clock signal 1122.

FIG. 50 is an exemplary state diagram of the keepout circuit 1179 of FIG. 47. Referring to both FIGS. 50 and 47, the keepout circuit 1179 is initialized to a first state 1275 in which the keepout signal is deasserted. The keepout circuit 1179 remains in state 1275 so long as the jump window and clock window do not overlap (i.e., so long as the Boolean expression /JWIN OR /CWIN remains true). If the jump window and clock window overlap (i.e., signals 1206 and 1208 are both high), the S-R flip-flop 1215 is set, transitioning the keepout circuit 1179 to state 1277, in which the keepout signal 1216 is asserted. The keepout circuit 1179 remains in state 1277 so long as the jump window does not fall outside the clock window (i.e., so long as the Boolean expression /JWIN OR CWIN remains true). If the jump window falls outside the clock window (i.e., signal 1206 is low while signal 1208 is high), the S-R flip-flop 1215 is reset, returning the keepout circuit to state 1275 and therefore deasserting the keepout signal 1216.

FIG. 51 illustrates an exemplary embodiment of the synchronizing logic 1181 of FIG. 47. The synchronizing logic 1181 includes flip-flops 1281, 1283 and 1285, and an exclusive-OR gate 1289. Each of the flip-flops (1281, 1283, 1285) is clocked by the feedback clock signal 1108 (i.e., generated within the tracking loop 1105 of FIG. 45). The offset select signal 1102 is supplied to a data input of flip-flop 1281 and to a first input of exclusive-OR gate 1289. The output of flip-flop 1281 is supplied to a second input of the exclusive-OR gate 1289 so that, when the offset select signal 1102 changes state, exclusive-OR gate 1289 asserts a jump detect signal 1290 until the next rising edge of the feedback clock signal 1108. The output of the exclusive-OR gate 1289 is coupled to a data input of flip-flop 1283 so that the asserted jump detect signal 1290 is registered within flip-flop 1283 in response to the rising edge of the feedback clock signal that succeeds the transition in the offset select signal 1102. The jump signal 1202 is output via an inverting output of the flip-flop 1283 and therefore constitutes a synchronous indication of the offset select signal transition. Note that the offset select signal 1102 may be a multiple-bit signal (e.g., used to select between more than two offset control values or phase control values) in which a transition within any bit of the offset select signal 1102 results in assertion of the jump signal 1202. Still referring to FIG. 51, the input and inverting output of flip-flop 1285 are coupled to one another to generate the jump test signal 1204. Thus, in the embodiment of FIG. 51, the jump test signal 1204 is a periodic signal that transitions in response to each edge of the feedback clock signal 1108 and that is substantially phase aligned with a transition in the jump signal 1202. In alternative embodiments, clock signals other than the feedback clock signal 1108 may be used to generate the jump and jump test signals (1202 and 1204), and falling rather than rising edges of the feedback clock signal 1108 (or other clock signal) may be used to trigger state changes within the flip-flops 1281, 1283 and 1285.

It should be noted that the exemplary phase jumping applications described above, though described in terms of locked loop circuits that include phase jumping mixers according to the DRSS mixer embodiments described herein, may alternatively be implemented by locked loop circuits that include other types of mixing circuits. In general, any circuit of producing a relatively rapid phase transition in an output clock signal may be used in the above-described applications in place of the DRSS mixer embodiments described herein.

The section headings provided in this detailed description are for convenience of reference only, and in no way define, limit, construe or describe the scope or extent of such sections. Also, while the invention has been described with reference to specific exemplary embodiments thereof, it will be evident that various modifications and changes may be made thereto without departing from the broader spirit and scope of the invention. For example, although specific circuits have been described and depicted as including metal oxide semiconductor (MOS) transistors, such circuits may alternatively be implemented using bipolar technology or any other technology in which a signal-controlled resistance may be achieved. Also, while CMOS and DRSS signaling levels have been described, any signaling levels having a substantially equal common mode voltage may alternatively be used. Accordingly, the specification and drawings are to be regarded in an illustrative rather than a restrictive sense.

What is claimed is:

1. An integrated circuit device comprising:
   a select circuit to provide a first offset value in a plurality of offset values;
   a summing circuit to sum the first offset value with a phase count value, the phase count value indicating a phase difference between a reference clock signal and one of a first plurality of clock signals; and
   a phase mixer to combine the first plurality of clock signals with the sum of the first offset value and the phase count value to generate an output clock signal.

2. The integrated circuit device of claim 1 wherein the summing circuit comprises a plurality of adder circuits, an adder circuit in the plurality of adder circuits to output a sum of the phase count value with the first offset value to the select circuit.

3. The integrated circuit device of claim 2 further comprising a plurality of storage registers to store the plurality of offset values, a storage register in the plurality of storage registers to output the first offset value to the adder circuit.

4. The integrated circuit device of claim 1 wherein the summing circuit is coupled to an output of the select circuit to receive the first offset value.

5. The integrated circuit device of claim 1 wherein the select circuit is a multiplexer.

6. The integrated circuit device of claim 1 further comprising a storage circuit to store the plurality of offset values.

7. The integrated circuit device of claim 6 wherein the storage circuit comprises a plurality of storage registers each coupled to a respective input of the select circuit.

8. The integrated circuit device of claim 6 wherein the storage circuit comprises:
   a plurality of rows of storage elements, each row in the plurality of rows to store a respective one of the plurality of offset values;
   a plurality of bit lines, each bit line in the plurality of bit lines coupled to a respective column of the storage elements; and
   a plurality of enable lines coupled respectively to the plurality of rows of storage elements to output the plurality of offset values on the plurality of bit lines.

9. The integrated circuit device of claim 8 wherein the select circuit comprises decode circuitry to activate, in response to a select value, a first enable line in the plurality of enable lines to output the first offset value.

10. The integrated circuit device of claim 8 wherein the plurality of bit lines are coupled to the summing circuit.

11. The integrated circuit device of claim 1 further comprising a storage circuit to store the plurality of offset values, at least one of the offset values corresponding to a leading edge of a data valid interval and at least one of the offset values corresponding to a trailing edge of the data valid interval.

12. An integrated circuit device comprising:
   a select circuit to provide a first phase offset in a plurality of phase offset values;
   a timing circuit coupled to the select circuit and to generate a timing signal having a phase determined in response to the first phase offset;
   an output driver coupled to receive the timing signal from the timing circuit and to transmit data on a first signaling line in response to the timing signal; and
   a receiver coupled to receive the timing signal from the timing circuit and to receive data via the first signaling line in response to the timing signal.

13. The integrated circuit device of claim 12 further comprising a plurality of storage registers to store the plurality of phase offset values, each of the plurality of storage registers coupled to output a respective one of the plurality of phase offset values to the select circuit.

14. An integrated circuit device comprising:
   a select circuit to provide a first offset value in a plurality of offset values;
   a timing circuit coupled to the select circuit and to generate a timing signal having a phase determined in response to the first offset value;
   an output driver coupled to receive the timing signal from the timing circuit and to transmit data on a first signaling line in response to the timing signal; and
   a receiver coupled to receive the timing signal from the timing circuit and to receive data on the first signaling line in response to the timing signal;
   a plurality of storage registers to store the plurality of offset values, each of the plurality of storage registers coupled to output a respective one of the plurality of offset values to the select circuit; and
   a control circuit to output a control signal to the select circuit to control the selection of the first offset value, the control signal having a first state to select a transmit offset value as the first offset value during a transmission interval, and the control signal having a second state to select a receive offset value as the first offset value during a reception interval.

15. A method of operation within an integrated circuit device, the method comprising:
   selecting a first phase control value in a plurality of phase control values;
   combining a first plurality of clock signals within a phase mixing circuit with a signal representing the first phase control value to generate an output clock signal.

16. A method of operation within an integrated circuit device, the method comprising:
   selecting a first phase control value in a plurality of phase control values; and
   combining a first plurality of clock signals within a phase mixing circuit with the first phase control value to generate an output clock signal,
   wherein selecting the first phase control value comprises selecting one of a plurality of phase offset values to be summed with a phase count value, a sum of the one of the plurality of phase control values and the phase count value constituting the first phase control value.

17. A method of operation within an integrated circuit device, the method comprising:
   storing a plurality of phase offset values within the integrated circuit device;
   selecting a first phase control value in a plurality of phase control values; and
   combining a first plurality of clock signals within a phase mixing circuit with the first phase control value to generate an output clock signal, wherein selecting the first phase control value comprises selecting one of a plurality of phase offset values to be summed with a phase count value, a sum of the one of the plurality of phase control values and the phase count value constituting the first phase control value.

18. A method of operation within an integrated circuit device, the method comprising:
    selecting a first phase control value in a plurality of phase control values;
    combining a first plurality of clock signals within a phase mixing circuit with the first phase control value to generate an output clock signal,
    wherein selecting the first phase control value comprises selecting one of a plurality of phase offset values to be summed with a phase count value, a sum of the one of the plurality of phase control values and the phase count value constituting the first phase control value; and generating the phase count value by adjusting the phase count value until a feedback clock signal is substantially phase aligned with a reference clock signal, the feedback clock signal having a phase offset from the first plurality of clock signals in response to the phase count value.

19. A method of operation within an integrated circuit device, the method comprising:
    selecting a first phase control value in a plurality of phase control values;
    combining a first plurality of clock signals within a phase mixing circuit with the first phase control value to generate an output clock signal; and
    adding a phase count value to each of a plurality of phase offset values to generate the plurality of phase control values.

20. A method of operation within an integrated circuit device, the method comprising:
    selecting a first phase control value in a plurality of phase control values; and
    combining a first plurality of clock signals within a phase mixing circuit with the first phase control value to generate an output clock signal,
    wherein combining the first plurality of clock signals within the phase mixing circuit with the first phase control value comprises concurrently outputting a first and second selected clock signals of the first plurality of clock signals onto an output signal line.

21. A method of operation within an integrated circuit device, the method comprising:
    selecting a first phase control value in a plurality of phase control values;
    combining a first plurality of clock signals within a phase mixing circuit with the first phase control value to generate an output clock signal,
    wherein combining the first plurality of clock signals within the phase mixing circuit with the first phase control value comprises concurrently outputting a first and second selected clock signals of the first plurality of clock signals onto an output signal line; and selecting the first and second selected clock signals from the first plurality of clock signals in response to a bit within the first phase control value.

22. A method of operation within an integrated circuit device, the method comprising:
    selecting a first phase control value in a plurality of phase control values; and
    combining a first plurality of clock signals within a phase mixing circuit with the first phase control value to generate an output clock signal,
    wherein combining the first plurality of clock signals within the phase mixing circuit with the first phase control value comprises concurrently outputting a first and second selected clock signals of the first plurality of clock signals onto an output signal line,
    wherein outputting the first and second selected clock signals onto the output signal line comprises outputting the first and second selected clock signals onto the output signal line using first and second amplifiers, respectively, the first amplifier having a drive strength in response to a first bit within the first phase control value and the second amplifier having a drive strength in response to a complement of the first bit within the first phase control value.

23. A method of operation within an integrated circuit device, the method comprising:
    selecting a first phase control value in a plurality of phase control values;
    combining a first plurality of clock signals within a phase mixing circuit with the first phase control value to generate an output clock signal,
    wherein combining the first plurality of clock signals within the phase mixing circuit with the first phase control value comprises concurrently outputting a first and second selected clock signals of the first plurality of clock signals onto an output signal line,
    wherein outputting the first and second selected clock signals onto the output signal line comprises outputting the first and second selected clock signals onto the output signal line using first and second amplifiers, respectively, the first amplifier having a drive strength in response to a first bit within the first phase control value and the second amplifier having a drive strength in response to a complement of the first bit within the first phase control value; and
    selecting the first and second selected clock signals from the first plurality of clock signals in response to a second bit within the first phase control value.

24. The method of claim 15 further comprising:
    selecting a different one of the plurality of phase control values in response to a transition of a first control signal; and
    combining the first plurality of clock signals within the phase mixing circuit with a signal representing the different one of the phase control values to adjust the phase of the output clock signal.

25. The method of claim 24 further comprising transmitting data in response to the output clock signal prior to the transition of the first control signal, and receiving data in response to the output clock signal after the transition of the first control signal.

26. An apparatus comprising:
    a phase mixer to generate a feedback clock signal having a phase in response to a phase count value;
    a phase detector coupled to receive a reference clock signal and the feedback clock signal, the phase detector to output a phase adjust signal having either a first or second state in response to whether the feedback clock signal leads or lags the reference clock signal;
    a control circuit coupled to receive the phase adjust signal from the phase detector and coupled to output the phase count value to the phase mixer, the control circuit to:
        add a phase jump value to the phase count value when the phase adjust signal is in the first state;
        subtract the phase jump value from the phase count value when the phase adjust signal is in the second state; and reduce the phase jump value after adding the phase jump value to the phase count value or subtracting the phase jump value from the phase count value.

27. The apparatus of claim 26 wherein the control circuit comprises:
   a phase counter to store the phase count value, the phase counter including a load port and a phase count output;
   an adder circuit including first and second adder inputs and an adder output, the first adder input coupled to the phase count output of the phase counter, and the adder output coupled to the load part of the phase counter, and
   a search logic circuit including a first output coupled to the second adder input of the adder circuit to provide the jump value.

28. The apparatus of claim 27 wherein the phase counter further includes a disable input and the search logic circuit further includes a second output coupled to the disable input, the search logic circuit configured to output a disable signal to the disable input of the phase counter to disable a phase counting operation within the phase counter.

29. The apparatus of claim 27 wherein the search logic circuit further includes a storage circuit to store the jump value, and a jump value reduction circuit to reduce the jump value after the jump value has been added to, or subtracted from, the phase count value.

30. The apparatus of claim 29 wherein the jump value reduction circuit comprises a circuit to halve the jump value after the jump value has been added to, or subtracted from, the phase count value.

31. The apparatus of claim 30 wherein the circuit to halve the jump value comprises a shift circuit to shift the jump value by at least one bit.

32. The apparatus of claim 27 wherein the search logic circuit further includes circuitry to affect a sign change of the jump value to enable subtraction of the jump value from the phase count value.

33. The apparatus of claim 27 wherein the search logic circuit asserts a load signal to the phase counter to enable a value present at the load port of the phase counter to be loaded into the phase counter and output from the phase counter as the phase count value.

34. The apparatus of claim 26 wherein the phase counter includes a count input coupled to receive the phase adjust signal from the phase detector.

35. A method of operation within an integrated circuit device, the method comprising:
   determining whether a first clock signal leads or lags a second clock signal;
   adjusting a phase control value by adding a phase jump value to the phase control value when the first clock signal leads the second clock signal and by subtracting the phase jump value from the phase control value when the first clock signal lags the second clock signal;
   outputting the phase control value, after adding or subtracting the phase jump value from the phase control value, to a clock generation circuit, including a phase mixer, to adjust the phase of at least one of the first clock signal and the second clock signal; and
   reducing the phase jump value.

36. The method of claim 35 further comprising repeating the determining, adjusting and outputting after reducing the phase jump value.

37. The method of claim 35 further comprising repeating said determining, adjusting, outputting and reducing until the phase jump value is reduced to a value less than a predetermined value.

38. The method of claim 35 further comprising initializing the phase jump value to a value that corresponds to one-fourth of a cycle time of the first clock signal.

39. A method of operation within an integrated circuit device, the method comprising:
   determining whether a first clock signal leads or lags a second clock signal;
   adjusting a phase control value by adding a phase jump value to the phase control value when the first clock signal leads the second clock signal and by subtracting the phase jump value from the phase control value when the first clock signal lags the second clock signal;
   outputting the phase control value, after adding or subtracting the phase jump value from the control value, to a clock generation circuit to adjust the phase of at least one of the first clock signal and the second clock signal;
   reducing the phase jump value; and
   disabling a counter circuit to increment and decrement the phase control value in response to a phase difference between the first clock signal and the second clock signal.

40. The method of claim 35 wherein reducing the phase jump value comprises halving the phase jump value.

41. A method of operation within an integrated circuit device, the method comprising:
   sampling an input signal line in response to transitions of a first clock signal to receive a first sequence of data values, the first clock signal having a phase in response a phase control value;
   comparing the first sequence of values with a second sequence of values;
   storing the phase control value in a first storage location when the first sequence of values does not match the second sequence of values;
   storing the phase control value in a second storage location when the first sequence of values matches the second sequence of values;
   adjusting the phase control value by a first phase jump value; and
   repeating the sampling, comparing, storing and adjusting at least until respective phase control values have been stored in the first and second storage locations.

42. The method of claim 41 further comprising determining the first phase jump value in response to a minimum expected duration of a data value on the input signal line.

43. The method of claim 42 further comprising reducing the first phase jump value when the first sequence of values has not been determined to match the second sequence of values after a predetermined number of repetitions of the comparing of the first sequence of values with the second sequence of values.

44. The method of claim 43 wherein reducing the first phase jump value comprises reducing the first phase jump value by a predetermined amount.

45. The method of claim 42 further comprising instructing a remote device to transmit the first sequence of values.

46. A method of operation within an integrated circuit device, the method comprising:
   summing a first phase offset value with a phase count value to generate a first phase control value, the first phase offset value corresponding to a previously determined phase offset between a reference clock signal and a leading edge of a data valid interval;
   generating a first sampling clock signal in response to the first phase control value;

receiving a first input value from an input signal line in response to the first sampling clock signal;

comparing the first input value with a first test value; and decrementing the first phase offset value when the first input value matches the first test value.

47. The method of claim 46 further comprising incrementing the first phase offset value when the first input value does not match the first test value.

48. The method of claim 46 further comprising:

summing a second phase offset value with the phase count value to generate a second phase control value, the second phase offset value corresponding to a previously determined phase offset between the reference clock signal and a trailing edge of the data valid interval;

generating a second sampling clock signal based on the second phase control value;

receiving a second input value from an input signal line in response to the second sampling clock signal;

comparing the second input value with a second test value; and decrementing the second phase offset value when the second input value does not match the second test value.

49. The method of claim 48 further comprising incrementing the second phase offset value when the second input value does match the second test value.

50. The method of claim 48 further comprising decrementing a third phase offset value when the first input value matches the first test value and the second input value does not match the second test value, the third phase offset value corresponding to a previously determined phase offset between the reference clock signal and a midpoint of the data valid interval.

51. The method of claim 50 wherein the midpoint of the data valid interval is substantially centered in time between the leading and trailing edges of the data valid interval.

52. The method of claim 50 further comprising summing the third phase offset value with the phase count value to generate a third phase control value, and generating a third sampling clock signal based on the third phase control value.

53. The method of claim 48 further comprising:

dividing a sum of the first and second phase offset values by a predetermined value to generate a third phase offset value;

summing the third phase offset value and the phase count value to generate a third phase control value; and generating a third sampling clock signal in response to the third phase control value.

54. The method of claim 53 wherein dividing the sum of the first and second phase offset values by a predetermined value comprises halving the sum of the first and second phase offset values to generate the third phase offset value.

55. A method of operation within an integrated circuit device, the method comprising:

selecting a first phase offset value from a first plurality of phase offset values in response to a request to transmit data to a first device of a plurality of devices, each of the devices in the plurality of devices corresponding to respective phase offset value of the first plurality of phase offset values;

summing the first phase offset value with a phase count value to generate a first phase control value;

generating, within a first phase mixing circuit, a first transmit clock signal having a phase offset from a reference clock signal in response to the first phase control value; and transmitting data to the first device in response to the first transmit clock signal.

56. The method of claim 55 further comprising:

selecting a second phase offset value from the first plurality of phase offset values in response to a request to transmit data to a second device of the plurality of devices;

summing the second phase offset value with the phase count value to generate a second phase control value;

generating, within the first phase mixing circuit, a second transmit clock signal having a phase offset from the reference clock signal in response to the second phase control value; and transmitting data to the second device in response to the second transmit clock signal.

57. The method of claim 56 wherein transmitting data to the first device in response to the first transmit clock signal comprises transmitting a request to the first device, the request instructing the first device to transmit to a receive circuit within the integrated circuit device.

58. The method of claim 55 further comprising:

selecting a second phase offset value from a second plurality of phase offset values in response to a request to receive data from the first device of a plurality of devices, each of the devices in the plurality of devices corresponding to a respective phase offset value of the second plurality of phase offset values;

summing the second phase offset value with the phase count value to generate a third phase control value;

generating, within the first phase mixing circuit, a first receive clock signal having a phase offset from a reference clock signal in response to the third phase control value; and receiving data from the first device in response to the first receive clock signal.

59. A method of operation within an integrated circuit device, the method comprising:

selecting a first phase offset value from a first plurality of phase offset values in response to a request to receive data from a first device of the plurality of devices, each of devices in the plurality of devices corresponding to a respective phase offset value of the first plurality of phase offset values;

summing the first phase offset value with a phase count value to generate a first phase control value;

generating, within a first phase mixing circuit, a first receive clock signal having a phase offset from a reference clock signal in response to the first phase control value; and receiving data from the first device in response to the first receive clock signal.

60. The method of claim 59 further comprising receiving a request to transmit a command to the first device, the command constituting a request for the first device to transmit data back to the integrated circuit device and also constituting the request to receive data from the first device.

61. The method of claim 60 wherein the command is a memory read command.

62. The method of claim 59 wherein summing the first phase offset value with the phase count value to generate the first phase control value comprises summing the first phase offset value with the phase count value prior to selecting the first phase offset value, and wherein selecting the first phase offset value comprises selecting the first phase control value.

63. The method of claim 59 wherein receiving data from the first device in response to the first receive clock signal comprises sampling a signal line in response to transitions in the first receive clock signal, the signal line coupled between the first device and the integrated circuit device.

64. The method of claim 59 further comprising:

selecting a second phase offset value from the first plurality of phase offset values in response to a request to receive data from a second device of the plurality of devices;

summing the second phase offset value with the phase count value to generate a second phase control value;

generating, within the first phase mixing circuit; a second receive clock signal having a phase offset from the reference clock signal in response to the second phase control value; and receiving data from the second device in response to the second receive clock signal.

* * * * *